United States Patent
Singh

(10) Patent No.: US 9,361,950 B1
(45) Date of Patent: Jun. 7, 2016

(54) SEMICONDUCTOR DEVICE WITH REDUCED LEAKAGE CURRENT AND METHOD FOR MANUFACTURE OF THE SAME

(71) Applicant: Cold Brick Semiconductor, Inc., Cupertino, CA (US)

(72) Inventor: Gajendra Prasad Singh, Sunnyvale, CA (US)

(73) Assignee: COLD BRICK SEMICONDUCTOR, INC., Sunnyvale, CA (US)

( * ) Notice: Subject to any disclaimer, the term of this patent is extended or adjusted under 35 U.S.C. 154(b) by 285 days.

(21) Appl. No.: 13/850,271

(22) Filed: Mar. 25, 2013

Related U.S. Application Data

(63) Continuation of application No. 13/283,547, filed on Oct. 27, 2011, now abandoned.

(51) Int. Cl.
  G11C 7/00 (2006.01)
  G11C 5/14 (2006.01)
  H03K 17/16 (2006.01)

(52) U.S. Cl.
  CPC ............... *G11C 5/14* (2013.01); *H03K 17/161* (2013.01)

(58) Field of Classification Search
  CPC ........ G11C 7/12; G11C 15/04; G11C 15/043; G11C 15/046; G11C 13/0023; G11C 5/147; G11C 13/004; G11C 29/50; G11C 5/14; G11C 7/1051; G11C 11/412; G11C 8/08; G11C 11/4074; G11C 11/419; G11C 29/846; G11C 8/12; G11C 29/02
  See application file for complete search history.

(56) References Cited

U.S. PATENT DOCUMENTS

| | | | |
|---|---|---|---|
| 5,734,919 A | 3/1998 | Walsh et al. | |
| 6,166,985 A | 12/2000 | McDaniel et al. | |
| 6,501,687 B2 * | 12/2002 | Choi | G11C 7/12 365/149 |
| 7,084,667 B2 | 8/2006 | Bernstein et al. | |
| 7,092,307 B2 | 8/2006 | Chen et al. | |
| 7,256,621 B2 | 8/2007 | Lih et al. | |
| 7,349,240 B2 * | 3/2008 | Oki | G11C 11/413 257/E21.661 |
| 8,362,803 B2 | 1/2013 | Nicholas et al. | |
| 2002/0075729 A1 | 6/2002 | Choi | |
| 2003/0117179 A1 | 6/2003 | Hsu et al. | |
| 2004/0196724 A1 | 10/2004 | Chen et al. | |
| 2006/0023542 A1 | 2/2006 | Derner et al. | |
| 2006/0208760 A1 * | 9/2006 | Bernstein | G06F 17/505 326/81 |
| 2007/0216442 A1 | 9/2007 | Jahan et al. | |
| 2009/0189685 A1 * | 7/2009 | Terzioglu | H03K 19/0016 327/544 |
| 2013/0107651 A1 | 5/2013 | Singh | |

OTHER PUBLICATIONS

PCT International Search Report of PCT/US13/39160; dated May 15, 2014.
PCT Written Opinion of the International Searching Authority of PCT/US13/39160; dated May 15, 2014.

* cited by examiner

*Primary Examiner* — Hien Nguyen
(74) *Attorney, Agent, or Firm* — DLA Piper LLP (US)

(57) ABSTRACT

A semiconductor device with reduced leakage current and a method of manufacturing these reduced leakage current semiconductor devices are disclosed. The reduced leakage current semiconductor devices may be used for both static circuits and dynamic circuits. The reduced leakage current semiconductor devices reduce leakage current in the device when the node is not transitioning which occurs more than 95% of the time.

10 Claims, 51 Drawing Sheets

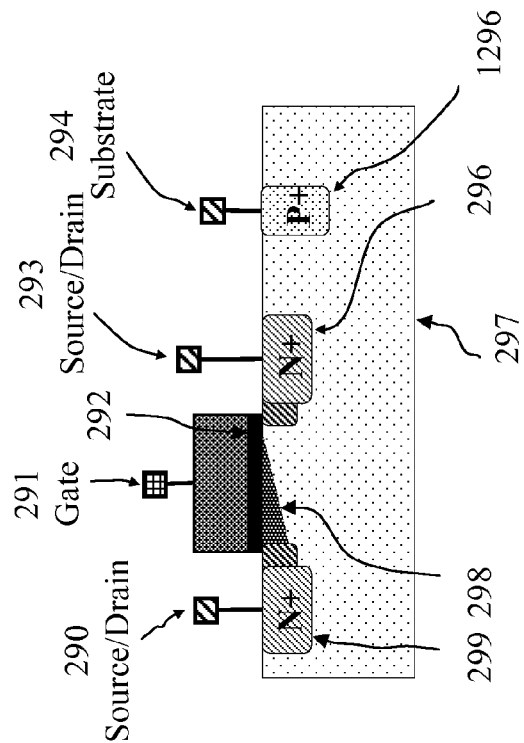
FIGURE 8A1
FIGURE 8B1
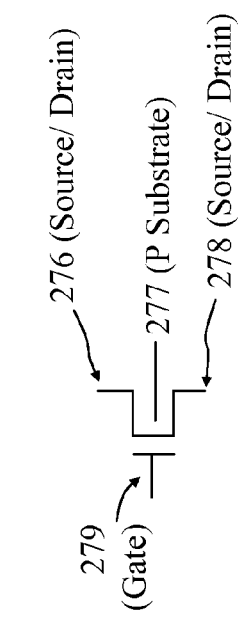
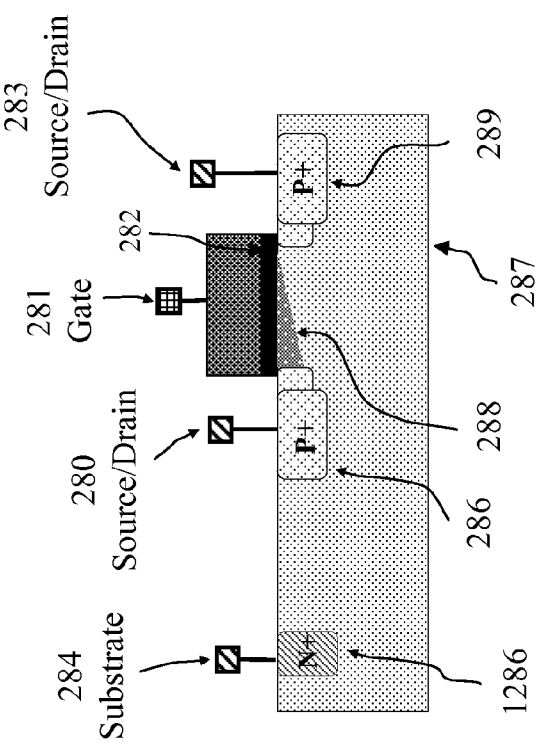
FIGURE 8A2
FIGURE 8B2

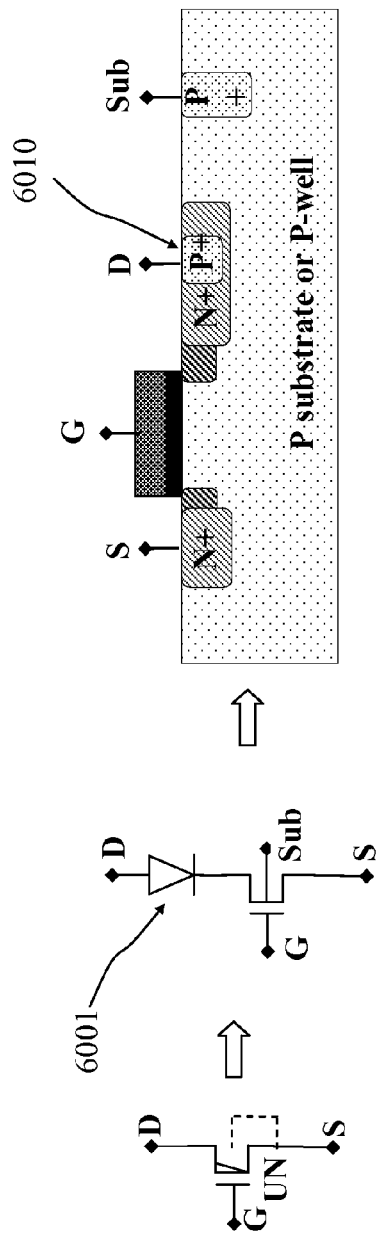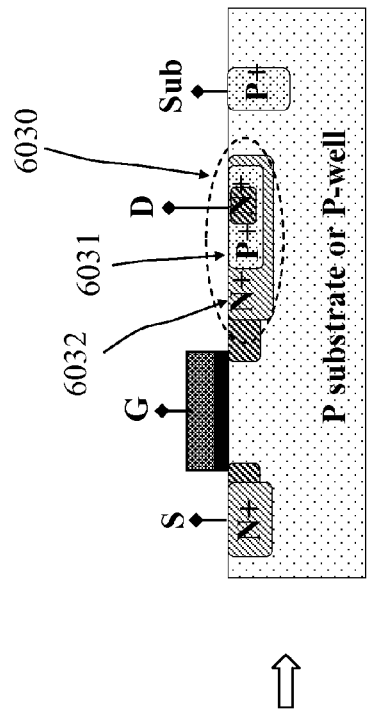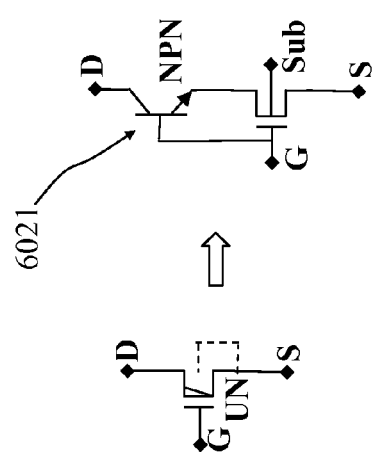
FIGURE 25A
FIGURE 25B

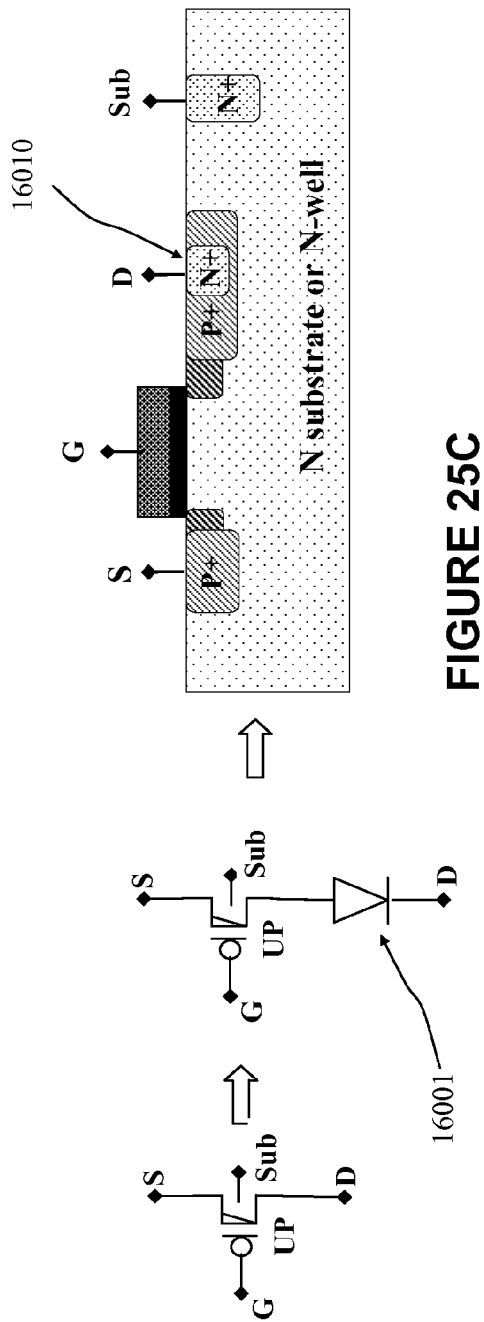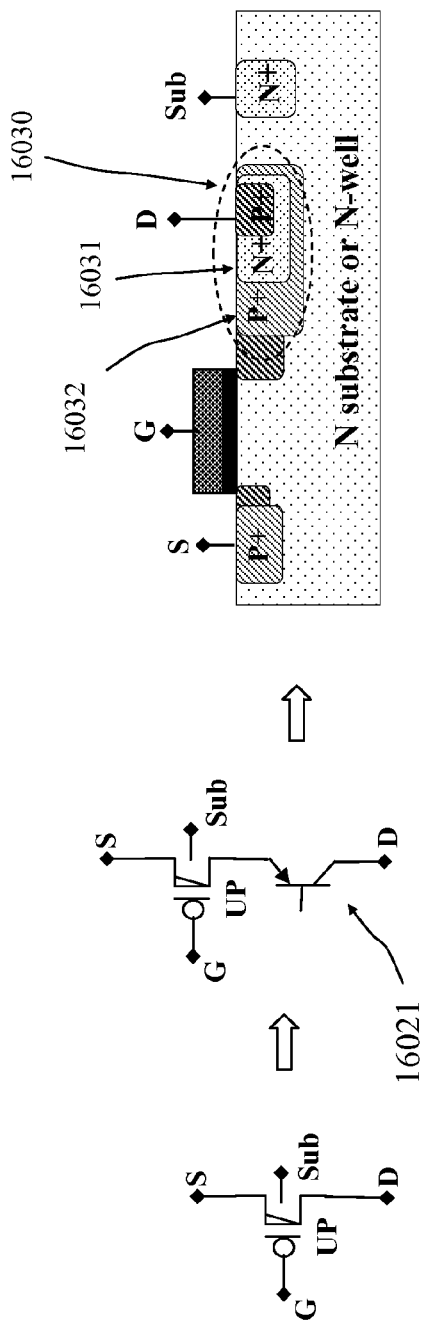
FIGURE 25C
FIGURE 25D

SEMICONDUCTOR DEVICE WITH REDUCED LEAKAGE CURRENT AND METHOD FOR MANUFACTURE OF THE SAME

PRIORITY CLAIMS/RELATED APPLICATIONS

This application is a continuation of and claims priority under 35 USC 120 to U.S. patent application Ser. No. 13/283,547, filed on Oct. 27, 2011 and entitled "SEMICONDUCTOR DEVICE WITH REDUCED LEAKAGE CURRENT AND METHOD FOR MANUFACTURE THE SAME", the entirety of which is incorporated herein by reference.

FIELD

The disclosure relates generally to the field of semiconductor devices and in particular to a semiconductor device with reduced leakage current and a method of designing these reduced leakage current semiconductor devices.

BACKGROUND

Semiconductor Integrated Chips (ICs) are crucial elements of all electronic devices including computers and consumer electronics used in everyday lives, large servers and machines that control many parts of human lives everyday. For example ICs are used in critical defense machines, machine that control the flow of information, the Internet, other communication networks and various communication mechanisms, etc.

Almost 95% of the ICs produced modernly are manufactured using a well known Complementary Metal Oxide Semiconductor (CMOS) process technology. CMOS has been the most used process technology in ICs for the past half century and it is expected to be the technology of choice for many decades in future.

CMOS technology has made remarkable and significant progress in last couple of decades. As predicted by Gordon Moore in 1965 (known as Moore's Law), CMOS manufacturing technology has progressed to a new NODE every 2 years wherein CMOS transistor geometry is shrunk drastically such that a given IC is shrunk to almost half size in less than 2 years when re-designed and manufactured in next generation process. This improvement results in lowering the cost of manufacturing ICs and/or increasing the total amount of work that can be done by an IC.

In general, ICs manufactured using the newer technology are cheaper, more powerful and consume less energy. This trend has continued for many decades and is expected to continue for many years in future. An example of the improvement is that, not long ago, a supercomputer required a entire building of space, required a dedicated mini power plant to power and run air conditioner to cool all of the parts of the supercomputer and cost millions of dollars. Today, that same supercomputer fits in a small backpack sleeve and is powered by a small mobile battery. ICs have become so miniaturized in size, have low power requirements and very low costs that ICS are now used in inexpensive toys and provide very sophisticated control, monitoring, audio visual or robotics functions etc. Furthermore, current ICs are so reliable that they are integrated into critical devices such as pacemaker. They are so critical that entire country's defense infrastructure depends on them. The features, improvements and advantages of CMOS process technology has proven to be a gift to human kind and is expected to continue to be so for long time.

A CMOS device generally includes an N-type Metal Oxide Semiconductor (NMOS) transistor/device and/or a P-type Metal Oxide Semiconductor (PMOS) transistor/device (each of which is known as a MOS device or MOS transistor.) The NMOS and PMOS devices both work as voltage current switches or as voltage dependent current sources. When appropriate voltage is applied at a control node, the switch is ON and current flows between two terminals of the switch (the conducting switch) and when another voltage is applied at the control node the switch is OFF and no current flows between the two terminals of the switch (the non-conducting switch). Any MOS transistor has 4-terminals that include a "gate", a "source", a "drain" and a "body."

Theoretically, for an NMOS device, a positive voltage on the gate terminal with respect to the voltage on the source terminal makes the NMOS act as an ON switch and the current flows from the source terminal to the drain terminal. Conversely, when voltage at the gate terminal is same as the voltage on the source terminal of the NMOS device, the NMOS device acts as an OFF switch and no current flows from the source terminal to the drain terminal or from drain terminal to the source terminal. Similarly, for a PMOS device, when a negative voltage is placed on the gate terminal with respect to the source terminal, the PMOS device acts as an ON switch the current flows from the source terminal to the drain terminal or from drain terminal to source terminal. Conversely, when the voltage on the gate terminal is equal to the voltage on the source terminal, the PMOS device acts as an OFF switch and no current flows from the source terminal to the drain terminal or from drain terminal to the source terminal. The "body" node in both NMOS and PMOS devices acts as a reservoir of mobile charges and helps these devices act as switches.

Modern NMOS and PMOS devices have some residual current between the source and the drain terminals even when the devices are supposedly OFF. There are other small currents in an actual MOS transistor that exist and are inherent in the NMOS and PMOS device designs and are known "flaws". These currents are collectively called "leakage" current or "static" current. Leakage or static current is an unavoidable flaw in device behavior. Needless to say, in most cases, the leakage or static current is undesired and does not serve any meaningful purpose in an IC. Recently the leakage or static current has become significant percentage of the total current of the device.

With their switch like behaviors, CMOS transistors (NMOS and PMOS) are best suited for digital technology and more than 95% ICs in the world are designed using digital technology. In digital technology, all functions and computations are translated to only two states—"Zero"(0) and "One" (1), also called binary states. All logic functions, therefore, are constructed using binary states or binary logic. Logic gates that translate functions in binary logic are called Boolean functions or Boolean gates. These binary or Boolean gates are connected physically by wires to form a complete one-bit function or a multi-bit function. All computing functions are therefore converted to binary or Boolean functions using mathematics that follows Boolean algebra or binary algebra (algebra with base 2).

A Boolean gate or Boolean function is implemented using CMOS transistors that are connected to each other through conducting wires. Each CMOS transistor works as switch that behaves as a voltage controlled current source. There are two types of CMOS transistors including a PMOS type transistor and an NMOS transistor.

Even though energy consumption of electronic items (and hence ICs) has been decreasing drastically and continuously, recently there is increased emphasis on more power reduction in ICs because the total number of these ICs has been growing at very fast pace but more importantly because energy is fast becoming a costly and scarce resource globally. The Semiconductor industry has increased its efforts in reducing power consumption in ICs with renewed vigor and focus in last few years. Reduced power consumption will become an increasingly important design requirement of all ICs in future.

When logic functions are performed by ICs, currents flow from one node to another node which changes the voltage at each node thereby modulate the binary value of each node. In CMOS, any transition of a node consumes energy by conduction of current through an electric field. Thus, an IC consumes electrical energy to perform logic functions or for transporting a logic value from one to other place. This is called "dynamic" energy or "active" energy. Dynamic Energy or active energy consumed in unit time is called dynamic power or active power. A lot of research is being done in the semiconductor industry today to reduce active or dynamic power of ICs. Unfortunately, as mentioned earlier, practical CMOS devices and hence practical ICs also use "static" energy or "leakage" energy.

In recent years, the static energy/power used by an IC has become a significant portion of total power consumed by the IC. In some cases, the static power can be as much as almost half of the total power consumed by the IC. To make matters worse, while dynamic power can be reduced by reducing the activity of nodes through development of efficient computation algorithms, static or leakage power is hard to reduce and/or get rid of since the static or leakage power (from the static or leakage current) is inherent to the design of the MOS devices themselves.

Circuit designers connect NMOS and PMOS transistors to each other to form specific functions. Many basic Boolean gates are designed and implemented from a "library" of Boolean functions. FIG. 1 shows a general structure of a CMOS logic gate or CMOS logic function in existing CMOS Boolean technologies that includes a "pull up circuit" 101 and a "pull down circuit" 102 with each circuit made of MOS transistors connected together to perform part of the Boolean computation to provide the complete desired Boolean computation for the gate. These pull up and pull down circuits are connected to "Supply 1" 105 and "Supply 2" 106, respectively. Supply 1 and Supply 2 are the necessary voltage source and voltage sink nodes for currents to flow. "Supply1" 105 and "Supply2" also provide the voltage level references for logic "1" or Logic "high" and logic "0" or logic "low" for the functional gate, its internal nodes, input ports (103) and output ports (104).

Multiple CMOS Boolean gates can be connected together to form a more complex function with many inputs and many outputs. To connect one CMOS gate to another, the input of a "load" CMOS gate is connected to the output of "driver" CMOS gate. Many "inputs" of one or multiple loads can be connected to one output of a CMOS gate. Connection between CMOS gates depends on overall required logic function of the integrated CMOS gates. This general structure of a CMOS Boolean gate and CMOS Boolean function has been in existence and use for many decades in semiconductor designs. As described above, modern CMOS technology has an undesired component "the leakage current" that consumes power in any IC all the time unless special methods and structures are adopted to reduce or eliminate this current component.

It is important to examine general behavior of all computation nodes in an IC as a whole to understand and tackle the issue of leakage power or static power in all modern ICs and in particular ICs designed and manufactured using CMOS ICs since almost all ICs in modern world are designed and manufactured using CMOS.

A typical electrical behavior of all computation nodes, in any CMOS IC, is shown in FIG. 2 that shows one or more nodes' (184) behavior of a functional block in active mode. It has been well established in industry statistically that at any given clock interval, only 5%-to-15% of nodes make transition from logic ZERO to ONE or from logic ONE to ZERO and rest of the nodes retain their old value and do not transition. Alternatively, if a computation node is looked at in the time domain (where time is measure in number of clock cycles), it would make a transition, on an average, only 5%-15% time (where time is measured by number of clock intervals). As shown in FIG. 2, Node 1, Node 2, . . . , to Node n (184) make transitions only once in many clock cycles, otherwise they retain their logic status clock-cycle over clock-cycle. Transitions represent functional activity in a CMOS IC. This means most node don't participate in computation activities for more than 15% of time.

Furthermore, as shown in FIG. 3, even within a given clock cycle, when a node transitions (202), the transitioning current occurs for a very small percentage of clock period (203). This shows that the actual transition event's time duration is a very small percentage (typically less than 3% in ASICs and other ICs, 10% in ultra high end ICs such as microprocessors) of a clock period. Combining the two statics—that a node transitions in less than 15 clock cycles out of 100 clock cycles (maximum of 15%) and that within the clock cycle that it does transition, the transition current itself flows for less than 10% time of that clock period), it can be concluded that, a node spends almost 98%-99% time waiting to do useful work (a transition activity) while it spends less than 2% time in actually doing useful work (making a transition).

As shown in FIG. 3, a leakage current or static current 204 of the node is always present in all nodes. This is not a new phenomenon. These statistics and electrical behavior (of transition current being there only for a small percentage of time duration while leakage current is always present for any given node) have always been present in all ICs using CMOS technology. However, the leakage current, though always present, has been a very small percentage of the transition current and of the total current until recently. In modern ICs, leakage current is a large percentage of transition and total current. Hence, the need to reduce or eliminate leakage current is more critical with modern ICs than it was in the past.

As mentioned above, dynamic or active power consumption of ICs is proportional to the number of transitions made by all nodes in that IC. When the number of node transitions is less, the chip consumes less dynamic or active power. IC designers use the concept of clock gating, for the less active node in an IC, to force the "clock" to NOT transition. Unfortunately, the leakage or static current still flows through all nodes whether transitioning or not. Therefore, dedicated design efforts need to be invested in reducing or eliminating the leakage or static current (or leakage or static power).

FIG. 4 illustrates general structures of current technologies that are used in the industry for leakage reduction. In these technologies, leakage current reduction is accomplished using a special signal called "Sleep" or "Standby" or something equivalent. This signal may be used in conjunction with low leakage MOS devices (PMOS 122 and NMOS 123 in FIG. 4) in series with the main pull up and pull down paths and in series with the main computation circuit 121 to reduce leakage when the whole functional block may be inactive or less functional and not doing its full useful function. This specially configured sleep signal is generated using a specialized functional block(s) (a sleep monitoring block). The sleep signal represents a time period when a functional unit, many functional unit or the complete chip is guaranteed to be inactive or non-functional. Sleep signals and associated MOS devices need to be generated and designed for each sub-block, block or multiple of BLOCKs that needs to be switched OFF, independently. In these devices, special architectural features are designed to recognize such opportunities and generate these "sleep" or "standby" signals. Such opportunities when one of multiple blocks can be switched OFF simultaneously are difficult to recognize and implement.

As shown in FIG. 4, a footer NMOS transistor 123 and a header PMOS transistor 122 is placed in series with the "Pull down circuit" and "Pull up circuit" respectively. The gate terminals of these footer and header transistors are connected to special "sleep" or "standby" signals from sleep/standby pin(s) 126, 127. For this circuit, the NMOS and PMOS devices 122, 123 used for the footer and header are special "Low Leakage" transistors available from all semiconductor foundries. Once an appropriate logic level is asserted on sleep signals (Logic "HIGH" on "Sleep 1" and Logic "Low" on "Sleep 2"), the footer and header transistors are off and the leakage of this functional block 121 is equal to the leakage of the footer and header devices 122, 123.

However, there are many limitations of the mechanism shown in FIG. 4. For example, the footer and header devices 122, 123 used in series of main functional pull down and pull up paths and the main computation logic block 121 unfortunately slow down the main functionality of the large logic block 121. In particular, since in CMOS circuits, leakage current and speed of operation are proportional to each other so that increasing the speed of the footer and header devices 122, 123 also increases the leakage current thereby mitigating the very effect these technologies are designed to create. Thus, the speed of a circuit that uses the mechanism in FIG. 4 tends to be substantially slower.

Another limitation of the leakage reduction technology in FIG. 4 is that, due to practical limitations, the header and footer devices 122, 123 can only be used with large functional blocks and, in general, the larger the block size, the smaller the probability to find appropriate opportunity to assert the sleep mode on the block. This means that the opportunities to reduce leakage current using these technologies are limited, thus the effect of leakage reduction using such techniques is also limited.

Yet another limitation of the leakage reduction technologies in FIG. 4 is that the designer must design special functional blocks to generate the "Sleep" signals. These blocks are tedious to design and require changes in the architecture of the IC which in turn affects the software and programming of the chip. Change in software requires changes in complete eco-system in the manufacturing process and usage of the IC. It is undesirable for any IC to need modifications in its usage environment because it may limit the marketability of the IC itself. In addition, architectural changes in an IC also requires new functional verification efforts for the IC that are very expensive. For these reasons IC design teams attempt to limit or eliminate changes that would require architectural (hence software) modification. This limitation further reduces the probability of finding opportunities when a big functional block can be in "sleep" or "standby" mode.

FIG. 5 show that a functional unit or chip (IC) is in sleep mode (162) in between active mode (161) in time. To reduce leakage using "sleep" or "standby" signal, one need to maximize time interval represented by "sleep" mode 161. However, as explained above, doing so is a difficult, costly and inefficient task. As shown, the opportunities to put a block in sleep mode are small which means small leakage current reductions. This figure represents statistical behavior of functional blocks (that it is difficult to find opportunities to put a block in standby or sleep mode). This also makes sense from design philosophy point of view. A functional-block in an IC is designed and implemented to do useful work, not to be idle. If a functional block is idle most of the time, then the block design and usage is inefficient, which in general is against design and implementation methodologies used in industry because such inefficiency result in expensive ICs that are commercially not very successful.

FIG. 6 illustrates a device that uses sleep signals "SBB" and "SB" with a chain of inverters 141. These are sleep signal for this structure. These sleep signals cause virtual supply rails 146, 147, 149 and 150 to be disconnected from the static (and actual IC) supply rails 148 and 151. This disconnection causes virtual supplies and hence sources of inverters connected to the appropriate supplies to drift to a different voltage than the static supply rails 148 and 151. This causes a negative gate biasing voltage to the MOS transistors that are supposed to be "OFF" and the leakage reduction in OFF transistors due to negative gate biasing is substantial. However, the technique shown in FIG. 4 can be used only with a chain of inverters (not in a single inverter and not with general logic functions) and hence is not useful of majority of functional and circuit blocks in an IC. Moreover, the voltages on virtual supply nodes are non-deterministic which means that charge on nodes in a block is not guaranteed to be retained when this structure goes in "sleep" or "standby" mode. To mitigate the problem, the system may have a memory structure placed at important/relevant/all nodes so that the logic is deterministic in sleep or standby mode. The requirement of a memory bit for all important or relevant nodes or all nodes is too much overhead. The active power increase of three extra structures is likely to be more than the saving realized in reduction of leakage current. Also this technology is applicable only for a chain of inverters which represents an insignificant percentage of logic functionality (if at all) within any IC. Virtual voltage being non-deterministic presents a reliability issue that needs to be mitigated with elaborate circuit structures otherwise the logic block driven by this structure may malfunction. This means that this technology is not implementable in practical commercial ICs.

It is desirable to provide a reduced leakage current semiconductor device and method of manufacture that reduces leakage current when the device is not transitioning which occurs more than 95% of the time and it is to this end that the disclosure is directed.

BRIEF DESCRIPTION OF THE DRAWINGS

FIGS. 8A1-8C illustrate schematic and cross section, respectively, of a NMOS device, a PMOS and an INVERTER;

FIGS. 25A-D illustrates examples of implementations of the UN and UP devices, respectively, on semiconductor wafers in semiconductor foundry;

DETAILED DESCRIPTION OF EMBODIMENTS

Figure 1:
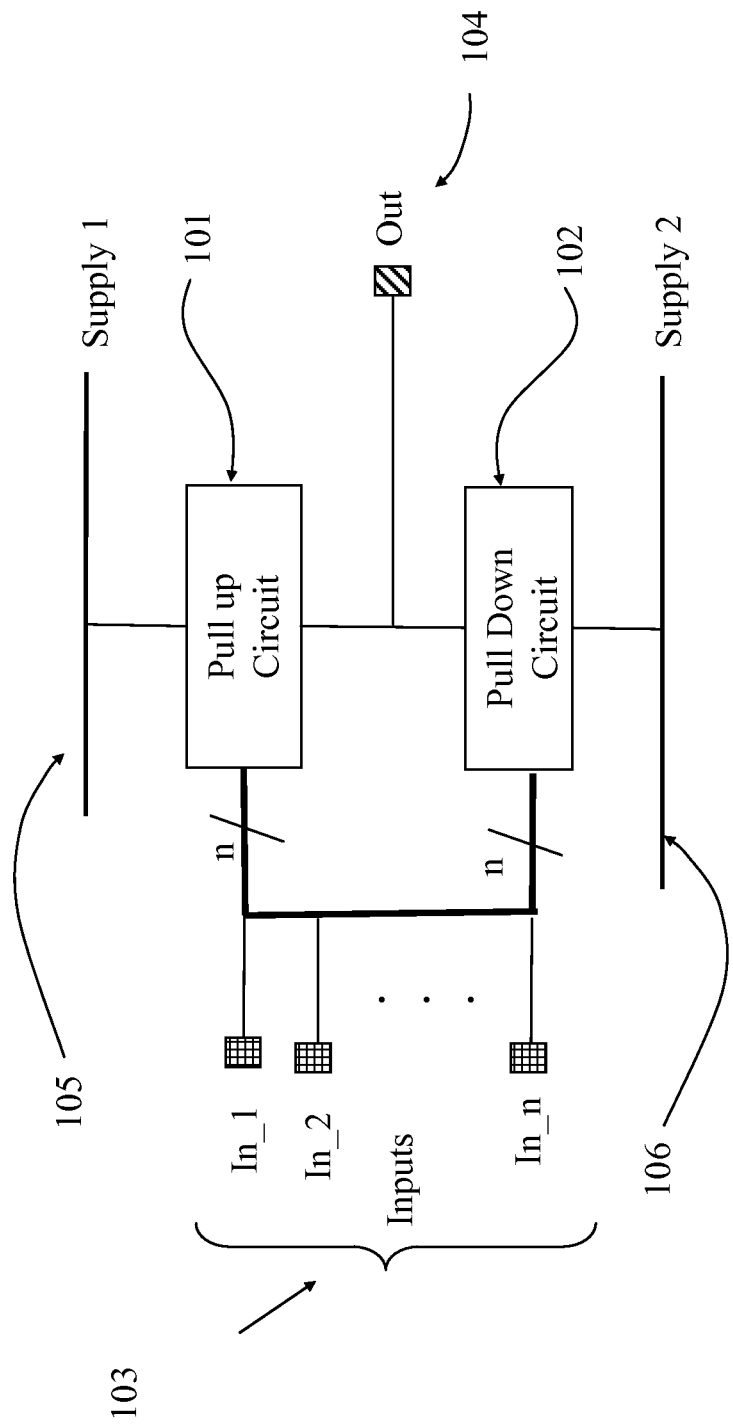
FIG. 1 illustrates the general structure of a CMOS logic gate or CMOS logic function using existing CMOS Boolean technologies.

The disclosure is particularly applicable to a CMOS device with leakage current reduction and method of manufacture and it is in this context that the disclosure will be described. It will be appreciated, however, that the leakage power reduction technique illustrated and described below has greater utility since it can be applied to other types of semiconductor devices and may be implemented in other ways that are within the scope of the disclosure.

The leakage current reduction and method of manufacture uses the concept of applying negative DETERMINISTIC gate voltage to MOS transistors to reduce leakage current. Furthermore, a new concept is introduced that is automatic, self monitored, and fully contained at the CMOS gate level. This means that each logic gate monitors and reduces its leakage current when not switching itself. Furthermore, no external control signal is required to monitor or control the leakage current of a logic gate or a logic block. As a result a very easily adoptable and very widely useable basic logic cell library and memory blocks or memory compiler can be designed and implemented. This library is similar to the standard cell CMOS cell library that is widely used in industry currently but provides a very important and needed feature of significantly reduced leakage power. Since all required apparatus and methods to deterministically apply negative gate voltage selectively to leaky MOS transistors are self contained within the logic cell gate, this technology is widely applicable and easily adoptable in all semiconductor ICs.

In the disclosure, the CMOS gate is divided into its separate native functions and the device incorporates new functional units to reduce leakage current. These functions have been separated in such a way that the Logic gate still appears almost identical to the classical CMOS logic gate to RTL, manufacturing rules and constraints and EDA tools. Only a very small modification is required to the implementation methodology to incorporate this technology. All features of a classical and prevalent CMOS logic gate are practically preserved at the boundary of the new CMOS Logic gate with reduced leakage current so that the reduced leakage current device is easily adoptable in all CMOS ICs.

Yet another concept introduced in this invention is related to the electrical and speed performance of CMOS gate. It should be recognized that in a CMOS IC, where Boolean gates are connected to each other, the transition of an output from LOGIC ZERO to LOGIC ONE or vice versa doesn't require an output signal (which is input to another CMOS Boolean gate) to fully transition from one Supply Rail to another Supply rail. Due to embedded characteristic of a CMOS gate, input of a gate is at LOGIC HIGH if it is slightly HIGHER than the "INPUT HIGH THRESHOLD" of that CMOS gate. Similarly the input is LOGIC LOW if it is slightly LOWER than the "INPUT LOW THRESHOLD" of that CMOS gate. It is not necessary that the MOS device that performs electrical charging and discharging function at high speed should also provide the LOGIC VOLTAGE LEVEL translation from INPUT TO OUTPUT. In this invention the electrical charging/discharging (or voltage translation) functions are separated from LOGIC translation functions wherever these voltage translation functions wherever appropriate.

Figure 7:
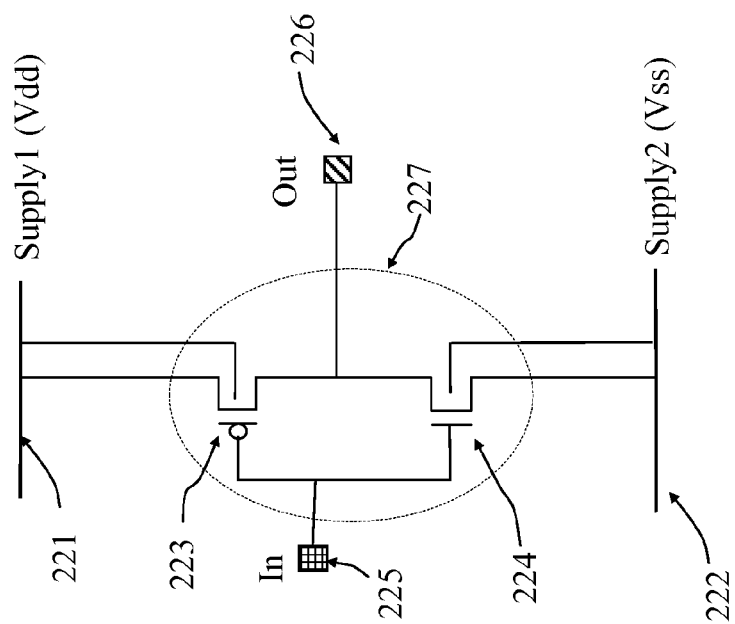
FIG. 7 illustrates a CMOS inverter.

FIG. 7 shows schematic of the most basic CMOS Boolean logic function—an inverter. The inverter has a PMOS device 223 and a NMOS device 224 that are connected together. In more detail, the PMOS device or transistor (223) is connected, at its drain, to an NMOS device or transistor 224 and, at its source, to Supply1 (vdd) (221). The NMOS device or transistor 224 is connected, at its drain, to the PMOS device 223 and at its source to Supply2 (vss) (222) as shown in FIG. 7. The gates of both the PMOS and NMOS devices 223, 224 are connected to an input node "In" (225) and the drains of the PMOS and NMOS devices are connected to an output node "Out" 226. Nodes "In" (225) and "Out" (226) are the input and output, respectively, of the inverter. When input "In" has a voltage approximately equal to the voltage at "Supply1" or Vdd or "Logic High", the PMOS transistor is turned OFF and NMOS transistor is turned ON which causes current to flow from output node to Supply 2 (Vss). Supply 2 works as a current sink and is typically at ZERO volts. As a result, the flow of current from the output node to Vss causes the voltage at output node to be approximately equal to ZERO volts which is "LOGIC ZERO" or "LOGIC LOW". Similarly when the voltage at input node (225) is approximately equal to voltage at node "Supply2" or "vss" or "LOGIC ZERO", the NMOS device is turned OFF and PMOS device is turned ON which causes current to flow from "Supply 1" or "Vdd" to output node "Out" (226) which charges the output node "Out" to voltage approximately equal to "Vdd" which is "LOGIC HIGH" or "LOGIC ONE". In summary when input is LOGIC LOW (which is approximately equal to voltage at Vss) then output is LOGIC HIGH (which is approximately equal to voltage at Vdd) and when input is LOGIC HIGH (which is approximately equal to voltage at Vdd) then output is LOGIC LOW (which is approximately equal to voltage at Vss) which is the well known operation of an inverter.

While the inverter appears to be a very simple device with a very simple operation, many assumptions, electrical activities and functionalities of various nodes in the inverter (as in all Boolean CMOS gates) are hidden and are taken for granted by electrical designers. In this invention the hidden behavior, activities, properties and functionalities of inverter (or of any CMOS logic gate) and its internal nodes are used and modified to reduce leakage in CMOS circuits. These hidden behaviors, activities, properties and functionalities are discussed in later sections.

FIGS. 8A1-C illustrates a schematic and cross sections of a NMOS device and a PMOS device and a cross section of an inverter, respectively. The features exhibited by an inverter are exhibited by all CMOS Boolean gates. When designing any alternatives to this classical CMOS Boolean gate structure, one needs to preserve these subtle and hidden features, behaviors and properties of the CMOS Boolean gates that provide substantial practical benefits in a real practical CMOS IC.

The reduced leakage current technology exploits the multi functional ability of the connectivity and presence of NMOS and PMOS devices in a CMOS structure to reduce leakage significantly.

Figure 2:
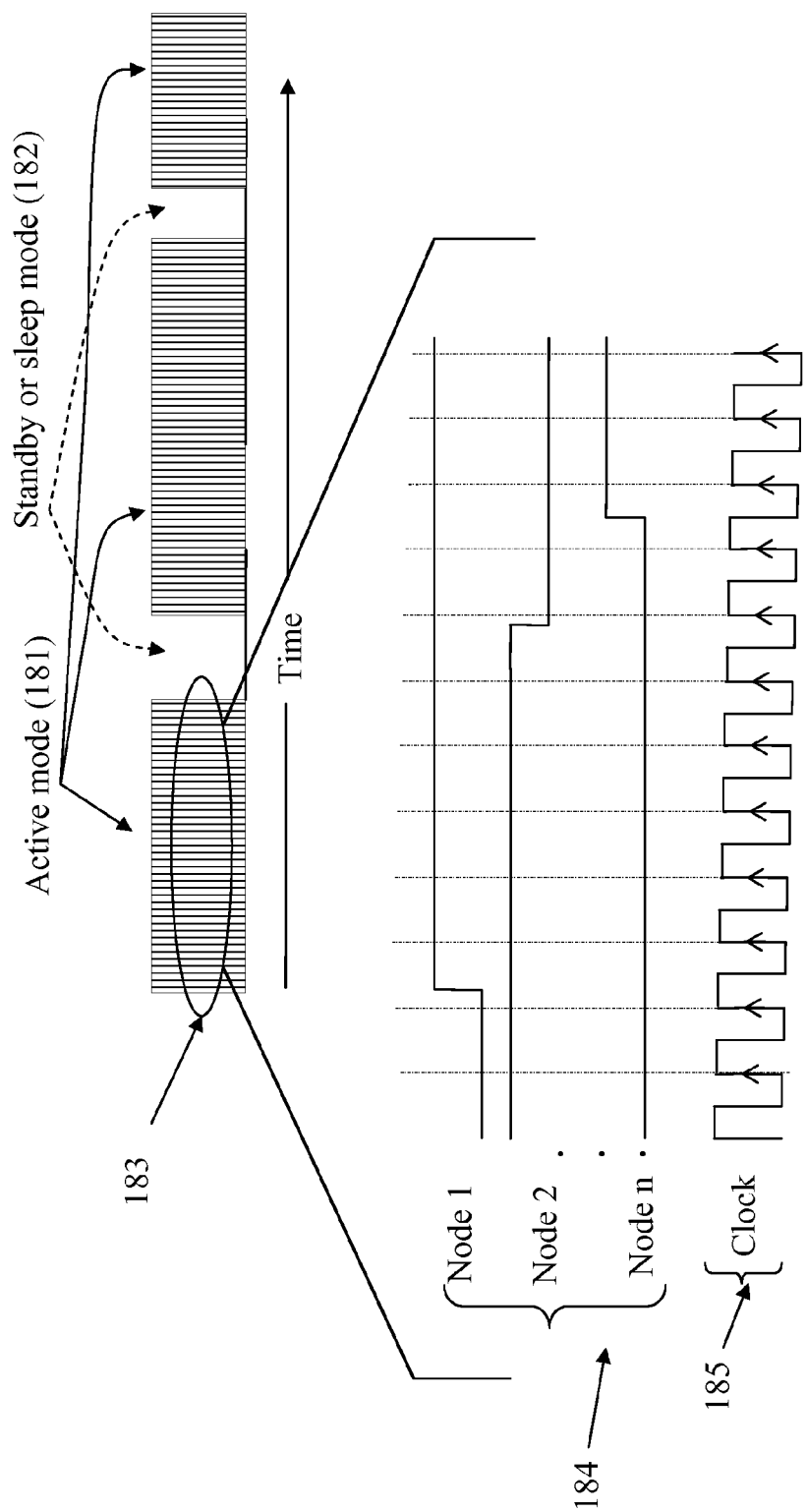
FIG. 2 illustrates circuit behavior in an active mode and standby mode.
Figure 3:
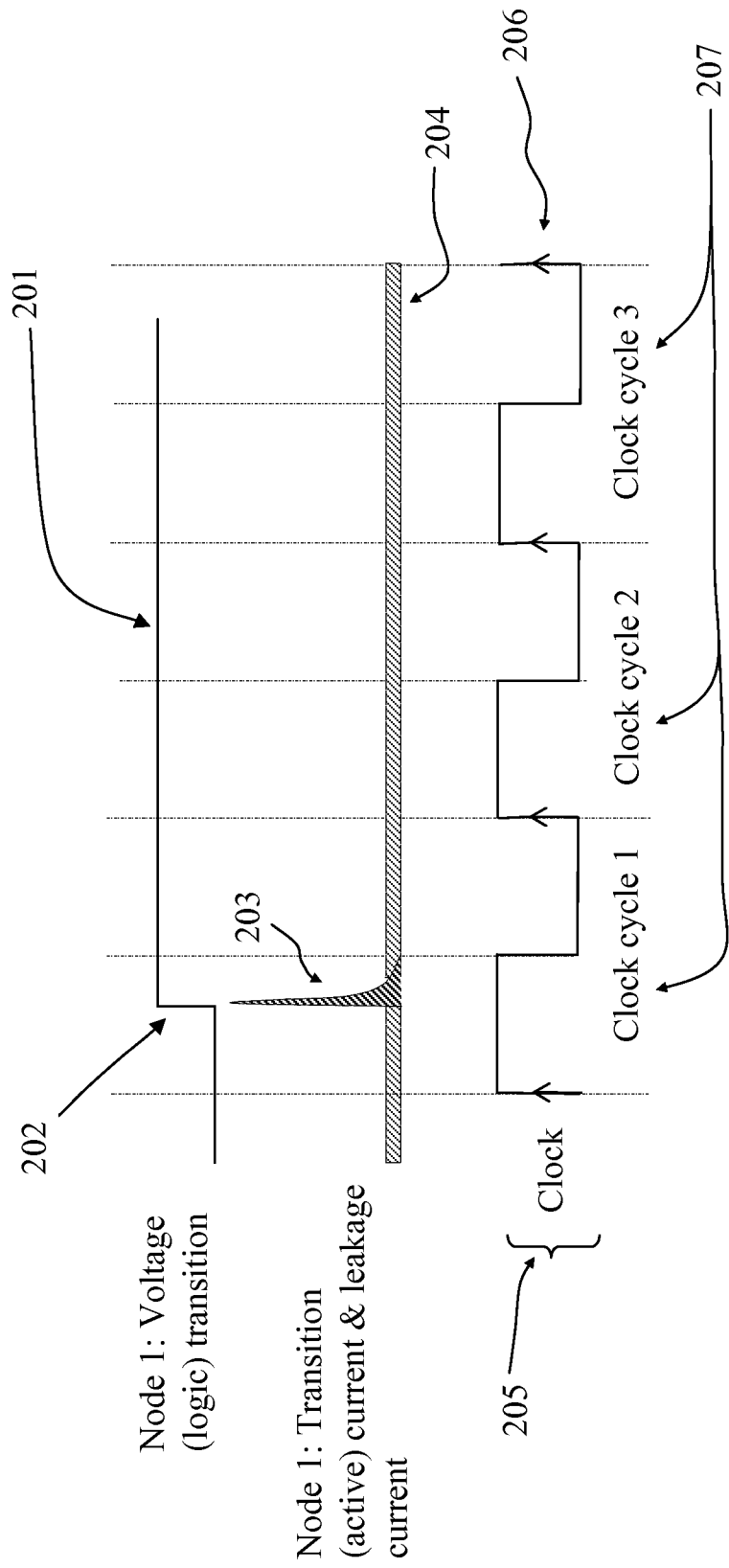
FIG. 3 illustrates circuit behavior in a given clock cycle.
Figure 4:
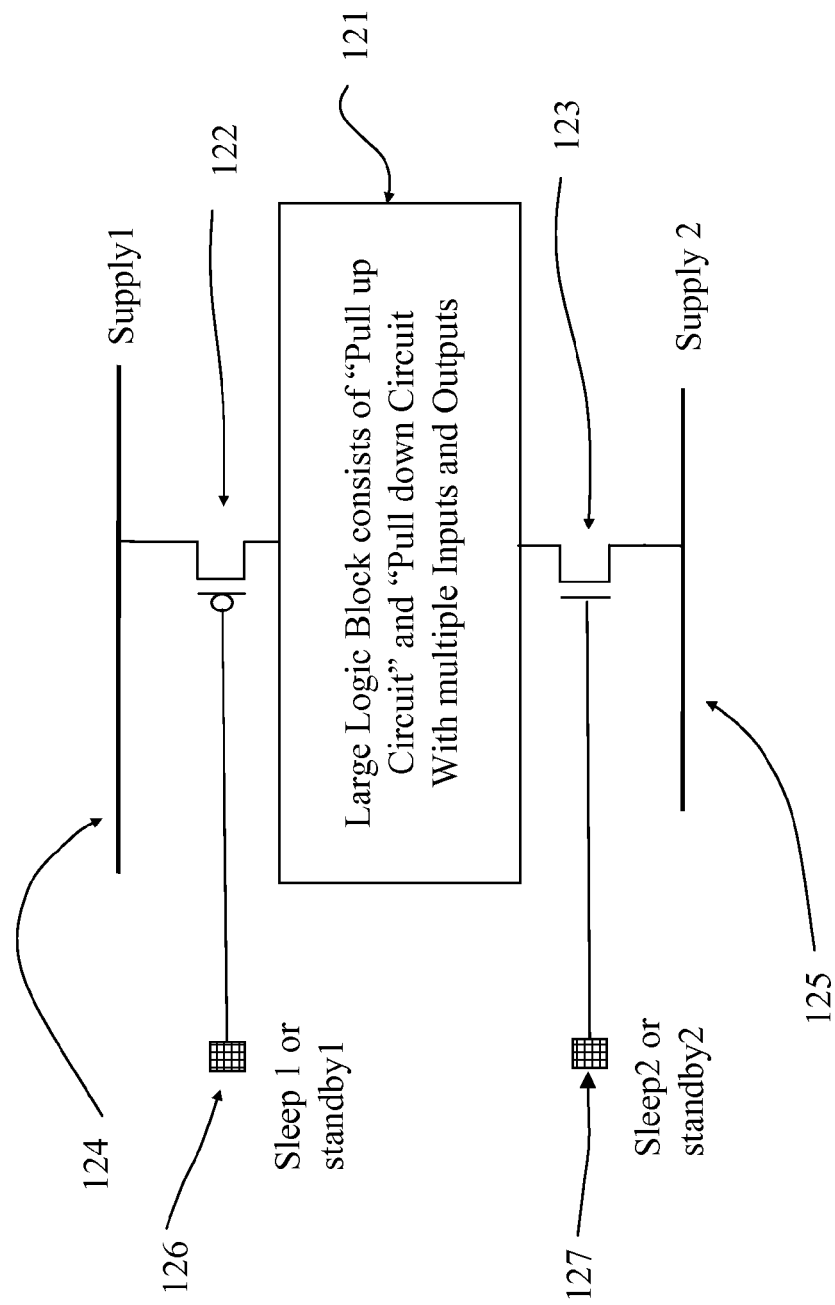
FIG. 4 illustrates an existing technique for leakage reduction.
Figure 5:
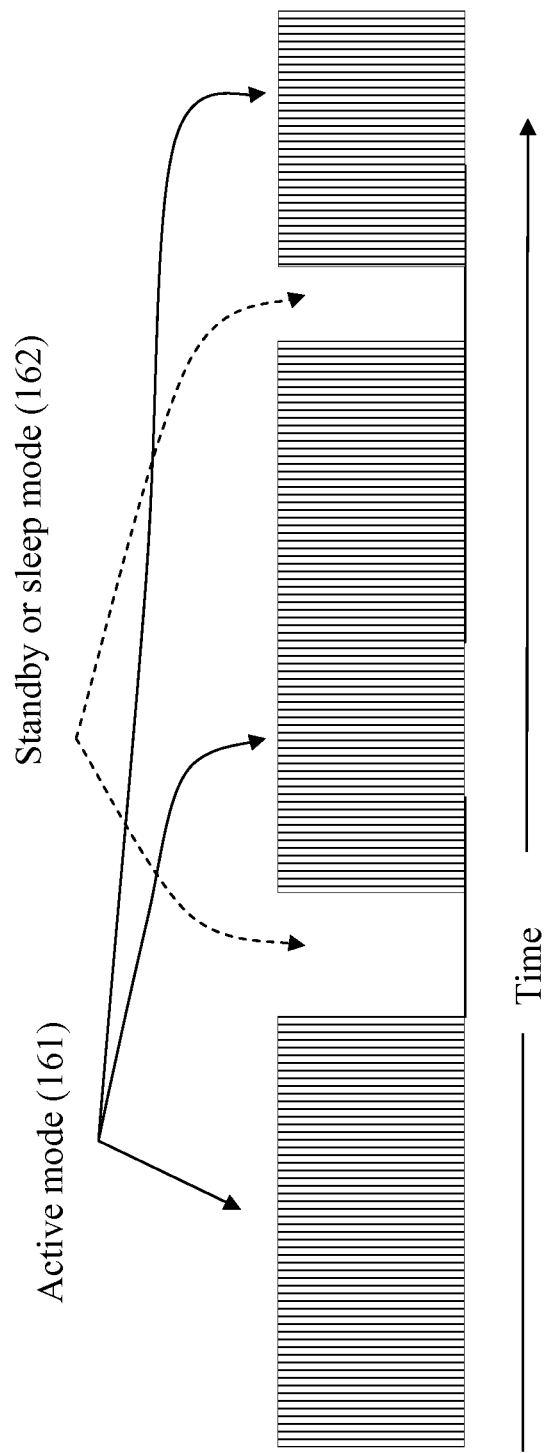
FIG. 5 shows that a functional unit or chip is in sleep mode in between active mode in time.
Figure 6:
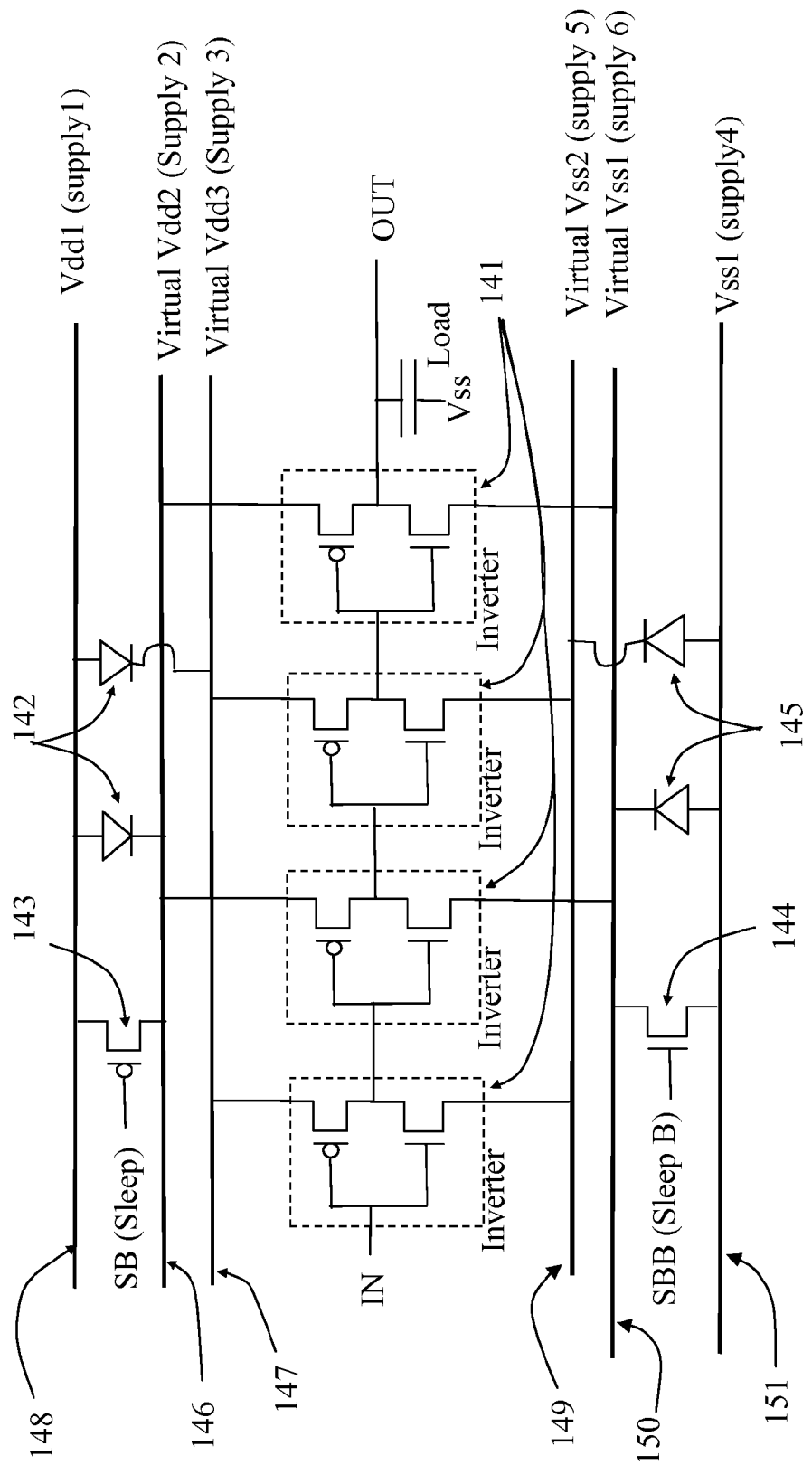
FIG. 6 illustrates an existing leakage reduction technique that uses sleep signals "SBB" and "SB" to a chain of inverters.

FIG. 8A1 illustrates a schematic of PMOS device that has a source/drain terminal 276, a P-substrate terminal 277, a drain/source terminal 278 and a gate terminal 279. FIG. 8A2 illustrates cross section of the PMOS device in which the PMOS device is fabricated on a N-substrate or an N-well. The PMOS has two doped P+ diffusions 286, 289 that are implanted in a N-substrate or N-well 287. These two function as the source or drain ports 283, 284 of the PMOS device and these two are interchangeable in circuit usage. A non conducting Silicon oxide 282 is formed aligned with the ends of source and drain implants as shown. A conducting Poly Silicon gate 281 is deposited aligned with the non conducting oxide 282. The source and drain nodes (289, 286) are metalized to provide conducting source/drain nodes 280, 283. To connect the substrate 287 to appropriate voltage supply, a highly doped N+ implant 1286 is formed in substrate 287 and the metallization is done on top of this implant to form a conducting substrate node 284. These four nodes (gate (281), source/drain (280, 283) and substrate (284)) are available to circuit designers for appropriate usage.

FIG. 8B 1 illustrates a schematic of an NMOS device that has four terminals—a source/drain 272, a P substrate 273, a drain/source 274 and a gate 275. FIG. 8B2 illustrates the cross section of a the NMOS device that is fabricated on a P substrate or an P+ well. The NMOS device has 4 nodes. Two heavily doped N+ diffusions (299, 296) are implanted in a lightly doped P-type substrate 297 (also called P-substrate). These two function as the source or drain ports of the NMOS device. These two are interchangeable in circuit usage and any of these two (299, 292) can function as source or drain ports. A non conducting Silicon oxide 292 is formed aligned with the ends of source and drain implants as shown. A conducting Poly Silicon gate 291 is deposited aligned with the non conducting oxide 292. Source and drain nodes (299, 296) are metalized to provide conducting source/drain nodes 290, 293. To connect the substrate 297 to appropriate voltage supply a highly doped P+ implant 1296 is formed in substrate 297 and the metallization is done on top of this implant to form a conducting substrate node 294. These four nodes (gate (291), source/drain (290, 293) and substrate (294)) are available to circuit designers for appropriate usage.

Figure 8C:
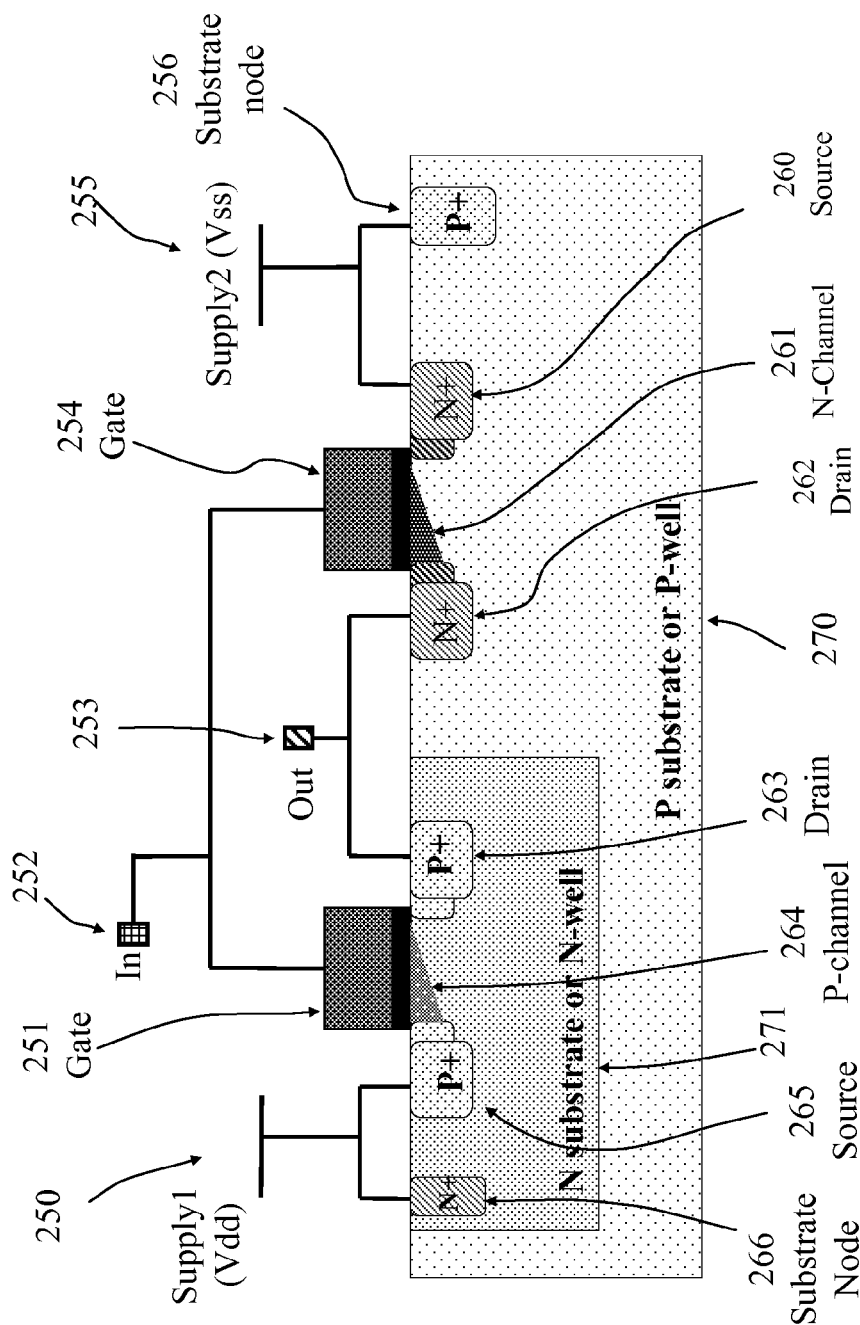

When used together in an inverter as shown in FIG. 8C, a substrate node 256 of the NMOS device is connected to a supply node 255 with lowest voltage called VSS or GND (generally at ZERO Volts). One of the source/drain nodes (260 or 262) of the NMOS device is also connected to the same supply node with the lowest voltage and this node becomes the source node of the NMOS, while the other node becomes drain node of the NMOS as shown in FIG. 8C. Similarly for the PMOS device, a substrate node 266 is connected to a supply node 250 with highest voltage called VDD or VCC (which has different voltage value in different technologies). A source node 265 of the PMOS device is also typically connected to the same supply node VDD or VCC. In an inverter, the drain nodes of NMOS 262 and PMOS 263 are connected together as shown in FIG. 8C to form an output port 253 of the inverter. Similarly the gate nodes 251, 254 of NMOS and PMOS are connected together to form an input port 252 of the inverter.

Figure 9B:
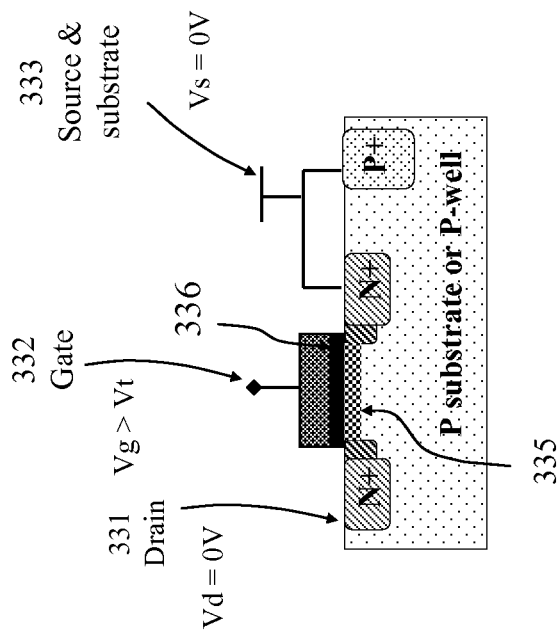
FIGS. 9A-D illustrate four different states of an NMOS device.
Figure 9A:
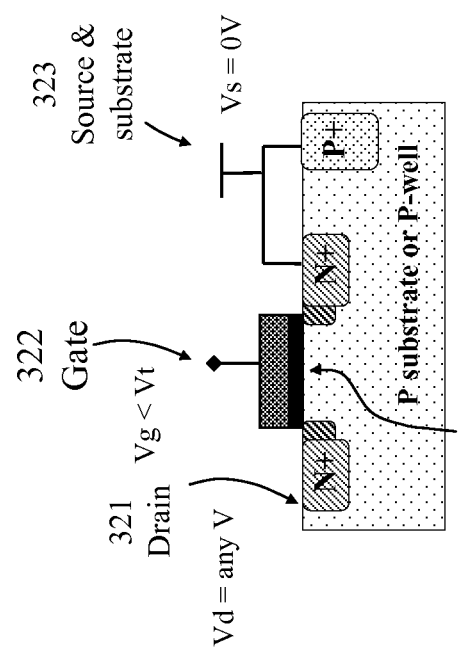
Figure 9D:
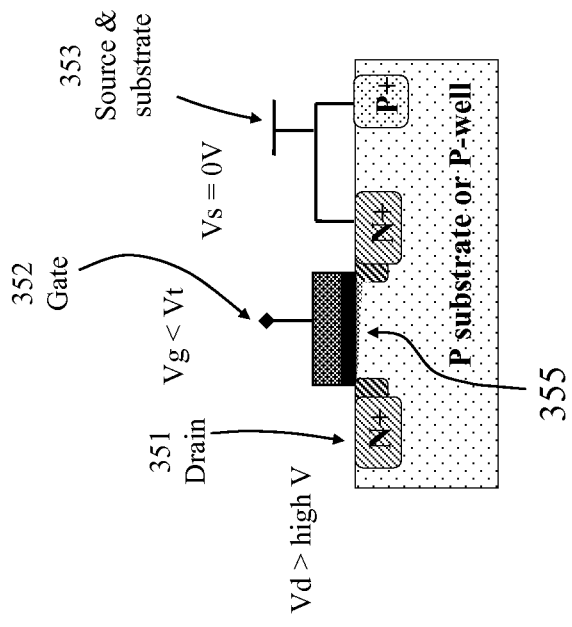
Figure 9C:
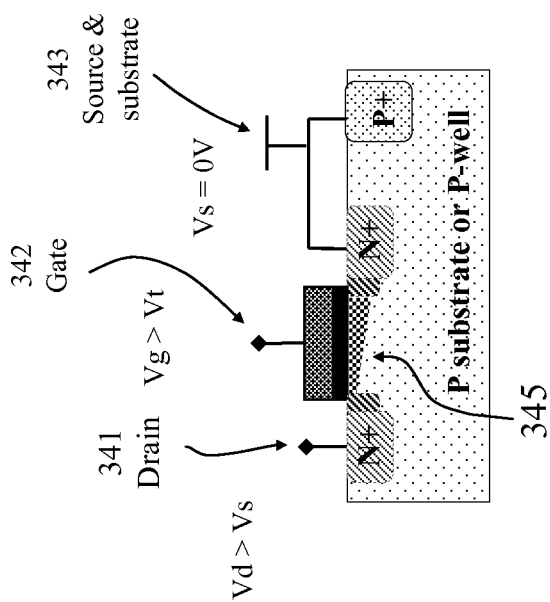

FIGS. 9A-D illustrates four different states of an NMOS device. The MOS conduction and leakage mechanisms can be understood from functioning of an NMOS device. As shown in FIG. 9A, an NMOS device has its substrate and source node tied to 0 Volt (VSS or GND) which is the supply node with lowest voltage (323). The NMOS device is now configured and capable to draw electrons from VSS to form a conducting channel due to this connection (323). If the voltage on a Gate node 322 is lower than a fixed voltage called Threshold voltage (Vt) compared to voltage at source (322) (that is Vss), the conducting channel is not formed underneath the gate (325) and the NMOS device is theoretically OFF. If the Gate node 322 is driven to a voltage greater than Vt (332) and the drain node is still at same voltage as the source (0V in this case) as shown in FIG. 9B, electrons are drawn from substrate underneath the Gate due to Electric field through the gate oxide (336) and form an uniform conduction channel (335). Though this channel is formed and ready to conduct there is still no current between source and drain nodes because there is no voltage gradient between drain and source. FIG. 9C shows the next stage. To make the NMOS conduct, the voltage on drain node (341) is raised above the voltage on source node 343 as shown in FIG. 9C. Now the NMOS transistor is ON and conducting current from drain to source terminals. As the voltage on drain terminal increases above source terminal, the current in NMOS transistors increases till it saturates. Once saturated the NMOS has reached its maximum current for a given gate-source voltage and the current can increase no more.

FIG. 9D shows the OFF transistor from FIG. 9A but in a practical condition (where Gate voltage Vg is less than Vt and drain voltage is Vdd or other high voltage). The gate voltage is lower than Vt (352) and the NMOS device should be OFF but a practical device exhibits non-ideal behavior. In particular, underneath the gate, mobile charges (electrons in this case) are generated due to thermal energy inside the channel 355 thereby forming a channel of thermal mobile charges. If the drain voltage is greater than voltage on the source node, current flows between source and drain nodes causing leakage current. The leakage current is larger at larger drain-source voltage. Similarly the leakage current is larger at higher temperature.

This leakage current is mostly undesired in CMOS ICs.

The operation of the PMOS device is similar to the NMOS device except that the channel formed in PMOS is that of positive mobile charges (called holes), the voltage on substrate and source is VDD and the gate voltage is negative as compared to source voltage for the PMOS to conduct. However, leakage mechanism is similar in that thermal mobile charges form unwanted conduction channel and cause the PMOS transistor to leak current.

In practice in a CMOS gate, one or more of PMOS transistor or one of more of NMOS transistor is theoretically always OFF, but has leakage current. Thus, all OFF MOS transistors in digital ICs have leakage currents. As stated earlier, in modern CMOS ICs, leakage is a large percentage of total current in ICs which is undesired. It is a known and understood fact in the industry that the leakage current is linearly proportional to the voltage between drain and source nodes of a MOS transistor and exponentially proportional to the voltage between gate and source when magnitude of Gate-Source voltage is below Vt (called sub-threshold condition for MOS device). This exponential behavior continues even when voltage on gate node is lower than voltage on source node for NMOS or when the voltage on gate node is higher than the voltage on source node of a PMOS transistor (the NEGATIVE GATE Voltage). When the gate voltage on MOS is lower than the source voltage or when the gate voltage in a PMOS is higher than the gate voltage, this is condition of NEGATIVE GATE VOLTAGE. Since leakage current decreases exponentially in sub-threshold region of the gate voltage (gate voltage smaller than threshold voltage or Vt) even when the gate voltage-source voltage is negative, applying negative gate voltage is a very effective way of reducing leakage current exponentially in MOS devices and hence in CMOS ICs.

This known property of exponential reduction in leakage current in MOS transistors below Vt (in particular negative Vt) is used in this current invention. New circuit design methods and circuit design topologies are invented to apply negative gate-source voltage (also called Negative gate voltage biasing or simply negative gate biasing) to MOS transistors that have high leakage in standard CMOS gates but are required to be used in ICs to achieve speed and performance. Details of these methods and circuit designs are discussed in later sections.

Figure 10:
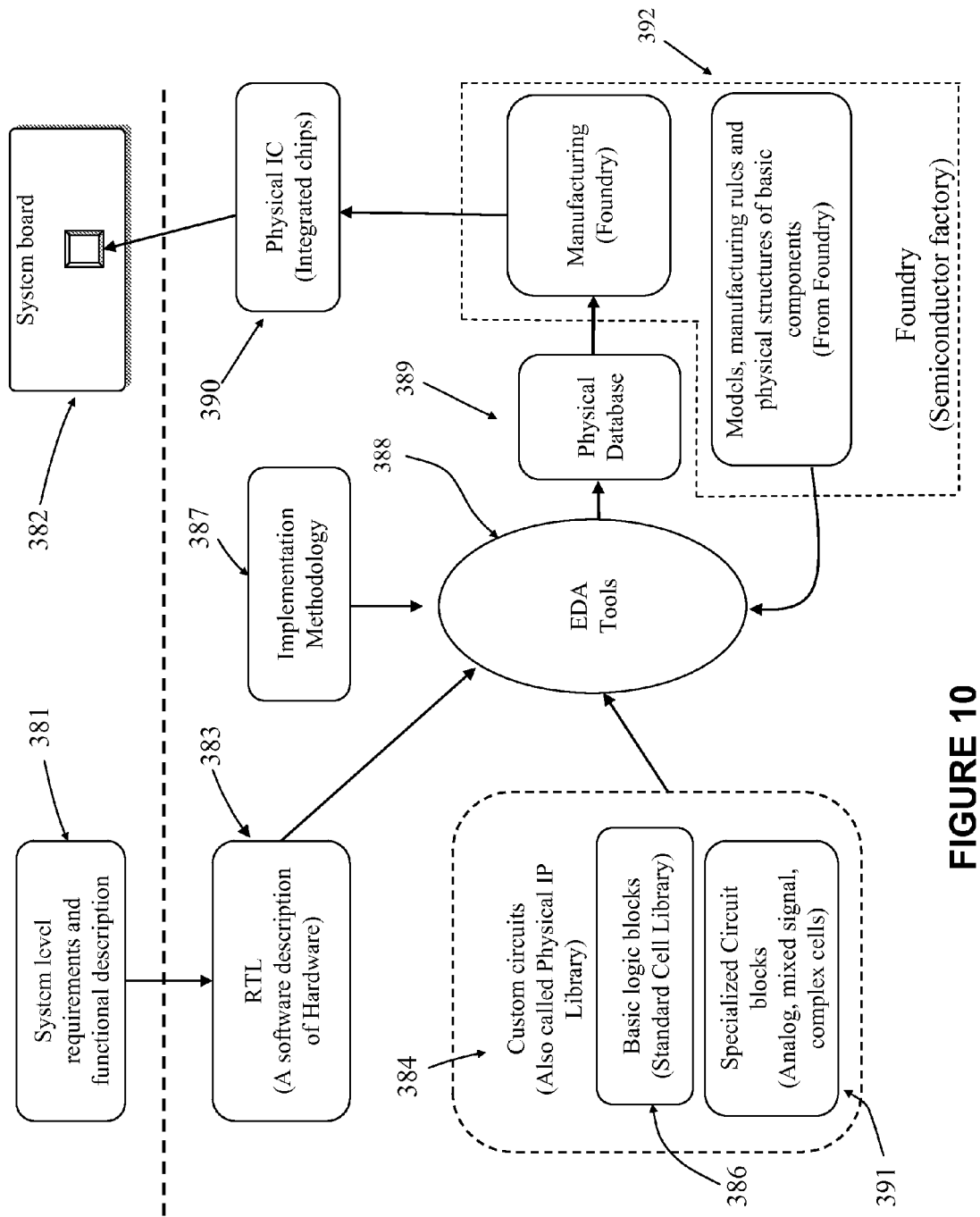
FIG. 10 illustrates a normal IC development (design and implementation) process.

FIG. 10 illustrates a normal IC development (design and implementation) process. In the process, three independent user inputs are mixed and iterated by Electronic Design Automation (EDA) tools 388 to produce a physical database in graphical format that is converted by the manufacturing house ("semiconductor foundry" or "Foundry") into a physical IC that finally gets used in a system board to perform a specific electronic function. Specific description of functionality and connectivity is generated by a system design engineering team based on system requirement 381 provided to IC design engineers. The IC design engineers translate these requirements and connectivity into known Register Transfer Logic (RTL) (383) for the intended IC. RTL is software like description of IC's functionality and connectivity, written in a Hardware Description Language (or HDL). Using EDA tools (388), the RTL is mapped to a Physical IP Library (384) to produce an intermediate format called netlist that describes connectivity of basic functional blocks from Physical IP library (384) to form the complete designed functionality of the IC. Physical Intellectual Property (IP) Library consists of basic functional blocks that can be connected together to form a hardware function. As mentioned, most ICs are CMOS based. Hence most Physical IP Library used in the industry is also CMOS based. Using manufacturing rules and constraints provided by the manufacturing factory (semiconductor foundry) (392) and the Physical IP library (384), and according to the rules and mechanism of the implementation methodology 387 as designed by implementation engineers, the EDA tool produces the graphical patterns and database or Physical database (389). This physical database is then processed by software tools and (mostly robotics) machines of the foundry to produce the physical silicon integrated chips (IC) 390 that gets used in a system board (382). In general RTL (383), Physical IP library (384), manufacturing rules and constraints (392), and EDA tools and Implementation methodology (387) are provided by different companies or different teams.

Because of high cost of Manufacturing of CMOS ICs, the companies that manufacture and develop new CMOS ICs has consolidated in recent years and only a few companies in the world have modern semiconductor manufacturing factories. Modern Semiconductor manufacturing involves very high skilled engineering and scientific manpower, machines and infrastructure. Because of highly sensitive and secretive manufacturing, materials, methods, flow and procedures it is not practical for IC designers to cause changes in manufacturing rules and constraints. This means these rules and constraints are generally rigid and inflexible. These rules and constraints are provided to IC design engineers by semiconductor foundries.

The RTL (383) depends on the requirement from the customer or the system. Though an RTL designer can request changes in functionality and connectivity from system engineering team, in practice such change requests are avoided because of perturbation such changes may cause in the customer's systems, software and usage chain. Since such change requests are expensive to incorporate at system and software level, these are avoided also because of business reasons. This means RTL is also generally a rigid and inflexible to a large extent for a given IC. Any major change in RTL is avoided in practice. It is important to know that generally an IC is owned by the company or team that owns RTL. Therefore, any quality improvements or reduction/elimination in shortcomings or limitations are therefore addressed in implementation methodology (387), Physical IP Library (384) and EDA tools (388). Among the three, use of Physical IP Library to eliminate issues or make improvements is preferred because of lower cost of making changes in a Physical library. Also because changes in Physical IP Library are contained within the library and very little or no effects are caused on any other part of the IC construction process.

The reduced leakage current device and method of manufacture is a circuit technology that can be implemented to form a Physical IP library. Furthermore, no effects are caused on RTL, EDA tools or manufacturing rules and constraints. In addition, very little (almost negligible) effect is caused on "Implementation methodology." The reduced leakage current device and method of manufacture also may be used with and is compatible with most leakage reduction technologies that are based on architectural or manufacturing features. It reduces leakage significantly even in ICs that already use one or other leakage reduction technologies. Because of these advantages, the reduced leakage current device and method of manufacture can be easily implemented in all CMOS ICs.

As mentioned earlier an inverter of FIG. 7, is very simple in construction and functionality at a high level, but it has many hidden features, functionalities, activities and properties. For purpose of this invention, these are revealed and analyzed below:

(i) Supply 1 and Supply 2 (the "Vdd" and Vss") perform many functions in the inverter:

a. Vdd works as current source. All nodes inside the logic gate derive current from Vdd. Similarly Vss node works as a current sink. All current from the logic gate are sinked to Vss.

b. Vdd is a representation of "LOGIC HIGH" or "LOGIC ONE"" and Vss is a representation to "LOGIC ZERO" or "LOGIC LOW". This means any node that is approximately equal to Vdd in voltage is at "LOGIC 1" or "LOGIC HIGH" and any node that is approximately equal to Vss is at "LOGIC 0" or "LOGIC LOW". It must be noted that equality of Vss to "LOGIC 0" (or "0") and equality of Vdd to "LOGIC 1" (or "1") is not a requirement for Boolean (or binary) logic computation. Because of its simplicity, this has been the preferred way of implementation in CMOS ICs.

c. Vdd and Vss are also the reference voltage for input ("In") and output ("Out") nodes. The input is driven to Vdd or Vss (or approximate voltage levels) and output transitions to the same voltages (approximately equal to Vdd and Vss). This means output node of a Boolean gate can be connected to the input node of another Boolean gate with any conductor without any interface elements in between. This is a remarkably powerful property of CMOS that makes it very easy to connect any number of logic blocks of any size and any functionality to other without any issues and limitation as long as designed functionality is achieved after integration of these blocks. This means IC designers can worry about the connectivity for functionality alone. There is no need to worry about compatibility of connections.

(ii) At any given time in an inverter, only a PMOS device or an NMOS device is ON. This electrical activity concept is followed in all Boolean gates (with any functionality) that have Pull up and Pull down circuits connected to any given output since only one of the Pull up or Pull down circuit is ACTIVE thereby pulling the output to LOGIC ONE or LOGIC ZERO. Active or transition current does not flow from Supply 1 (Vdd) to Supply 2 (Vss) except for the limited duration when the output of the gate transitions from one logic value to another. This means that the output of a Boolean gate always transitions to a voltage equal to Vdd or Vss in steady state (some error in this equality occurs due to leakage current or noise).

(iii) The inputs and output of a Boolean gate are virtually connected to Vdd and Vss without designer making special efforts so that the output of a CMOS Boolean gate is universally compatible to inputs of any other Boolean gate.

(iv) A PMOS device pulls positive charges from Supply 1 or Vdd to form a channel when it switches ON to conduct current. Similarly the NMOS device pulls negative charges from Supply 2 or Vss to form a channel when it switches ON.

(v) The N-substrate or N-well where a PMOS device is located on a silicon wafer connects to the highest voltage which is generally Supply 1 or Vdd and the P-substrate or P-well where NMOS devices is located on the silicon wafer connects to the lowest voltage on the IC which is generally Supply 2 or Vss. The source terminals of PMOS and NMOS devices are also connected to the same nodes Vdd and Vss in general in most CMOS ICs.

(vi) When the input transitions between logic values, the output transitions in a reverse order for an inverter. The output is then held to the transitioned LOGIC value by the same device that conducts current for that transition. This means that the same MOS devices that provide means for logic computation also work as driver for connectivity (a wire) that connects the output of this gate to input of other gates. For example, when input transition from LOGIC LOW to LOGIC HIGH, the output transitions from LOGIC HIGH to LOGIC LOW and the NMOS device switches ON and conducts current from output node to Vss to make this transition happened. Additionally, if another logic gate is connected to the output node ("load"), this same NMOS would conduct current from input of this connected gate "load" thereby transitioning the input of the "load" gate. This additional functionality of MOS devices in the "driver" CMOS gate provides ease of use implementation of CMOS technology.

(vii) Inputs of a MOS gate are non-conducting. This means that no static current flows between the input of a "load" CMOS gate and output of a "driver" CMOS gate in steady state. Only stored mobile charges are pulled or provided by the "driver" gate to the "load" inputs. This means any number of "load" CMOS gate can be connected to output of a CMOS gate without loss of accuracy as long as enough time is available for making the transition of load inputs. In practice the number of loads is limited to achieve good speed of transition.

The CMOS INVERTER of FIG. 7 can therefore be seen as a circuit block consisting of a group of functional blocks connected together as shown in FIG. 11A. These functional blocks are input receiver (5113), output driver (5114), logic computer (5111) and noise filter (5112). Power supplies "Supply 1" or "Vdd" 5115 and "Supply 2" or "Vss" 5116 provide the current source and sink functionalities along with being reference for compute, compare, noise and other necessary functions.

Amazingly, as shown in FIG. 7, in a standard CMOS process, all of these functions are performed by a simple entity (227) consisting of a singular PMOS (223) and a singular NMOS (222) in an inverter in standard CMOS process.

In standard CMOS logic gate, the input and output signals transition between two voltage rails Vdd and Vss as shown in FIG. 11B. Because of this, when two or more logic gates are connected together, the wires connected between the logic gates also transition between the same supply rails Vdd and Vss. All MOS transistors that provide various functionalities are also connected to the same supply rails Vdd and Vss as shown in FIG. 7 and FIG. 11A.

Figure 11:
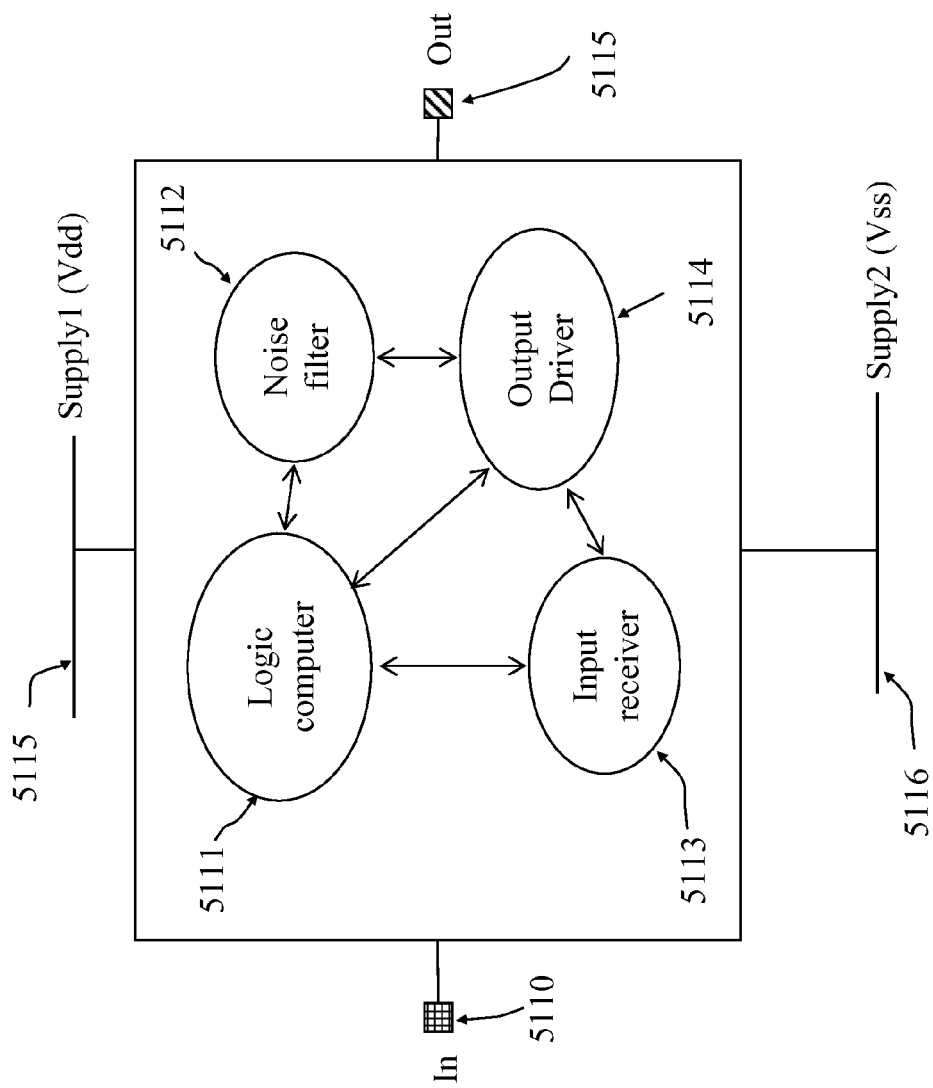
FIG. 11A illustrates an inverter with functionality divided in multiple sub blocks.
FIG. 11B illustrates voltage swings at interfaces between standard Boolean gates.
Figure 11:
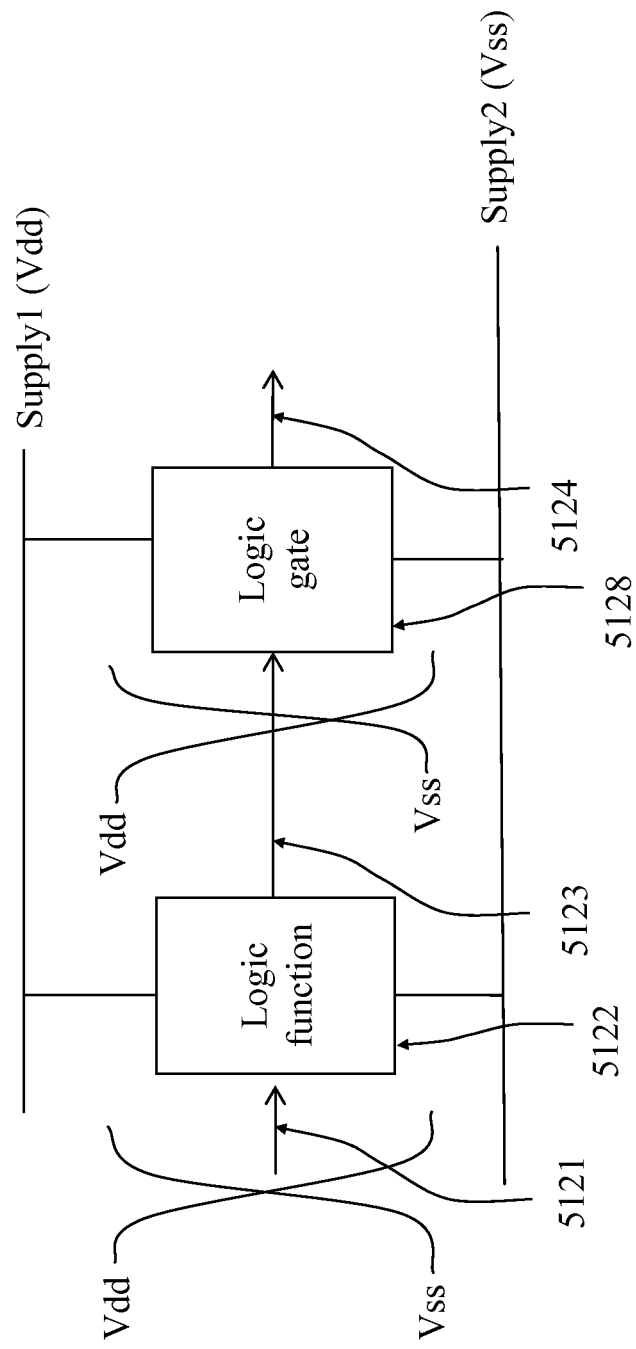

FIG. 11 B shows voltage transition of signals connecting multiple Logic functions in standard CMOS process. A set of output and inputs signals or wires 5121, 5123, 5124 transition between supply-rails "Vdd" and "Vss", the same supply rails that the logic function gates 5122, and 5128 are connected to. Uniformity of supply rails for connecting transistors and reference for input and output signal swing provides ease and simplicity of operation and implementation. However, this uniformity becomes a limitation and causes high leakage in high speed MOS transistors in standard CMOS logic circuits.

Figure 12:
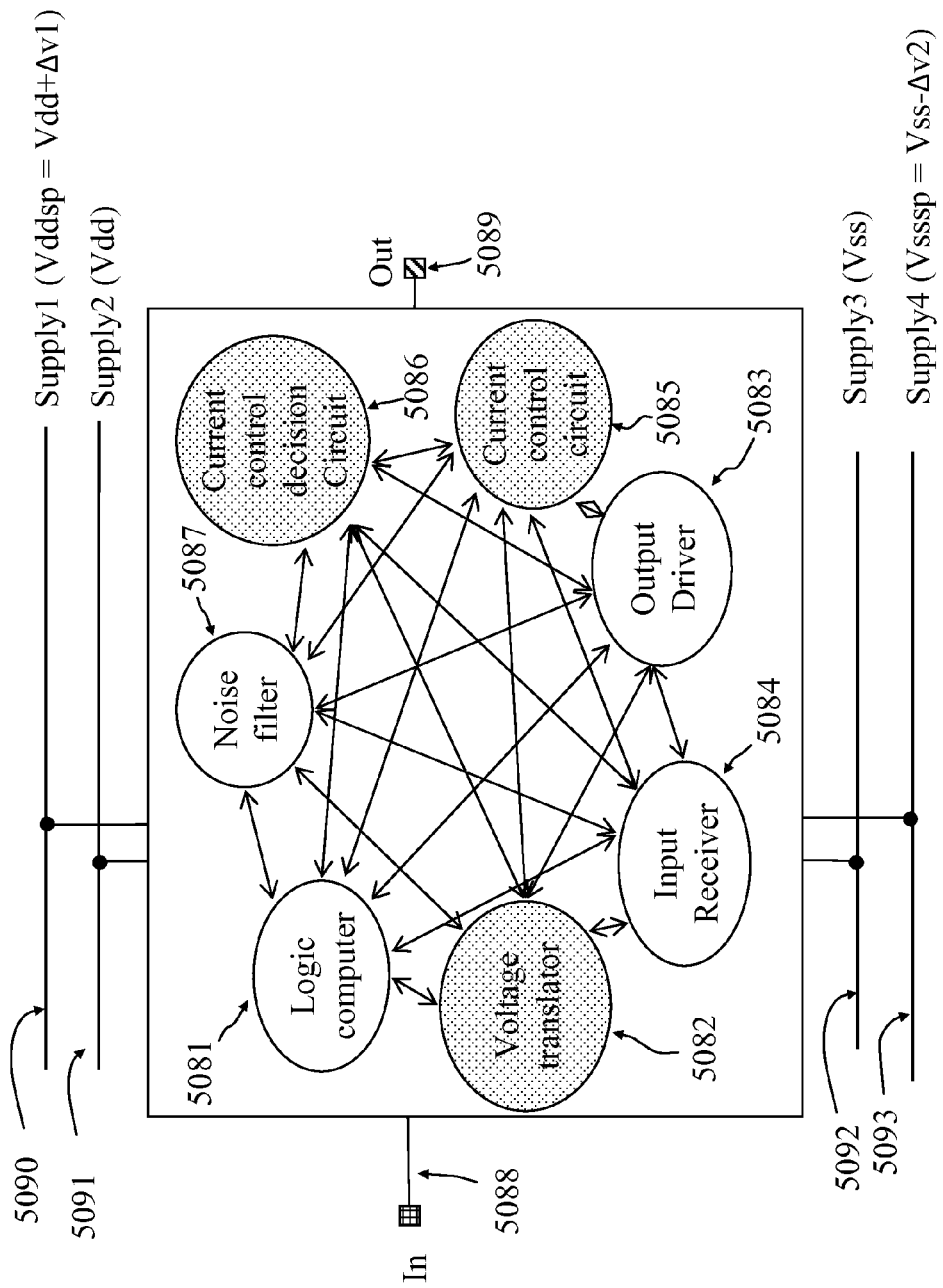
FIG. 12 illustrates functional sub-blocks of an inverter (or any functional gate) using the reduced leakage current LOGIC (RLCL) technology.

FIG. 12 illustrates general construction and functionalities of an inverter (or any other logic function gate) using leakage reduction technology of this invention. New sub blocks have been added to the sub-blocks of FIG. 11A to accomplish reduction in leakage current. The new functionality sub-blocks are "Voltage translator" 5082, "Current control decision circuit" 5086 and "Current Control circuit" 5085. Other functional sub-blocks of FIG. 11A of standard CMOS INVERTER (or any standard CMOS functional gate) remain same as FIG. 11A and perform all the necessary standard functions of CMOS gate described earlier, namely Logic computer (5081), Noise filter (5087), output Driver (5083) and Input receiver (5084). Two new supply rails are added "Vddsp" and "Vsssp" making the number of supply rails to be 4 (as compared to 2 in a standard CMOS Boolean logic gate). Supply1 (5090) and Supply2 (5091) are two "voltage high" supply rails (Vddsp and Vdd) and Supply3 (5092) and Supply4 (5093) are two "voltage low" supply rails (Vss and Vsssp). The quad supply rails consisting of dual "Voltage High" and dual "Voltage Low" (5090, 5091 and 5092, 5093, respectively) are used to provide voltage references for generating DETERMINISTIC negative gate voltages to MOS devices and do other necessary functions required by the logic function gate.

All functionalities and features of a functional logic gate are preserved in the technology as per this invention with added feature that each functional logic gate has substantially lower leakage current than an equivalent standard CMOS gate. This reduction in leakage current is achieved by circuit design technology that causes DETERMINISTIC negative gate-source voltage to MOS transistors with high leakage current without need for any external control signal. All functional gates are self sufficient in achieving this feature in addition to preserving all required functionality of a standard CMOS functional gate.

It is important to note that CMOS circuits can be commercially viable only when its performance and behavior can be predicted deterministically in all conditions of environment, manufacturing, and material properties. Since voltage supply on different terminals of a MOS transistors affects behavior and performance significantly, mostly, a CMOS circuit technology is not of use commercially if deterministic voltages cannot be applied to all terminals of MOS transistors.

Also, when a circuit element or block requires external control signal to exhibit its properties, its usage and applicability are limited. Leakage reduction in CMOS circuits also has same property. Hence, a self contained automatic leakage reduction technology is essential for maximizing the impact.

Technologies described in this invention achieve all desired properties. Deterministic MOS current behavior is achieved by using deterministic voltages and voltage references and circuit apparatus to utilize these voltages and references appropriately. Circuit design, apparatus and methods eliminate need for any external control signal. Thus CMOS circuits constructed with this technology provide leakage reduction always, when not switching without help of external control signals.

The "Voltage translator" block 5082 in FIG. 12 does voltage translation of input and/or output signals from one supply rail to another supply rail. For example, it can be implemented to apply Vddsp on gate of a PMOS transistor whose source is connected to Vdd supply rail when the PMOS is supposed to be OFF, thus causing negative gate-source voltage to PMOS transistor(s), assuming Vddsp was a higher voltage than Vdd. Similarly, it can be implemented to apply a voltage Vsssp on gate of an NMOS transistor whose source is connected to Vss supply rail when the NMOS transistor(s) is supposed to be OFF, thus causing a "negative" gate-source voltage to NMOS transistor(s) assuming Vsssp is a lower voltage than Vss. In general, this functional block can translate input signal or output signal from one supply rail to another. Furthermore it can translate an internal gate, source or drain signals from Vdd to Vddsp or vice versa or from Vss to Vsssp or vice versa. This functionality is in addition to the functionality of a standard CMOS logic gate of computing output voltage to be LOGIC HIGH or LOGIC LOW as a function of combination of inputs and the logic function implementation. The "Current Control Circuit" 5085 provides control of leakage current when the output is not switching in addition to control of current for switching the output depending on the inputs and logic functions. "Current control decision circuit" 5086 monitors the behavior of the "Current Control Circuit" 5085 by monitoring how and when the "current control circuit" 5085 should be in operating condition for reduced leakage current, or operating condition for high switching current. It should be noted that such monitoring may have to be applied separately for all PMOS and NMOS transistors in the functional gate or they can all be driven by a single control or a combination of the two.

In other possible embodiments, number of supply rails can be changed from 4 to 3. Any of the 4 supply rails can be eliminated depending on whether leakage reduction is to be realized in both PMOS and NMOS or both Pull up and Pull down or only in Pull up or Pull down (or only in PMOS or NMOS).

In other embodiments, one, multiple or all functions of FIG. 12 can be implemented by one, two or many MOS transistors. Also, one, multiple or all functions may be subdivided in multiple blocks. Furthermore, two or multiple functional blocks can be merged together for purposes of implementations.

Figure 13A:
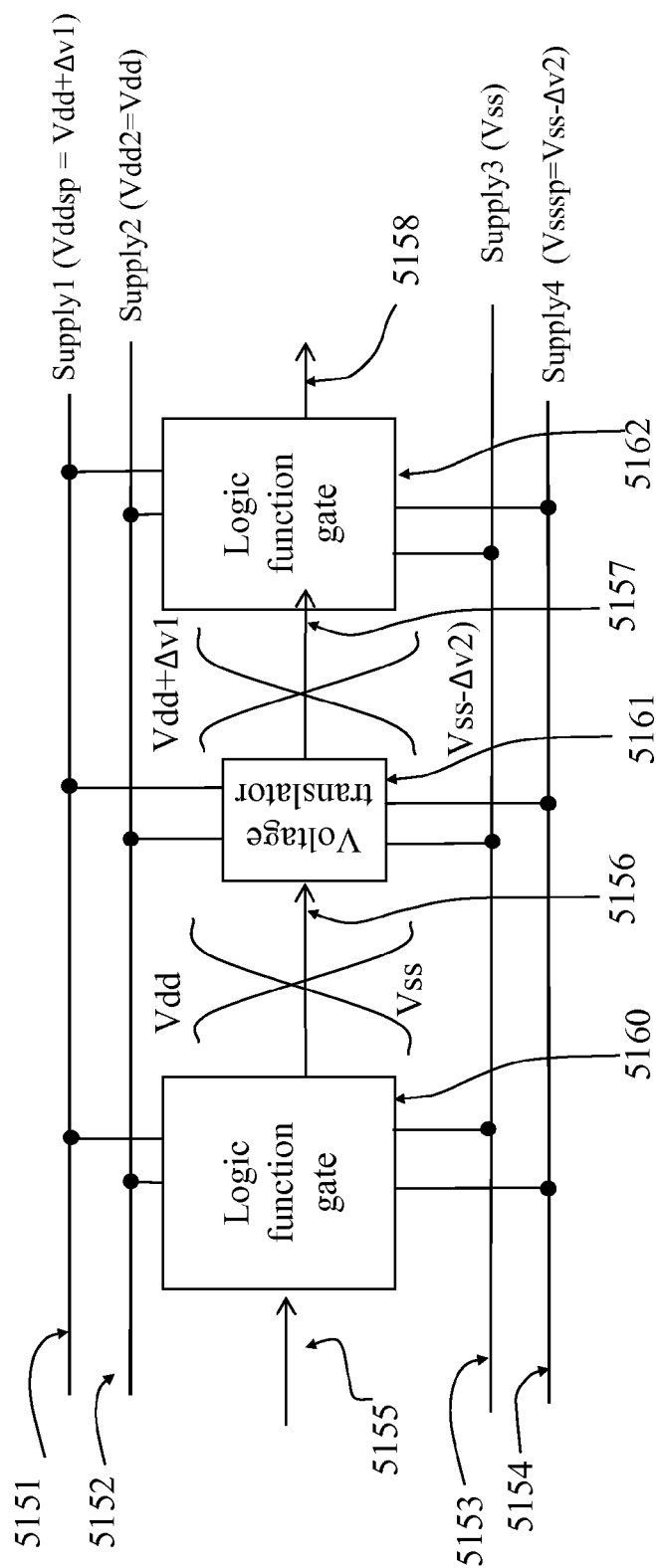
FIG. 13A illustrates a voltage translator functionality inserted in the path of signal propagation from one logic function to another logic function.
Figure 13:
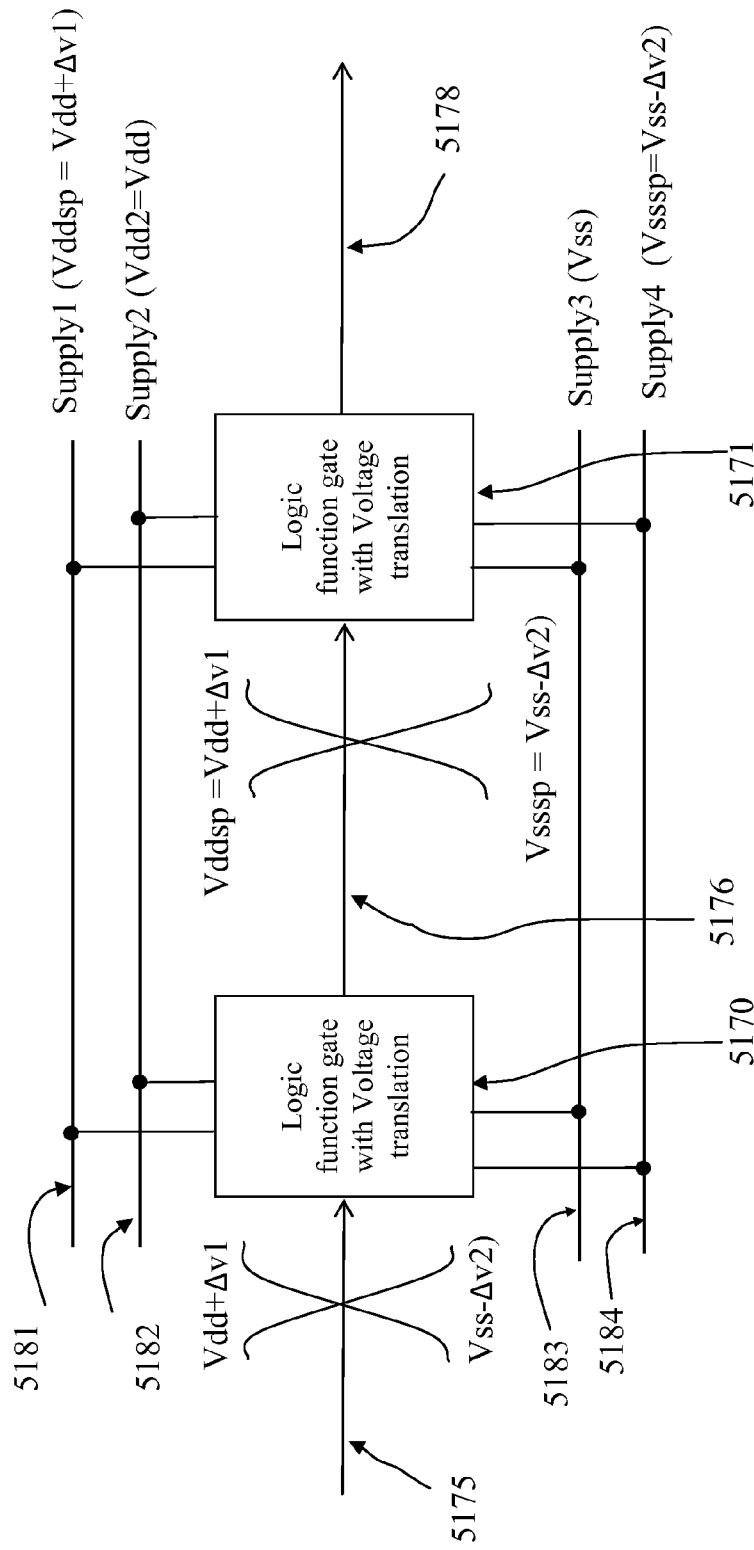
FIG. 13B illustrates Voltage translator circuit embedded in logic gates and voltage swing at interface between the logic blocks.

FIG. 13A illustrates the concept of voltage translation and use of voltage translation for leakage reduction as per this invention. As shown in FIG. 13A, a "voltage translator" 5161 is inserted in the signal propagation path from one Logic function gate 5160 to another Logic function gate 5162. This voltage translator block will translate the voltage on output signals 5156 driven by "standard logic function gate" 5160 from "Vdd" to "Vddsp" ("Vdd" Δv1") and from "Vss" to "Vsssp" ("Vss−Δv2") in addition to allowing the transition between Vddsp and Vsssp. Hence the output signals of "Voltage translator" now transitions between "Vddsp" ("Vdd+Δv1") and "Vsssp" ("Vss−Δv2"). Output signals of "Voltage translator" are also the input signals to the next "Logic function gate" 5158. Hence, with the "Voltage translator" thus inserted between two "Logic function gates" the output signals of the driving "Logic function gate" would transition between "Vdd" and "Vss" but the input signals of receiving "Logic function gate" would transition between "Vddsp" ("Vdd+Δv1") and "Vsssp" ("Vss−Δv2"). Such input signals result in "negative gate source voltage" if the transistors in "Logic function gate" were all connected to "Vdd" and "Vss".

Embodiment with "Voltage translator" as shown in FIG. 13A will achieve leakage reduction at cost of more delay in the signal propagation path. While this could be an acceptable solution to some applications, it may pose unacceptable restriction for some other applications.

In another embodiment the "Voltage Translator" blocks are merged with the "Logic function gate". In this way "Logic function gates" have built in "Voltage translator" functionality. This would allow voltage translation function to be merged with Logic computer and other necessary logical and electrical functionality of a Boolean function gate and achieve high speed along with the leakage reduction. FIG. 13B shows signal flow between blocks that have CMOS Boolean gate functionality merged with Voltage translation functionality. As shown the output signals and input signals transition between Vddsp and Vsssp. "Logic function gate with Voltage translation" 5170 and 5171 are connected to all supply rails Vdd, Vddsp, Vss and Vsssp.

In other possible embodiments these can be connected to any 3 supply rails if leakage reduction was desired only in PMOS or NMOS. The input/output signals in such case will transition between Vddsp and Vss or between Vdd and Vsssp depending on presence of the supply rails and depending on the requirements.

FIG. 13A shows only a limited possible implementation of general scheme illustrated in FIG. 12. FIG. 12 illustrates general construction and connectivity of a Logic function gate with reduced leakage technology of this invention.

Figure 14A:
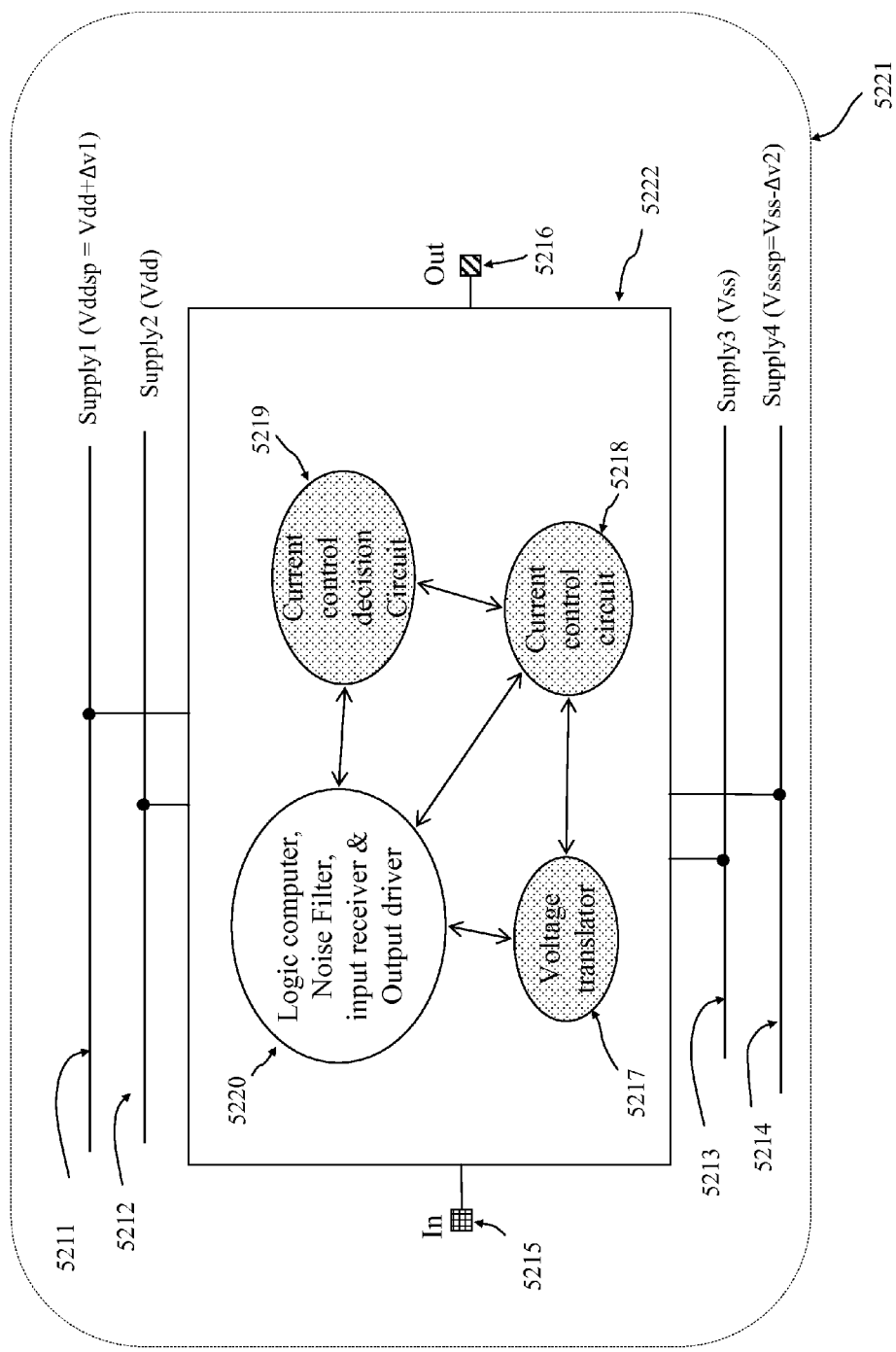
FIG. 14A is a general functional block diagram of each gate of a reduced leakage current device or a reduced leakage current logic gate.

For simplicity and consolidation of concepts the general construction diagram is illustrated with smaller number of sub-blocks in FIG. 14A. The "Logic computer" sub-block 5081, "Noise filter" sub-block 5087, "Input Receiver" sub-block 5084 and "Output Driver" sub-block 5083 of FIG. 12 have been merged into a single sub-block in FIG. 14A. All other sub-blocks of FIG. 12 remain unchanged.

Thus any logic function gate in the Reduced Leakage CMOS Logic (RLCL) technology as per this invention may be represented by FIG. 14A. As shown in FIG. 14A, each reduced leakage functional gate 5221 comprises of four main functional units: a "Logic computer, Noise filter, Input receiver & output driver unit" 5220, a "Voltage translator unit" 5217, a "Current control Circuit" 5218 and a "Current control decision Circuit" 5219. Each functional gate may have one or more inputs 5215 and one or more outputs 5216 that may be connected to one or more or all of these units (5220, 5217, 5218, and 5219). One or more of these units (5220, 5217, 5218, and 5219) may be connected to Supply1 (Vddsp) 5211, Supply2 (Vdd) 5212, Supply3 (Vss) 5213, and Supply4 (Vsssp) 5214 as shown in FIG. 14A. One or more of these units can be merged together in implementation or sub-divided further.

Multiple sub blocks of FIG. 14A can be merged together or eliminated as appropriate in various other embodiments of this invention. One, multiple or all functions of sub-blocks in FIG. 14A can be implemented one or many MOS transistors.

The fundamental design of the leakage reduction is embedded in each Boolean logic function gate with reduced leakage such that when connected to other functional cells designed with same or compatible technology, MOS transistors with high leakage in the cell receive negative gate-source voltage when they are not participating in output(s) transitions. This significantly reduces the leakage of High Speed (and high leakage) MOS transistors thereby drastically reducing the leakage current in the entire cell. Each cell performs its own leakage current reduction functions since all control and monitoring control, functions and mechanisms are contained in the cell. This technology may be known as "Reduced Leakage CMOS Logic" ("RLCL") technology and circuits designed with RLCL technology may be known as RLCL circuits.

In practice, the voltage on Supply1 (Vddsp=Vdd+Δv1) will be higher than the voltage on Supply2 (Vdd) by a value Δv1 where Δv1 is determined after careful analysis of leakage, speed and other design considerations by the implementation team at the time of IC implementation. In a typical modern semiconductor process Δv1 can be in range of 30 millivolts to 200 millivolts (my) (one millivolts is equal to 1/1000 of one VOLT). In slightly older such as 65 Nano Meter (nm) CMOS process technology Δv1 is expected to be in range of 200 millivolts. In currently available leading edge 28 nm process technology Δv1 is expected to be in range of 50 MILI VOLT to 100 MILI VOLT and in future 20 nm process technology Δv1 is expected to be lower voltage. Similarly, the voltage on Supply3 (Vss) 5213 is higher than voltage on Supply4 (Vsssp) by a value Δv2 where Δv2 is determined after careful analysis of leakage, speed and other design considerations by the implementation team at the time of IC implementation. Similar to Δv1, Δv2 can be in range of 30 MILI VOLT to 200 MILI VOLT (my) (one MILI VOLT is equal to 1/1000 of one VOLT). In slightly older such as 65 Nano Meter (nm) CMOS process technology Δv1 is expected to be in range of 200 MILI VOLT. In currently available leading edge 28 nm process technology Δv1 is expected to be in range of 50 MILI VOLT to 100 MILI VOLT and in future 20 nm process technology Δv1 is expected to be lower voltage. Δv1 and Δv2 may or may not be equal and there is no pre-determined limitation on values of Δv1 and Δv2. This voltage relationship is true for all notations where 4 supply rails (Supply1, Supply2, Supply3, Supply4, Vddsp, Vdd, Vss and Vsssp) are drawn or mentioned in this description or diagrams. This voltage relationship is also true for embodiments where only 3 supply rails may be implemented. Values of Δv1 and Δv2 mentioned here are only representative. Their range or values may be different if the IC implementation team would want to implement.

A family of logic function gates implemented with the RLCL technology may be known as "Reduced Leakage CMOS Logic" or "RLCL" family of logic gates and a library of these gates may be known as RLCL library. As in a standard cell library of CMOS logic family, the standard Cell library in RLCL logic family consists of many cells with many and various Boolean functionality and drive strength with added advantage of substantially reduced leakage current. The mechanism to reduce leakage is contained within each basic cell. When implemented in an IC, RLCL logic gates behave and perform mostly in the same way as a normal CMOS Boolean logic gates that are already in use in the industry.

Figure 14B:
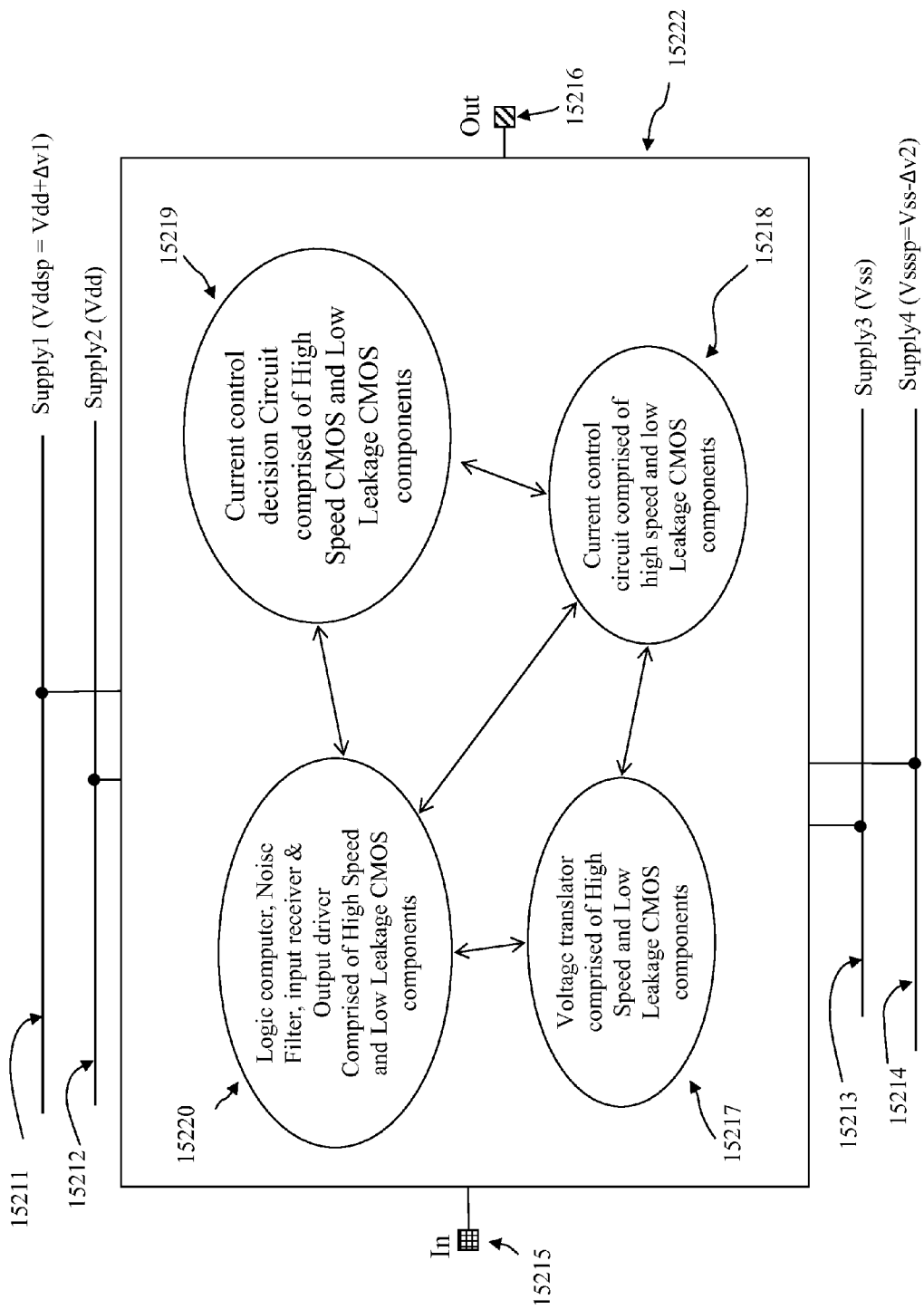
FIG. 14B-D are 3 different embodiments of implementation of the reduced leakage current device of FIG. 14A
Figure 14C:
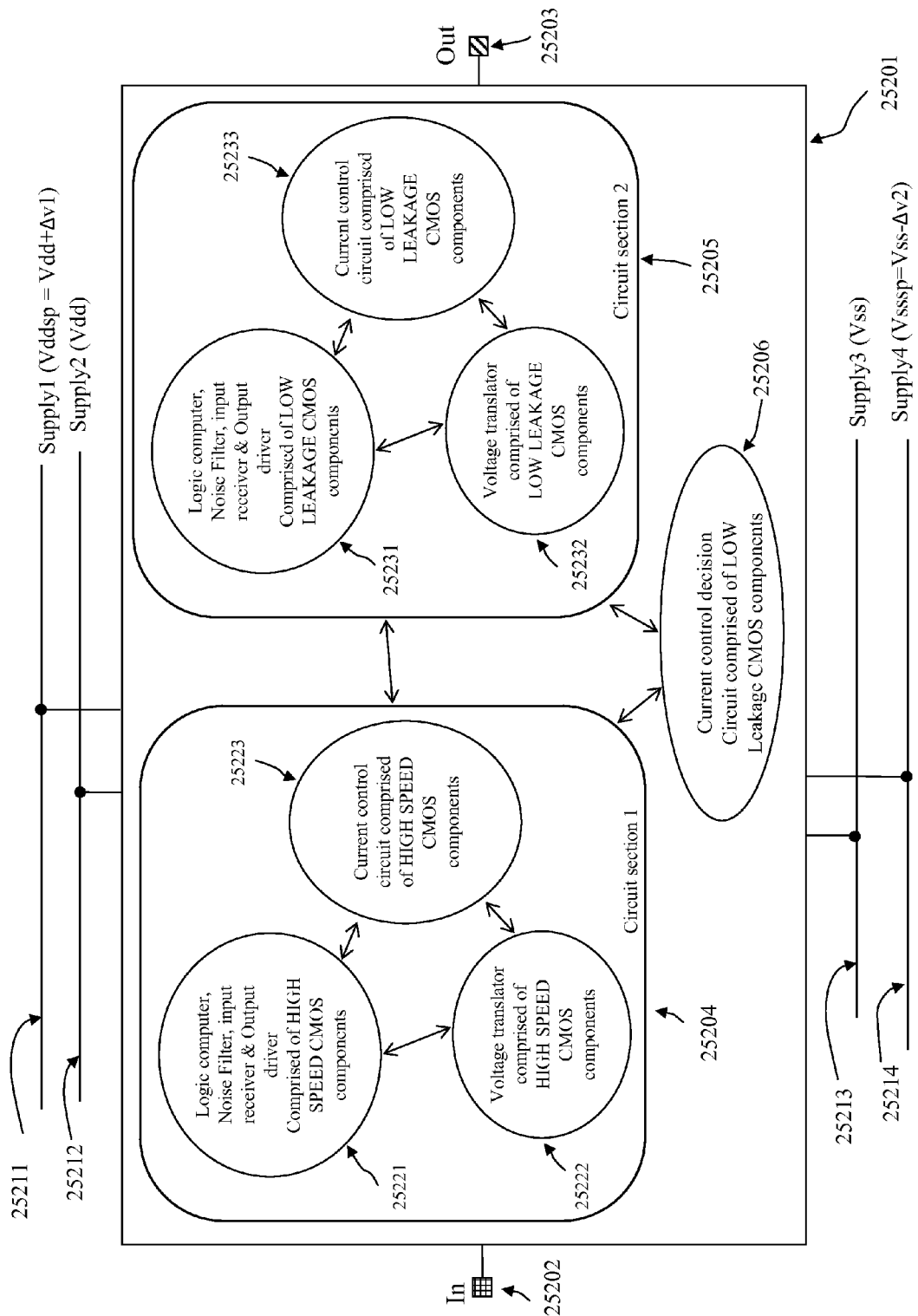
Figure 14D:
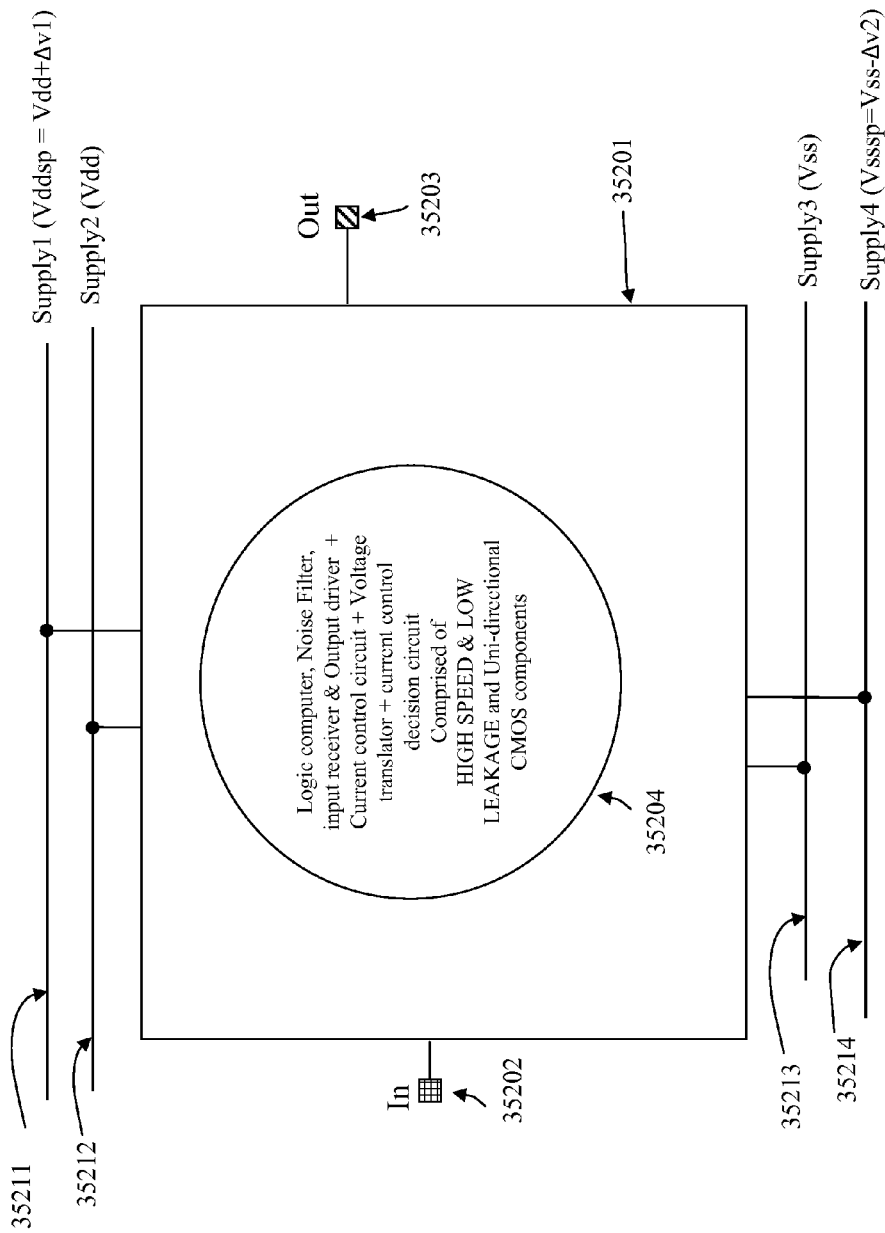

FIG. 14B, FIG. 14C and FIG. 14D show 3 different variations of implementation of reduced leakage current device of FIG. 14A. All of these implementations require 4 or 3 supply rails as described above. In one possible embodiment as shown in FIG. 14B each of 4 functionality "Logic computer, Noise filter, input receiver and output drive", "Voltage Translator", "Current control circuit" and "current control decision circuit" are comprised of both High Speed and Low Leakage CMOS components. In another embodiment as shown in FIG. 14C, each of three blocks "Logic computer, Noise filter, input receiver and output drive", "Voltage Translator" and "Current control circuit" are divided in two separate sections connected to each other and also connected to "current control decision circuit" wherein all circuit blocks in "Circuit section 1" 25204 are comprised of "HIGH SPEED" CMOS components while all circuit blocks in "Circuit section 2" 25205 are comprised of LOW LEAKAGE CMOS components while "Current control decision circuit" 25206 are comprised of LOW LEAKAGE CMOS components. In yet another embodiment, not shown in Figures, the "Current control decision circuit" 25206 of FIG. 14C is replaced by a "Current control decision circuit comprised of both HIGH SPEED and LOW LEAKAGE CMOS components". In yet another embodiment, not shown in Figures, the "Current control decision circuit" 25206 of FIG. 14C is replaced by a "Current control decision circuit comprised of only HIGH SPEED and CMOS components".

Yet another embodiment and variation of implementation of reduced leakage current device of FIG. 14A is represented in FIG. 14D where "Logic computer, Noise Filter, input receiver & Output driver", 'Current control circuit", "Voltage translator", and "'Current control decision circuit" are merged together and are comprised of a mix and a combination of HIGH SPEED, LOW LEAKAGE and Uni Directional CMOS components.

As described earlier HIGH SPEED CMOS transistors can be large CMOS transistors of any type or low Vt, standard Vt, intrinsic CMOS transistors. Similarly a LOW LEAKAGE CMOS transistor can be a small transistor of any type or High Vt, High voltage (thick oxide) CMOS transistors. Uni-directional CMOS transistors are special CMOS transistors as proposed in this invention. A Unidirectional PMOS transistor "UP" conducts current only from first diffusion node to second but never conducts current from second diffusion node to first. Similarly a unidirectional NMOS transistor "UN" also conducts current only from first diffusion node to second but never conducts current from second diffusion node to first. Except for this nature of uni-directional current flow "uni directional" CMOS transistors behave similar to standard CMOS transistors.

Figure 15:
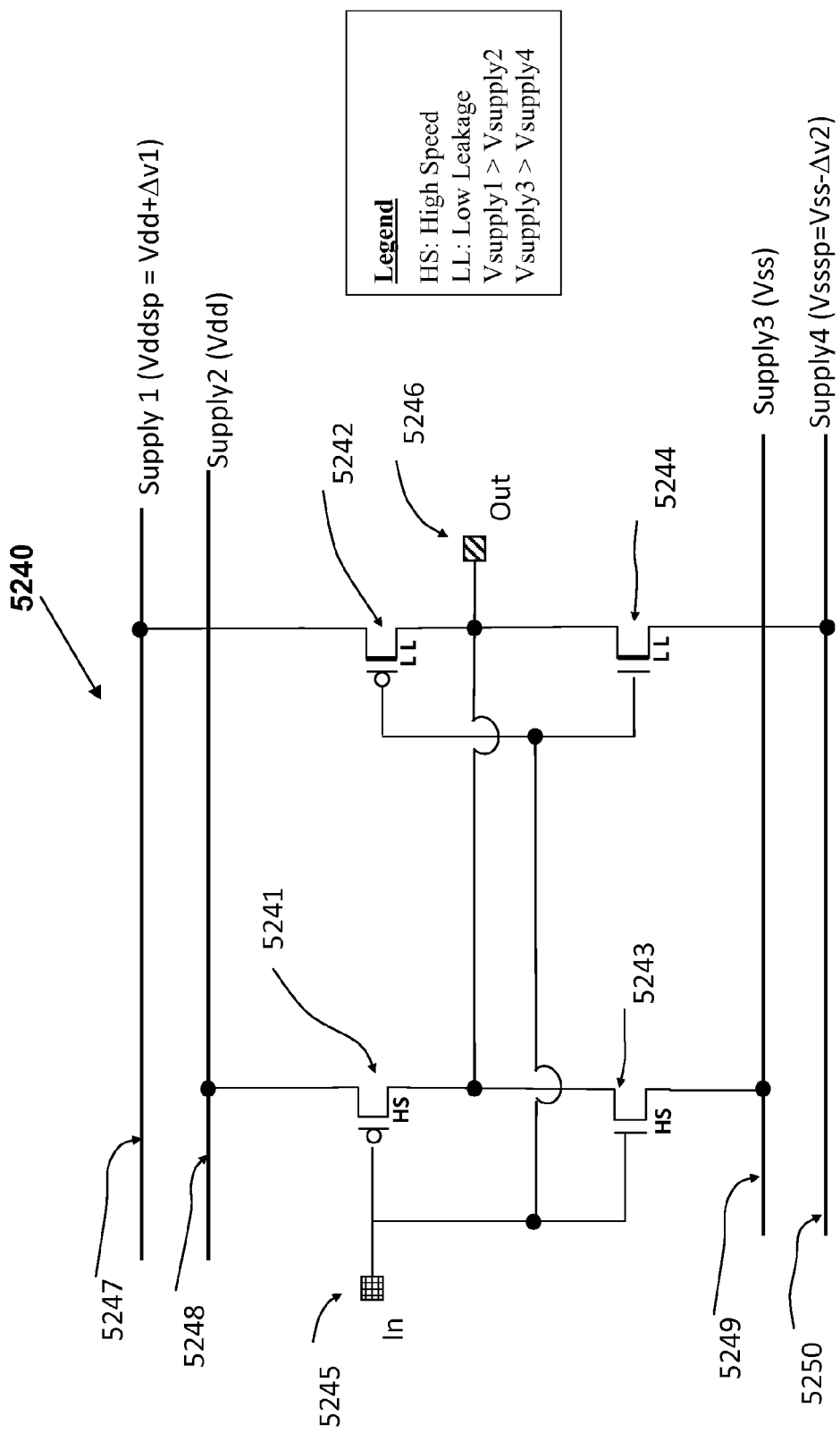
FIG. 15 illustrates an INVERTER with reduced leakage current.

FIG. 15 illustrates a reduced leakage current inverter 5240 that has MOS transistors. Transistor symbols are defined here that apply to all relevant symbols of MOS transistor relevant in this invention.

PMOS transistor Symbol with "HS" written under it means a HIGH SPEED PMOS Transistor (PMOS-HS)
NMOS transistor symbol with "HS" written under it means a HIGH SPEED NMOS Transistor (NMOS-HS)
PMOS transistor Symbol with "LL" written under it means a LOW LEAKAGE PMOS Transistor (PMOS-LL)
NMOS transistor symbol with LL written under it means a LOW LEAKAGE NMOS Transistor (NMOS-LL).

Any logic gate symbol with "HS" written in its body or under the symbol means the LOGIC gate consisting of HIGH SPEED MOS transistors.
Any logic gate symbol with "LL" written in its body or under the symbol means the LOGIC gate consisting of LOW LEAKAGE MOS transistors.

The PMOS-HS is a high speed (HS) PMOS transistor and NMOS-HS transistor is a high speed NMOS transistor. The PMOS-LL transistor is a Low Leakage PMOS transistor and NMOS-LL transistor is Low Leakage NMOS transistor. All modern semiconductor manufacturing houses (Semiconductor foundries) have these transistors as standard product offerings. Their use for various purposes is a standard practice in modern IC implementations including in some of the typical circuits described earlier. For example, high Speed MOS (PMOS or NMOS) can be "Low Threshold" (Low Vt), Standard Voltage Threshold (Standard Vt) or Native MOS transistor. Similarly the low leakage transistor can be High Threshold (High Vt) or High Voltage or Thick Oxide or Double Oxide transistor. Many known and well established manufacturing technologies are used to create High Speed and Low Leakage MOS transistors by Semiconductor foundries. As a general rule, a Low Leakage MOS transistor is a slow speed MOS transistor and conversely a High Speed MOS transistor is a High Leakage MOS transistor. Regardless of the manufacturing technologies used in semiconductor this leakage and speed relationship is true. This relationship is driven by the very science (Physics) that govern all behavior of MOS transistors and is a well known and practiced in semiconductor industry.

With reference to FIG. 15, inverter 5240 may have a PMOS-HS transistor (5241) and NMOS-HS transistor (5243) that are connected to each other (at their respective source and drains as shown) and to Supply2 (Vdd) line 5248 (the source of the PMOS transistor) and a Supply3 (Vss) line 5249 (the source of the NMOS transistor), respectively. These two MOS transistor are also connected to an input port 5245 and an output port 5246 of the inverter as shown in FIG. 15. This connection is similar to a classical CMOS inverter prevalent in Industry. The inverter of FIG. 15 may also have a PMOS-LL transistor (5242) and NMOS-LL transistor (5244) that are connected to each other (at their respective source and drains as shown), to the input port 5245 and to the output port 5246 as shown. Additionally, the PMOS-LL transistor and NMOS-LL transistor are connected to a Supply1 (Vddsp) line 5247 and a Supply4 (Vsssp) line 5250, respectively.

The PMOS-HS (5241) is a high speed (HS) PMOS transistor and NMOS-HS transistor (5243) is a high speed NMOS transistor. The PMOS-LL transistor (5242) is Low Leakage PMOS transistor and NMOS-LL transistor (5244) is Low Leakage NMOS transistor.

In RLCL technology, the advantages of Low Leakage and High Speed MOS transistors are combined together along with the circuit design technology of connectivity to mitigate or eliminate the shortcomings of speed and leakage. In particular, when the Input Port (5245) is driven to Logic High (to a voltage of Vddsp, and not to Vdd as will be clear from following paragraphs), the High Speed NMOS transistor 5243 and Low Leakage NMOS transistor 5244 are turned ON. The High Speed (but also high leakage) NMOS (5243) pulls down the output node 5246 with high speed assisted by Low Leakage but slow NMOS transistor (5244). However, the High Leakage (High Speed) NMOS 5243 pulls the output node 5246 down only to a voltage at Supply3 (Vss), but the Low Leakage NMOS transistor 5244 pulls the output port 5246 down to Supply4 (Vsssp) which is at a voltage $\Delta v2$ lower than Vss.

Similarly when the Input Port 5245 is driven to Logic LOW (to voltage of Vsssp, and not to Vss, as will be clear from following paragraphs), the High Speed PMOS transistor 5241 and Low Leakage PMOS transistor 5242 are turned ON. The High Speed (but also High Leakage) PMOS (5241) pulls up the output node 5246 with high speed, assisted by Low Leakage (but slow) PMOS transistor 5244. The High Speed (but also High Leakage) PMOS 5243 pulls the output node UP only to voltage at Supply2 (Vdd), while the Low Leakage PMOS transistor 5242 pulls the output port 5246 up to Supply1 (Vddsp) which is at a voltage $\Delta v1$ higher than Vdd. As clear from above, the output node thus swings from Vddsp to Vsssp and from Vsssp to Vddsp because of this special circuit arrangement.

As in all CMOS ICs, the output of this functional gate (INVERTER in this example) is connected to inputs of other CMOS function gates so that the inputs of all logic function gates connected to the output of this INVERTER will therefore transition from Vddsp to Vsssp and from Vsssp to Vddsp. Since, the input of this inverter is also driven by output of a similar CMOS gate with this exactly same voltage transition behavior, the input of this INVERTER will transition from Vddsp to Vsssp and from Vsssp to Vddsp.

As explained above, in operation, the input (5245) transitions between Vddsp and Vsssp. In steady state (after completion of the transition), the Input port (5245) is held at Vddsp or Vsssp. When the Input is LOGIC HIGH and at Vddsp, the gate-source voltage of High speed (and hence high leakage) PMOS transistor 5241 is negative because the source of this transistor is connected to Vdd (Supply 2). The negative gate-source voltage reduces the leakage current in this PMOS transistor significantly as per the leakage behavior explained earlier. The Gate-source Voltage of Low Leakage PMOS transistor 5242 is ZERO as in prevalent standard CMOS logic function gate. PMOS 5242 is a Low Leakage PMOS transistor by default and definition as provided by the semiconductor foundry, hence the leakage current in this transistor is very small by definition. Also, the PULL UP speed of this function gate is achieved by PULL UP current of PMOS 5241, therefore the size of LOW Leakage PMOS 5242 is small. Overall, because of small size and being a LOW LEAKAGE PMOS by definition, the leakage in PMOS 5242 is very small.

Similarly when the input port (5245) is LOGIC LOW and at Vsssp, the gate-source voltage of High speed (and hence high leakage) NMOS transistor 5243 is negative because the source of this transistor is connected to a Vss (Supply 3) thus drastically reducing the leakage current in this NMOS transistor. The Gate-source Voltage of Low Leakage NMOS transistor 5244 is ZERO as in prevalent standard CMOS logic function gate. But NMOS 5244 is a Low Leakage NMOS transistor by default and definition as provided by the semiconductor foundry, hence the leakage current in this transistor is very small. Also, the PULL DOWN speed of this function gate is achieved by PULL DOWN current in NMOS 5244, therefore the size of LOW Leakage NMOS 5244 is small. Overall, because of small size and being a LOW LEAKAGE NMOS by definition, the leakage in PMOS 5242 is very small.

In practice the size of Low Leakage PMOS 5242 and Low Leakage NMOS 5244 transistors are chosen by various standard design considerations such as leakage current, noise margin and speed etc.

As can be understood from above explanation, in this mechanism, the function of leakage reduction is caused by the voltage translation of the output port (5246) signal which is input to other logic function gates that results in negative voltage for the large and High Leakage (but high speed) MOS transistors (which are the main functional and speed provider for the logic function gate) thereby reducing leakage currents in these main transistors. Additionally the Low Leakage PMOS and NMOS transistors 5242 and 5244 provide assistance to the High Speed PMOS and NMOS transistors 5241 and 5243 respectively during output transitions. More importantly these LOW Leakage PMOS and NMOS transistors 5242 and 5244 pull the output node of the function gate to Vddsp and Vsssp respectively. Also these Low Leakage PMOS and NMOS transistors 5242 and 5244 do not hinder the logic and voltage operation of the logic functional gate in any way.

The use of dual MOS transistors to mitigate each others disadvantages in a functional gate in such a way that the output (or input) voltages get translated automatically to provide negative gate-source voltage to the High Leakage MOS transistors in this same gate or in the gate(s) to which the output is connected is one of the fundamental design principles for the leakage current reduction as per this invention.

The circuit presented in FIG. 15 has all 4 functions of FIG. 14A (5217, 5218, 5219 and 5220) embedded in these 4 transistors (5241, 5242, 5243 and 5244). The "Logic computer, Noise Filter, Input Receiver & Output Driver" (5220) function is performed by all PMOS and NMOS transistors combined. The "Voltage translator" function is performed by Low Leakage PMOS transistor 5242 and Low Leakage NMOS transistor 5244 along with their special connectivity to power supplies Vddsp and Vsssp respectively. The "Current control Circuit" 5218 function is performed by the special connectivity of High Speed PMOS and NMOS transistors 5241 and 5243 to Supply2 (Vdd) and Supply3 (Vss) respectively and by Low Leakage PMOS and NMOS transistors 5242 and 5244. During output transition large switching current flows through High Speed PMOS and NMOS transistors 5241 and 5243. Then output voltage is driven to Vddsp or Vsssp by Low Leakage PMOS and NMOS transistors 5242 and 5244 respectively. After the transition in input is completed the leakage current is controlled and significantly reduced in High Speed PMOS and NMOS transistors 5241 and 5343 due to negative gate-source voltage. The leakage currents in "Low Leakage" PMOS and NMOS transistors 5242 and 5244 are small by definition. It must be noted that the input voltage swing differential from Vdd and Vss is achieved by the voltage translation function in the logic cell that drives the input of this Logic functions cell and has same or compatible voltage translation mechanism for its output port. The "Current control decision Circuit" 5218 function is performed implicitly by the negative gate-source voltage biasing provided by the way power supply, inputs and outputs of logic cells are connected together.

Vddsp, Vdd, Vss and Vsssp are 4 separate power supply rails. These rails are generated for the whole IC or one or multiple blocks by one or multiple voltage regulator or other supply generator(s) that is either embedded in the same IC chip or is externally located. Generator ICs of such multiple supply rails are available as standard products in semiconductor industry. Multiple power supplies generated internally or externally in any IC is standard practice in semiconductor design and usage industry. Many supply generator ICs are available as standard products that can fulfill the requirements. Intellectual Property (IP) blocks with this functionality are available to be embedded inside an IC that can provide such power rails with or without minor modifications.

When the input port 5245 is at Logic HIGH (Vddsp), leakage currents in PMOS transistors 5241 and 5242 is significantly smaller than normal CMOS gate, but since both NMOS transistors 5243 and 5244 are ON, there is a short circuit current between Supply 3 and Supply 4 (Vss and Vsssp) through NMOS transistors 5243 and 5244. Similarly, when the Input port 5245 is at LOGIC LOW (Vsssp), the leakage currents in NMOS transistors 5243 and 5244 are significantly smaller than normal CMOS gates but since PMOS transistors 5241 and 5242 are both ON, there is a short circuit current between supply rails Supply1 (Vddsp) and Supply2 (Vdd). This embodiment is therefore buildable, but requires important chance in MOS transistor behavior through change in semiconductor process technology to function. This new (to be designed) MOS transistor would need to conduct current only in one direction (from drain to source for NMOS and source to drain for PMOS) and block current in other direction, in order for the INVERTER of FIG. 15 to function with substantially reduced Leakage Current but without short circuit current. Multiple viable process technologies may be used to design and manufacture such MOS transistors. But Development of such MOS transistor technology may take time and effort by the semiconductor industry before it can be commercially available readily. Viable process change to implement such special functionality transistors is detailed in later sections (FIGS. 22-25).

Hence, this invention uses alternative methods and design to overcome the current shortcomings of the circuit presented in FIG. 15, so that RLCL technology can be used with currently available MOS transistors in presently functioning semiconductor fabrication foundries. These methods have been explained in following sections.

Figure 16:
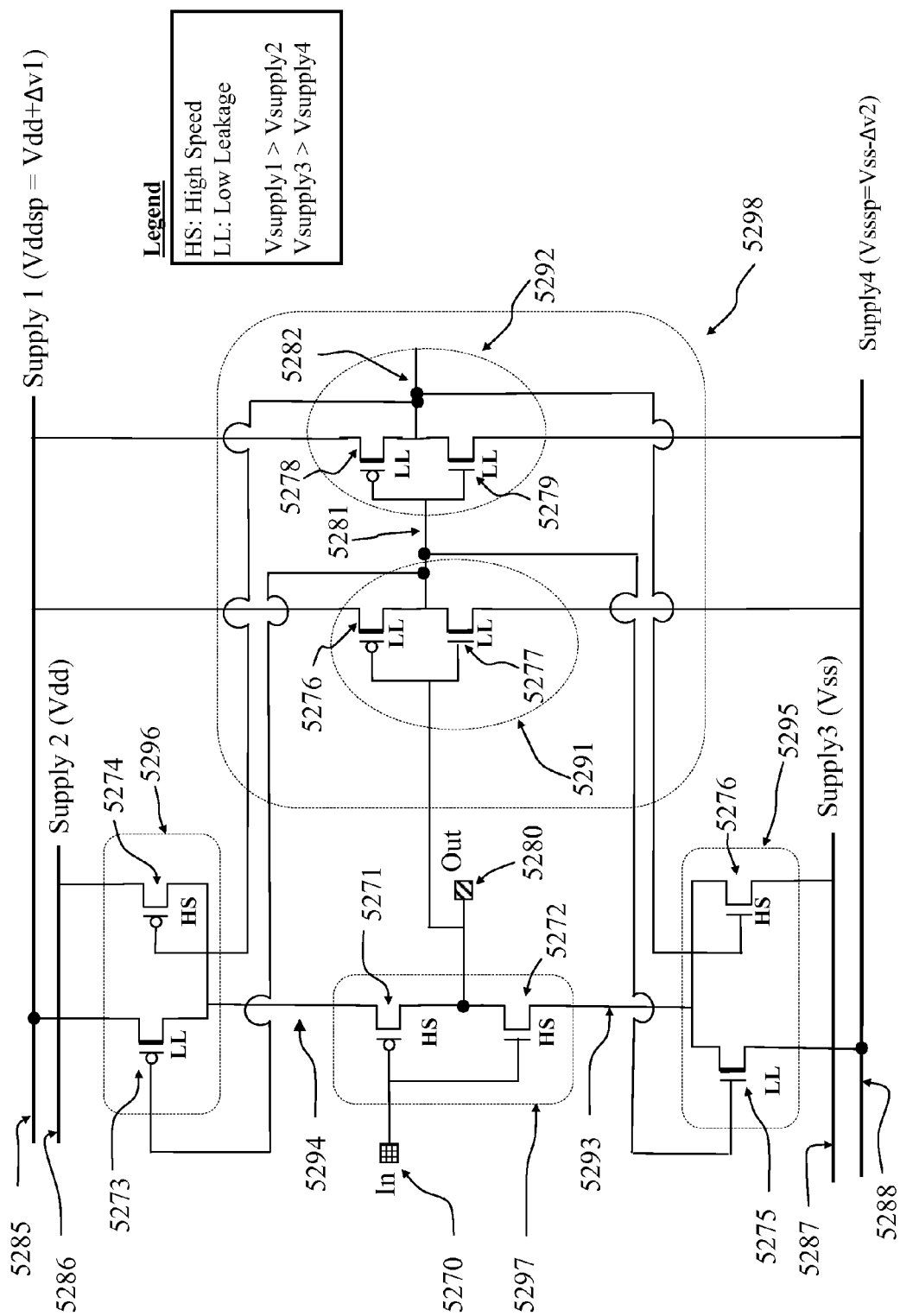
FIG. 16 illustrates another embodiment of inverter with the reduced leakage current.

FIG. 16 illustrates alternative MOS transistor level implementation of the reduced leakage current inverter. As in case of the inverter of FIG. 14A, in this embodiment also, there are four supply rails Supply1 (Vddsp), Supply2 (Vdd), Supply3 (Vss) and Supply4 (Vsssp) 5285-5288. These supply rails are exactly same as in FIG. 15 with same voltage and functional relationships. In this embodiment the main inverter function is performed by High Speed PMOS 5271 and High Speed NMOS 5272. As in case of the inverter of FIG. 15, an input port 5270 is driven by another RLCL circuit gate or compatible circuit component and transitions between Vddsp and Vsssp. Port "out" 5280 is the output of this RLCL inverter. The RLCL inverter gate further consists of a CMOS inverter 5291 that further consists of Low Leakage PMOS 5276 and Low Leakage NMOS 5277. The RLCL inverter further consists of a second CMOS inverter 5292 that further consists of Low Leakage PMOS 5278 and Low Leakage NMOS 5279. The input of Inverter 5291 is connected to the output port 5280 and its output 5281 is connected to the input of Inverter 5292 and to the gate of Low Leakage PMOS transistor 5273 and to the gate of Low Leakage NMOS transistor 5275. The output 5282 of Inverter 5292 is connected to the gates of High Speed PMOS 5274 and High speed NMOS 5276. The inverters 5291 and 5292 provide the functionality of "current control decision circuits" of FIG. 14A. The source node of High Speed PMOS 5274 is connected to Supply2 (Vdd), and source node of Low Leakage PMOS 5273 is connected to Supply1 (Vddsp). The drain nodes of both of these PMOS transistors 5273 and 5274 are connected together and also to the source node of High Speed PMOS 5271. Similarly the sources of High speed NMOS 5276 and Low Leakage NMOS 5275 are connected to Supply3 (Vss) and Supply4 (Vsssp) respectively. The drain nodes of the two NMOS transistors 5275 and 5276 are connected together and also to the source node of High Speed NMOS 5272. The drain nodes of High speed PMOS transistor 5271 and High Speed NMOS transistor 5272 are connected together and also to the output port 5280. The output port 5280 is the output of this INVERTER and the Input port 5270 is the input of this inverter.

Comparing RLCL INVERTER in FIG. 16 to the RLCL INVERTER in FIG. 15, it can be seen that Low Leakage PMOS 5273 of FIG. 16 is equivalent to Low Leakage PMOS 5242 of FIG. 15. Similarly Low Leakage NMOS 5275 in FIG. 16 is equivalent to the Low Leakage NMOS 5244 of FIG. 15. High Speed PMOS transistor 5271 of FIG. 16 is equivalent to High speed PMOS transistor 5241 of FIG. 15 and High Speed NMOS transistor 5272 of FIG. 16 is equivalent to High Speed NMOS transistor 5243 of FIG. 15. High speed PMOS and NMOS transistors 5274 and 5276 have been added to eliminate or reduce the short circuit current of the embodiment of RLCL INVERTER shown in FIG. 15. Inverters 5291 and 5292 provide the necessary sensing and control functionality for eliminating or reducing this short circuit current.

Even though, in the schematic in FIG. 16, the new RLCL INVERTER looks much larger and elaborate in size, the actual implementation is very comparable to the INVERTER in FIG. 15 because the sizes of all Low Leakage MOS transistors are very small. In an actual layout implementation, these small transistors are located in auxiliary cell areas that would otherwise have been wasted in a normal CMOS INVERTER implementation. Therefore the layout areas of RLCL function gates in RLCL library are comparable to the layout areas of equivalent NORMAL CMOS gate in a NORMAL CMOS library. After implementation the overall size of CMOS IC is NOT impacted significantly even with this transistor level complexity of an RLCL function gate. The INVERTER of FIG. 16 represents the most basic but complete, fully functional and self sufficient cell of the RLCL technology, RLCL circuit and RLCL library.

As in case of a NORMAL CMOS functional gate, only supply ports, input ports and output port(s) are visible and used by tools for chip implementation. Complex connectivity within the function gate is neither visible not used during chip (IC) implementation in RLCL technology as well as standard CMOS technology. This means RLCL logic gates are comparable to standard CMOS in ease of use in an IC.

With reference to FIG. 16, Input port 5270 transitions from Vddsp to Vsssp and from Vsssp to Vddsp and is driven by another RLCL circuit or RLCL compatible circuit component. This is exactly same as described for the inverter in FIG. 15.

When input port is LOGIC HIGH at voltage Vddsp, the Output port 5280 is driven to LOGIC LOW. The output of inverter 5291 (node 5281) is at LOGIC HIGH at voltage Vddsp and output 5282 of INVERTER 5292 is LOGIC LOW at voltage Vsssp. A LOGIC HIGH (Vddsp) at node 5281 causes the Low Leakage NMOS 5275 to be ON. The output port 5280 is thus discharged to the voltage of Vsssp through ON NMOS transistors 5272 and 5275. Thus LOGIC LOW voltage at output port 5280 is deterministically at voltage of Vsssp. A LOGIC LOW (Vsssp) at node 5282 causes High Speed NMOS 5276 to be OFF with its gate node driven to Vsssp. In this condition Low Leakage PMOS transistor 5273 is OFF since its gate node is driven by node 5281 (which is at voltage Vddsp). The High Speed PMOS transistor 5274 is ON since its gate node is driven by node 5282 (which is at Vsssp). This causes the voltage on node 5294 to be Vdd (not Vddsp) which is also the source node for High Speed PMOS transistor 5271. Since the INPUT port is LOGIC HIGH at voltage Vddsp, the PMOS transistor 5271 has its gate node at higher voltage than the source voltage. This is a negative gate-source voltage for High Speed PMOS 5271, which not only causes the pull up path from output port 5280 to be cut off from supply lines Vddsp and Vdd but also significantly reduces the leakage in High Speed PMOS 5271. In this way the RLCL inverter of FIG. 16 has its pull down path deterministically driven to be Vsssp and significantly small leakage current in PULL UP path.

However, there is a secondary effect of this method and connectivity which is important to understand and analyze. In this condition (when input is at LOGIC HIGH at Vddsp, output port is driven to Vsssp, node 5281 is at Vddsp, and node 5282 is Vsssp), when the output port 5280 is driven to Vsssp, the middle node 5293 is also driven to Vsssp through ON NMOS transistor 5272. This node then becomes the source node for HIGH Speed NMOS 5276. The gate node of High Speed NMOS 5276 is also at Vsssp. Other diffusion terminal of this High Speed NMOS 5276 that is connected to Vss now becomes the drain node of High Speed NMOS transistor 5276 because it is at higher voltage than node 5293. Thus High Speed NMOS 5276 has ZERO gate-source voltage and not a negative gate-source voltage. Therefore, potentially it may have leakage current (since it is a high leakage MOS transistor). But the High Speed NMOS 5276 doesn't have high leakage current. Since the source node of High Speed NMOS 5276 is at voltage Vsssp and the drain node is at voltage Vss, the voltage differential between drain and source terminals is only $\Delta v2$. In practice this differential voltage ($\Delta v2$) is an order of magnitude smaller than the normal voltage on Vdd, the drain source voltage of this High Speed OFF NMOS (5276) is an order of magnitude lower than the OFF MOS transistor in a normal CMOS logic circuit. According to the leakage property of MOS transistors where the leakage current is proportional to the drain-source voltage, because of this very small source-drain voltage the Leakage current of this OFF NMOS 5276 is substantially smaller than an OFF NMOS of a normal CMOS function gate.

Thus when input port 5270 is LOGIC HIGH at voltage Vddsp, due to negative gate-source voltage in High Speed PMOS 5271, and very small drain-source voltage of High Speed NMOS 5276, RLCL inverter of FIG. 16 has substantially reduced leakage current as compared to a NORMAL CMOS circuit in this steady state. Also it has substantially small short circuit current unlike the RLCL inverter of FIG. 15.

All other OFF MOS transistors are LOW LEAKAGE and small MOS transistors in size and hence they have substantially low leakage currents by definition.

Similarly, when input port is LOGIC LOW at voltage Vsssp, the Output port 5280 is driven to LOGIC HIGH at voltage Vddsp. The output of inverter 5291 (node 5281) is at LOGIC LOW at voltage Vsssp and output 5282 of INVERTER 5292 is LOGIC HIGH at voltage Vddsp. A LOGIC LOW (Vsssp) at node 5281 causes the Low Leakage PMOS 5273 to be ON. The output port 5280 is thus charged to Vddsp through ON PMOS transistors 5271 and 5273. Thus LOGIC HIGH voltage at output port 5280 is deterministically at voltage of Vddsp. A LOGIC HIGH (Vddsp) at node 5282 causes High Speed PMOS 5274 to be OFF with its gate node driven to Vddsp. In this condition Low Leakage NMOS transistor 5275 is OFF since its gate node is driven by node 5281 (which is at voltage Vsssp). The High Speed NMOS transistor 5276 is ON since its gate node is driven by node 5282 (which is at Vddsp). This causes the voltage on node 5293 to be Vss (not Vsssp) which is also the source node for High Speed NMOS transistor 5272. Since the INPUT port is LOGIC LOW at voltage Vsssp, the NMOS transistor 5272 has its gate node at lower voltage than the source voltage (which is Vss). This is a negative gate-source voltage for High Speed NMOS 5272, which not only causes the pull down path from output port 5280 to be cut off from supply lines Vsssp and Vss but also significantly reduces the leakage in High Speed NMOS 5272. In this way the RLCL inverter of FIG. 16 has its pull up path deterministically driven to be Vddsp and significantly small leakage current in PULL DOWN path.

Similar to the case when INPUT port 5270 was at LOGIC HIGH (Vddsp), there is a secondary effect of leakage in this method and connectivity. In this condition (input is at LOGIC LOW at Vsssp, output port is driven to Vddsp, node 5281 is at Vsssp, and node 5282 is Vddsp), when the output port 5280 is driven to Vddsp, the middle node 5294 is also driven to Vddsp through ON PMOS transistor 5271. This node then becomes the source node for HIGH Speed PMOS 5274. The gate node of High Speed PMOS 5274 is also at Vddsp. Other diffusion terminal which now drain of High Speed PMOS transistor 5274 is now connected to Vdd. Thus High Speed PMOS 5274 has ZERO gate-source voltage (not a negative gate-source voltage). Therefore, potentially it may have leakage current (since it is a high leakage MOS transistor). But the High Speed PMOS 5274 doesn't have high leakage current. Since the source node of High Speed PMOS 5274 is at voltage Vddsp and the drain node is at voltage Vdd, the voltage differential between drain and source terminals is only $\Delta v1$. In practice this differential voltage ($\Delta v1$) is almost an order of magnitude smaller than the normal voltage differential of Vdd. Thus the drain source voltage of this High Speed OFF PMOS (5274) is an order of magnitude smaller than the OFF MOS transistor in a normal CMOS logic circuit. According to the leakage property of MOS transistors where the leakage current is proportional to the drain-source voltage, because of this very small source-drain voltage the Leakage current of this OFF PMOS 5274 is substantially smaller than an OFF NMOS of a normal CMOS function gate.

Thus when input port 5270 is LOGIC LOW at voltage Vsssp, due to negative gate-source voltage in High Speed NMOS 5272, and very small drain-source voltage of High Speed PMOS 5274, RLCL inverter of FIG. 16 has substantially smaller leakage current as compared to a normal CMOS circuit in this steady state. Also it has substantially smaller short circuit current unlike the RLCL inverter of FIG. 15.

All other OFF MOS transistors are LOW LEAKAGE and small MOS transistors and hence they have substantially low leakage currents by definition.

During transition, the INVERTER of FIG. 16 behaves differently.

While in steady state, Low Leakage MOS transistors provide deterministic logic state to the output port in response to the input logic state, and also a mechanism for reduce leakage, these two behaviors alone are not sufficient for this inverter to be used commercially. A logic function gate needs to compute fast and transition its output quickly in response to appropriate change(s) in the inputs. High Speed of transition of output port when required is a critical and important requirement in practical ICs.

In RLCL technology the transition speed performance is provided by High Speed MOS transistors but the leakage in high speed transistors is reduced substantially by use of active designs and methods High speed operation of RLCL inverter is explained again with FIG. 16.

When Input port 5270 is at LOGIC LOW (at voltage Vsssp), the output port 5280 is charged to Vddsp through ON PMOS transistors 5273 and 5271. The High Speed NMOS transistor 5276 is ON. Node 5293 is discharged to Vss. The HIGH Speed NMOS transistor 5272 is OFF. In this state this inverter is ready for a transition in the output whenever input changes. This steady state can be present for long time but the inverter has substantially reduced leakage current in this steady state as explained earlier. It must be noticed that again that node 5293 is at Vss in this state.

When the INPUT transitions from LOGIC LOW (Vsssp) to LOGIC HIGH (Vddsp), High Speed NMOS transistor 5272 turns ON (from OFF) and High speed PMOS transistor (5271) turns OFF (from ON). Since node 5293 was already discharged to Vss, the output port 5280 starts discharging to Vss by PULL DOWN current through High Speed NMOS transistors 5272 and 5276 as soon as input transitions HIGH. High Speed PMOS 5271 turns OFF as High Speed NMOS 5272 turns ON. OFF PMOS transistor 5271 cuts OFF the pull up current path of output port. The output port discharge continues through High Speed NMOS transistors 5272 and 5276. Once the output port 5280 crosses the LOGIC THRESHOLD level of inverter 5291 (which is approximately half way between Vddsp and Vsssp because of normal functional nature of a CMOS gate), the output of this INVERTER (5291) transitions from LOGIC LOW to LOGIC HIGH (Vsssp to Vddsp). This switches ON the Low Leakage NMOS 5275 which provides the PULL DOWN current path to Vsssp. Logic Transition at node 5281 causes the logic transition in the output of inverter 5292 from LOGIC HIGH to LOGIC LOW (at Vsssp). This causes the High Speed NMOS 5276 to turn OFF thus eliminating the short between Vss and Vsssp. By the time High Speed NMOS transistor 5276 turns OFF the output port has already made transition to LOGIC LOW. This behavior is guaranteed because the event of switching OFF of High Speed NMOS 5276 starts only after the output port 5280 has already transitioned to LOGIC LOW. Also there is ample time difference between the events of output port 5280 making transition to LOGIC LOW and High Speed NMOS transistor 5276 switching OFF. In effect, the speed of transition to LOGIC LOW at output port of this gate is caused by PULL DOWN current through high Speed NMOS transistors 5272 and 5276. After High Speed NMOS transistor 5276 is turned OFF, the discharge current through Low Leakage NMOS transistor 5275 and High Speed NMOS transistor 5272 discharges output port 5280 to lower voltage Vsssp and keeps it there in steady state till the input(s) change again to cause the output transition in opposite direction.

This steady state is already described in paragraphs above where the logic gate waits for transition again, with substantially reduced leakage and substantially small short circuit current.

Similarly the transition of input port 5270 from LOGIC HIGH to LOGIC LOW (from Vddsp to Vsssp) causes PULL UP current from Vdd to output port 5280 through High Speed PMOS transistors 5274 and 5271 providing fast transition time. Then the output port 5280 is pull up to Vddsp through Low Leakage PMOS transistor 5273 and High Speed PMOS transistor 5271 for holding a LOGIC HIGH at output port 5280 in steady state at Vddsp as explained below.

When Input port 5270 is at LOGIC HIGH (at voltage Vddsp) in steady state, the output port is discharged to Vsssp through ON NMOS transistors 5272 and 5275. The High Speed PMOS transistor 5274 is ON charging the node 5294 to Vdd.

Now the INPUT 5270 transitions from LOGIC HIGH (Vddsp) to LOGIC LOW (Vsssp), High Speed PMOS transistor 5271 turns ON (from OFF) and High speed NMOS transistor (5272) turns OFF (from ON). Since node 5294 was already charged to Vdd, the output port 5280 starts charging to Vdd by PULL UP current through High Speed PMOS transistors 5271 and 5274 as soon as input transitions LOW. High Speed NMOS 5272 turns OFF as High Speed PMOS 5271 turns ON. The NMOS transistor 5271 that is turning OFF cuts OFF the pull down current path of output port 5280. The output port charging continues through High Speed PMOS transistors 5271 and 5274. Once the output port crosses the LOGIC THRESHOLD level of inverter 5291 (which is approximately half way between Vddsp and Vsssp because of normal functional nature of a CMOS INVERTER), the output of this INVERTER (5291) transitions from LOGIC HIGH to LOGIC LOW (Vddsp to Vsssp). This switches ON the Low Leakage PMOS 5273 which provides the PULL UP current path to Vddsp. This Logic transition at node 5281 causes the logic transition on the output of inverter 5292 from LOGIC LOW to LOGIC HIGH, pulling the node 5282 up to Vddsp. LOGIC HIGH (Vddsp) at node 5282 turns OFF PMOS 5274 thus eliminating the short between Vdd and Vddsp. By the time High Speed PMOS transistor 5274 turns OFF the output port has already made transition to LOGIC HIGH. This behavior is guaranteed because the event of switching OFF of High Speed PMOS 5274 starts only after the output port 5280 has already crossed the threshold of the transition to LOGIC HIGH. Again, there is ample time difference between the events of output port 5280 making transition to LOGIC HIGH and High Speed PMOS transistor 5274 switching OFF. In effect the transition to LOGIC HIGH at output port 5280 is caused by PULL UP currents through high Speed PMOS transistors 5271 and 5274. Once the High Speed PMOS transistor 5274 is OFF, the pull up current through PMOS transistors 5271 and 5273 charges the output port 5280 to higher voltage Vddsp and keeps it there in steady state till the input(s) change again to cause an output transition in opposite direction.

This steady state is also already described in above paragraphs.

An RLCL logic gate thus uses high speed MOS transistors to achieve high speed performance, low leakage MOS transistors to maintain voltage at the output port, voltage translation of the output port through its connectivity and design, low leakage MOS transistors to recognize transition behavior and provide necessary control signals to various portions of design that help logic transition and leakage reduction and deterministic voltage supply rails along with active circuit design methods and connections to achieve leakage reduction through negative gate-source voltage and substantially reduced source drain voltage in transistors that have tendency of high leakage current in a standard CMOS design. Additionally all these features and functionalities are contained within a basic cell in this technology. These basic individual cells are fully compatible with each other with the same simplicity and ease as that of a normal CMOS circuit cells (or logic gates) currently used in semiconductor industry.

A designer has the freedom to adjust voltage differences between Vdd and Vddsp and Vss and Vsssp ($\Delta v1$ and $\Delta v2$), choice of MOS transistor for Low Leakage and High Speed MOS devices to adjust and achieve desired speed, leakage, area and power of the IC. These choices are similar to the choices that an engineer needs to make in using a non-RLCL (or normal CMOS) circuit gates. As described above, $\Delta v1$ and $\Delta v2$ can be in range of 20 mili Volts (mV) to 200 mili Volt (mv) or little more depending on the fabrication process node chosen for the IC being implemented. High Speed NMOS and PMOS transistor sizes will be chosen according to the required drive strength and speed as is commonly done in a normal CMOS circuit design. Sizes of Low Leakage MOS transistors are expected to be minimum allowed by the process geometry or slightly higher to eliminate any coupling noise issues. However, for various leakage and speed tradeoff the ratio of sizes of different transistors can be varied, using normal engineering expertise, common in semiconductor industry.

The methods used for choosing sizes and voltage used in RLCL technology are not unusual. They are same as the ones currently used by people adept in the art of CMOS circuit design.

The general construction of RLCL circuits that use output port to generate various control signals can be divided in standard sub-blocks or sections of functionality as shown in FIG. 16. Basic construction blocks as shown in FIG. 14A can be recognized in the transistor level implementation of the INVERTER of FIG. 16. For example, in FIG. 16, blocks 5295 and block 5296 and components inside these blocks together correspond to "Current Control Circuit" 5218 of FIG. 14A. Similarly block 5298 from FIG. 16 and components within this block correspond to "Current control decision circuit" (5219) of FIG. 14A. Blocks 5297, 5296 and 5295 of FIG. 16 and components within these blocks together correspond to "Logic Computer, Noise Filter, Input receiver and output driver" 5220 of FIG. 14A. Part of blocks 5295 and 5296 in FIG. 16 along with components from block 5298 correspond to "voltage translator" 5217 of FIG. 14A.

Figure 17:
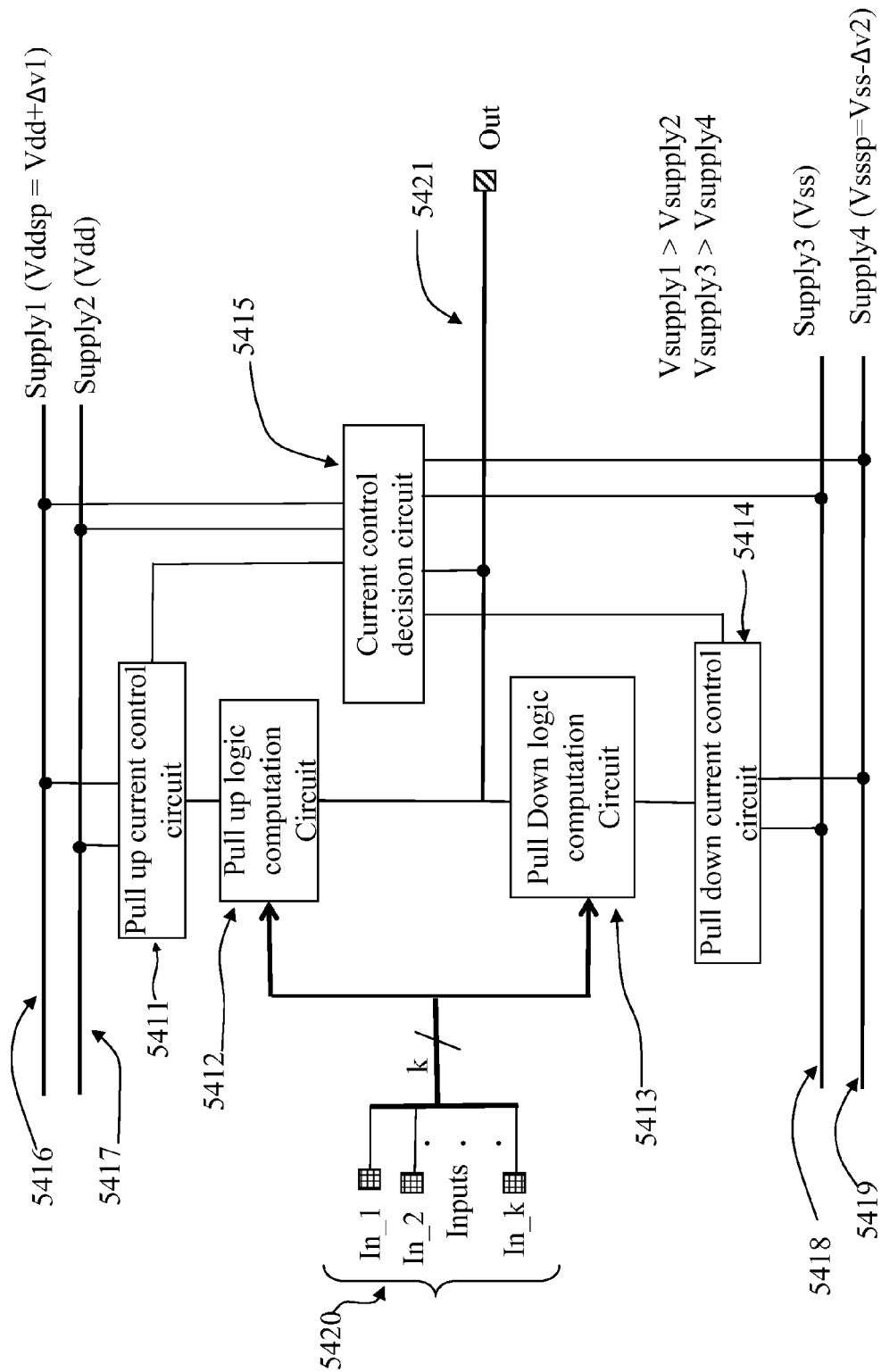
FIG. 17 illustrates a detailed block diagram level implementation of the general circuit illustrated in FIG. 14A.

FIG. 17 illustrates a block diagram level implementation of the circuit in FIG. 14A and general construction of one embodiment of RLCL function gates. As shown in FIG. 17, the "current control decision circuit" 5415 is connected to the output port 5241 of the logic function gate. Any basic functional gates in RLCL technology (or RLCL circuit blocks) have one output port and one or many Input ports as shown in FIG. 17. Any functional gate with more than one output ports are constructed by combining two or more basic logic gates. This same property exists in a standard and normal CMOS circuit gates currently used in industry.

FIG. 17 represents a general and expanded block level construction of a logic gate using RLCL technology where "current control decision circuit" uses output port of the functional gate for its recognition, monitoring and control functionalities.

Other type of RLCL circuits are ones that do not use output port to generate control signals for monitoring and controlling switching and leakage behavior of the circuit. These are discussed later.

As shown in FIG. 17, "Logic Computer, Noise Filter, Input receiver and output driver" block 5220 of FIG. 14A is divided in two parts "Pull up logic computation circuit" 5412 and "Pull down logic computation circuit" 5413. Similarly, the "current control" block 5218 of FIG. 14A is divided into two separate blocks "Pull up current control circuit" 5411, and "Pull down current control circuit" 5414. Input ports 5420 are one or multiple input ports connected to "Pull UP Logic Computation Circuit" (5412) and "Pull down computation circuit (5413)". In Addition to inputs 5420, "Pull up logic computation circuit" 5412 is connected to "Pull up current control Circuit" 5411, output port 5421 and "Pull down logic computation Circuit" 5413. Similarly, "Pull down logic computation circuit" 5413 is connected to input(s) 5420, "Pull Down current control Circuit" 5414, output port 5421 and "Pull up logic computation Circuit" 5412. The "Pull up current control circuit" 5411 is connected to Supply rails "Supply1" (Vddsp) 5416 and Supply2 (Vdd) 5417 and to the "Current control decision circuit" 5415 and "Pull up logic computation circuit" 5412. "Pull down current control circuit" 5414 is connected to Supply rails "Supply3" (Vss) 5418 and Supply4 (Vsssp) 5419 and to the "Current control decision circuit" 5415 and "Pull down logic computation circuit" 5413. The "Current Control Decision Circuit" 5415 is connected to "Pull up current control circuit" 5411, "Pull Down current control circuit" 5414, output port 5421 and power supply rails Supply1 5416, Supply2 5417, Supply3 5418 and Supply4 5419. Any of the functional blocks 5411, 5412, 5413, 5414 and 5415 may be connected to all Supply rails Supply1 5416, Supply2 5417, Supply3 5418, Supply4 5419 or any one or multiple of them.

FIG. 17 represents a block level construction of any RLCL logic function gate. As already described in paragraphs above, FIG. 16 is transistor level implementation of the simplest RLCL logic function gate-an INVERTER according to the circuit scheme presented in more abstract form in FIG. 17. "Pull up logic computation circuit" 5412 of FIG. 17 is represented by a single PMOS transistor 5271 in FIG. 16. The "Pull down logic computation circuit" 5413 of FIG. 17 is represented by a single NMOS transistor 5272 in FIG. 16. "Pull Down current control circuit" 5414 in FIG. 17 is represented by block 5295 in FIG. 16. The "Pull up current control circuit" 5411 of FIG. 17 is represented by block 5296 in FIG. 16. "Current control decision circuit" 5415 of FIG. 17 is represented by block 5298 in FIG. 16.

More complex logic function gates are also constructed using the scheme presented in FIG. 17 making small modification without deviating from the main principles and working of circuit presented in FIG. 17.

Figure 18:
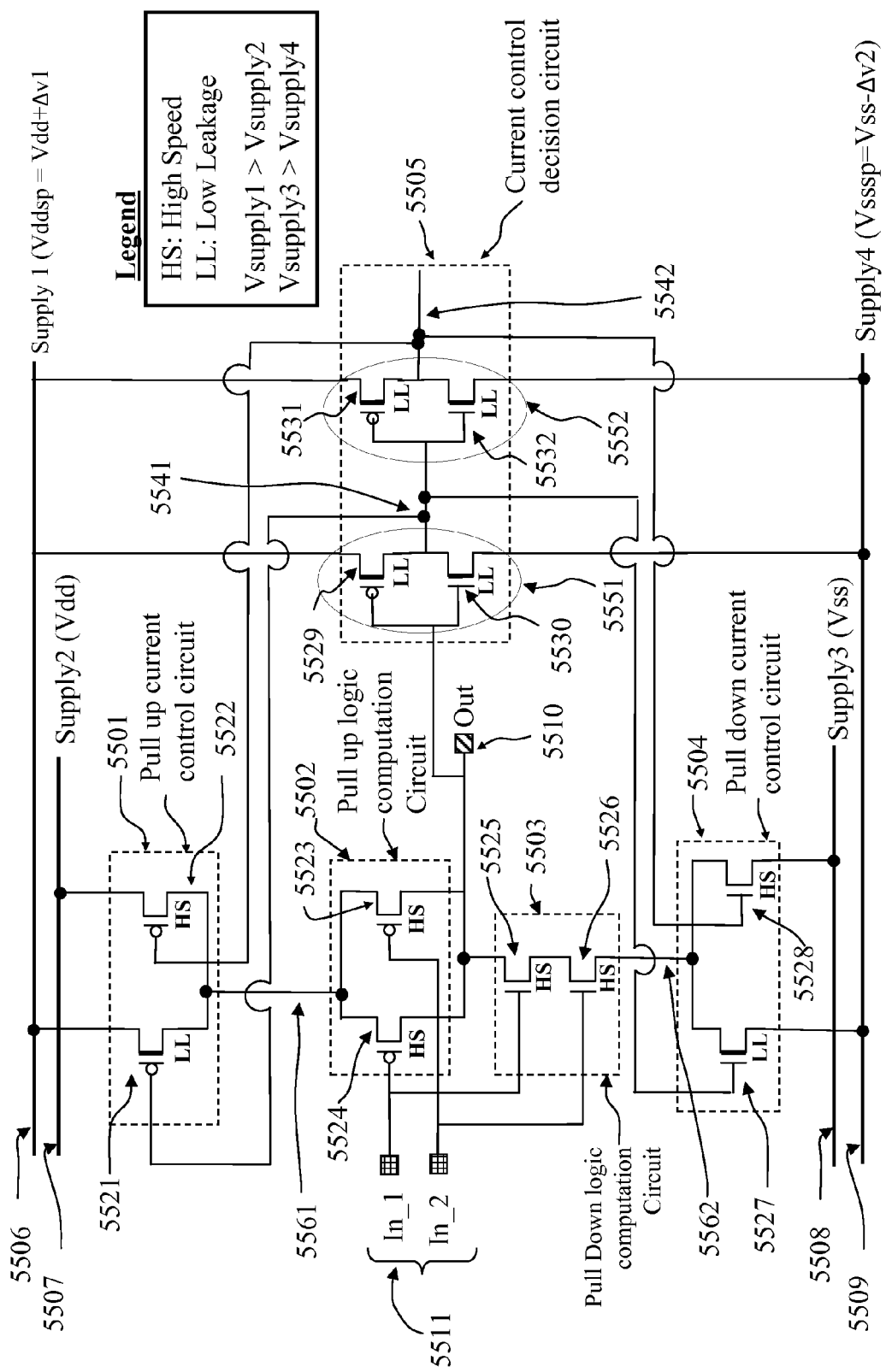
FIG. 18 is transistor level implementation of a NAND2 gate with reduced leakage current devices according to FIG. 17.

FIG. 18 shows transistor level implementation of a NAND2 function gate with RLCL technology using the general scheme shown in FIG. 17. NAND2 is a 2 input NAND function defined in a NORMAL BOOLEAN Logic Function such that its it has two LOGIC INPUTS and its output is at LOGIC LOW only when both inputs are at LOGIC HIGH. Otherwise output is at LOGIC HIGH in all other conditions and combination of INPUT states. In comparing FIG. 18 with FIG. 16, "Pull up current control circuit" 5501, "Pull down current control circuit" 5504 and "current control decision circuit" 5505 in FIG. 18 are same as in RLCL INVERTER of FIG. 16. However, the "Pull up logic computation circuit" 5502 and "Pull down logic computation circuit" 5503 are different from the RLCL INVERTER shown in FIG. 16, because of change in functionality. As in case of INVERTER in FIG. 16, high speed logic transition on output 5510 of the NAND2 in FIG. 18 is facilitated by current through High Speed MOS transistors and output is held at steady state at Vddsp or Vsssp by Low Leakage MOS transistors.

As mentioned above, the NAND2 is a 2 input Boolean NAND function where NAND is "NOT OF AND" defined by a Boolean binary function such that the output is at LOGIC LOW only when both INPUT ports are at LOGIC HIGH. In all other combinations of input (such as INPUT_1 (In_1) at LOGIC HIGH and INPUT_2 (In_2) at LOGIC LOW or INPUT_1 (In_1) at LOGIC LOW and INPUT_2 (In_2) at LOGIC HIGH or INPUT_1 (In_1) and INPUT_2 (In_2) both at LOGIC LOW) the output is at LOGIC HIGH.

Various currents and voltages in this NAND2 function gate behave in similar ways as in the INVERTER of FIG. 16. As in case of the RLCL INVERTER of FIG. 16, the input ports of RLCL NAND2 function gate as shown in FIG. 18 also transition between Vddsp and Vsssp. In one steady state condition, when both the inputs In_1 and In_2 (5511) are LOGIC HIGH at Vddsp, High Speed PMOS transistors 5523 and 5524 are OFF while High Speed NMOS transistors 5525 and 5526 are ON. Output port "out" 5510 is at LOGIC LOW. Since node 5510 is input to the Low Leakage inverter 5551 consisting of Low Leakage PMOS and NMOS transistors 5529 and 5530, its out output node 5541 is LOGIC HIGH at Vddsp. Node 5541 is also the input for Low Leakage inverter 5552 consisting of Low Leakage PMOS and NMOS transistors 5531 and 5532 respectively, the output of this inverter node 5542 is LOGIC LOW at Vsssp. As shown in FIG. 18, node 5541 drives the gate nodes of Low Leakage PMOS 5521 and Low Leakage NMOS 5527. Node 5542 drives gate nodes of High Speed PMOS 5522 and High Speed NMOS 5528. In this steady state because node 5541 is at LOGIC HIGH (Vddsp) and node 5542 is at LOGIC LOW (Vsssp), Low Leakage NMOS 5527 is ON while High Speed NMOS 5528 is OFF. Output port 5510 is therefore discharged to Vsssp through ON NMOS transistors 5525, 5526 and 5527 in series. It can be understood by people adept in the ART of CMOS circuit design that there is no other possible state of output port 5510 than to be at Voltage Vsssp in steady state when inputs In_1 and In_2 both are at LOGIC HIGH at Vddsp.

In this state the High Speed PMOS transistor 5522 is ON and Low Leakage PMOS transistor 5521 is OFF. Because of this, the middle node 5561 is charged to Vdd (not Vddsp). Node 5561 is also the source node for High speed PMOS transistors 5523 and 5524. The gate nodes of High Speed PMOS transistors 5524 and 5523 are at Vddsp since they are connected to input ports In_1 and In_2. Thus these two high speed PMOS transistors 5524 and 5523 have negative gate source voltage which means they have substantially reduced leakage current when they are OFF in this steady state. ON High Speed PMOS transistor 5522 in this state also means that this gate is ready for an output transition to LOGIC HIGH quickly whenever appropriate input transitions occur.

In this steady state the short circuit current control between Low Leakage NMOS transistor 5527 and High Speed NMOS transistor 5528 happen in exactly same way as the RLCL invert of FIG. 16. Since Low Leakage NMOS 5527 is ON because its gate is driven to Vddsp by node 5541, middle node 5562 is pulled down to Vsssp. This means node 5562 serves as a source node for High Speed NMOS 5528. The gate of this High Speed NMOS 5528 is at Vsssp as driven by node 5542. Thus this High Speed NMOS 5528 has ZERO (not negative) gate-source voltage. However, the voltage difference between drain and source of this High Speed NMOS 5528 is only $\Delta v2$ which in practice is an order of magnitude smaller than Vdd. Therefore the source-drain voltage of this OFF High Speed NMOS is very small which results in significantly lower leakage current as explained in the property of MOS transistor and hence significantly smaller short circuit current between Vss and Vsssp.

If any or both of the input ports 5511 (In_1 or In_2) transition to LOGIC Low at voltage Vsssp, the PULL UP current path from Vdd or Vddsp to output port 5510 starts conducting current while the PULL DOWN path from output port 5510 to Vss or Vsssp is cut off. Thus in steady state when one or both of the input ports In_1 or In_2 are at Logic Low, the output port 5510 is at Logic HIGH. In this case output of inverter 5551 is LOGIC LOW at Vsssp and output of inverter 5552 is LOGIC HIGH at Vddsp. This will cause Low Leakage PMOS 5521 to be ON and High Speed PMOS transistor 5522 to be OFF. Output port 5510 is therefore charged to Vddsp through PULL up current through ON Low Leakage PMOS 5521 and one or both of the ON High Speed PMOS transistors 5523 and 5524. The Pull down path from output to Vss/Vsssp is cut OFF because one or both of the NMOS transistors 5525 and 5526 are OFF. In this state, high speed NMOS 5528 is ON and Low Leakage NMOS 5527 is OFF. Thus the internal node 5562 that is also the source node for High Speed NMOS 5526 is at Voltage Vss (not Vsssp). This means one or both of High Speed NMOS transistors 5525 and 5526 have negative gate-source voltage because the gate node is driven by input ports to Vsssp. Thus the PULL DOWN path in this state has significantly reduced leakage current. Again by similar phenomenon as described for RLCL inverter of FIG. 16, the short circuit current between Low Leakage PMOS transistor 5521 and High Speed PMOS transistor 5522 is very small because the OFF High Speed PMOS transistor 5522 has ZERO gate-source voltage but only a very small $\Delta v1$ source-drain voltage across the High Speed PMOS 5522.

Overall in both steady state conditions (output port 5510 is HIGH or LOW) the leakage current NAND2 RLCL gate is significantly small as compared to a normal CMOS NAND2 gate.

As in case of RLCL INVERTER of FIG. 16, during output transition the behavior of transistors is different. Assume that the NAND2 RLCL gate is in one steady state where both inputs are LOGIC HIGH and output is LOGIC LOW. In this state, the High Speed PMOS transistors 5523 and 5524 are OFF and High Speed PMOS transistor 5522 is ON. High Speed NMOS transistor 5528 is OFF and Low Leakage NMOS transistor 5527 is ON. From this state if one or both of the inputs transition to LOGIC LOW to Vsssp, the PULL UP current path through High Speed PMOS 5523 and/or 5524 starts turning ON. High Speed PMOS 5522 was ON already. As the PULL UP path turns ON because of turning ON of High Speed PMOS 5523 and/or 5524, the Pull down current Path starts turning OFF because High Speed NMOS transistors 5525 and/or 5526 start turning OFF. When the output port 5510 crosses the inverter Logic Low voltage threshold inverter 5551 output node 5541 transitions to LOGIC LOW and output node 5542 of inverter 5552 transitions to logic HIGH. Transitions of these two nodes cause Low Leakage PMOS 5521 to turn ON and High Speed PMOS 5522 to turn OFF. This pulls the output port 5510 and middle node 5561 to Vddsp. The High Speed PMOS transistor 5522 turns OFF but only after the LOGIC transition of output node 5510 is completed because only after the LOGIC transition of output port 5510, nodes 5541 and 5542 make the LOGIC transitions. This way the output node 5510 transitions from LOGIC LOW to LOGIC HIGH through High Speed PMOS transistors path 5522 and 5523 and/or 5524 but in steady state is held at LOGIC HIGH at voltage Vddsp by the Low Leakage Pull UP path consisting of Low Leakage transistor 5521 in series with High Speed PMOS transistors 5523 and 5524. High Speed PMOS transistors cause high speed transition to the output port when appropriate.

Similarly when the output port 5510 is in steady state at LOGIC HIGH because one or both of the input ports are at LOGIC LOW, node 5541 is LOGIC LOW at Vsssp and node 5542 is LOGIC HIGH at Vddsp. In this state High Speed NMOS transistor 5528 is ON, Low Leakage NMOS transistor 5527 is OFF. Similarly, the Low Leakage PMOS transistor 5521 is ON and High Speed PMOS transistor 5522 is OFF. When one or both of the input ports In_1 and In_2 transition such that both the inputs are now at LOGIC HIGH at Vddsp, the PULL DOWN current path from output port 5510 to Vss turns ON through ON High Speed NMOS transistors 5525, 5526 and 5528, while the PULL up current path turns OFF because both High Speed PMOS transistors 5523 and 5524 turn OFF. Output port thus discharges quickly to Vss with PULL down current path consisting of High Speed NMOS transistors 5525, 5526 and 5528. Hence the transition is fast. Again, when output port 5510 crosses threshold voltage of inverter 5551 node 5541 transitions to LOGIC HIGH at Vddsp and node 5542 transitions to LOGIC LOW at Vsssp. This turns ON Low Leakage NMOS transistor 5527 and turns OFF High Speed NMOS transistor 5528. But before High Speed NMOS 5528 turns OFF, the output node has already made a transition to LOGIC LOW because only after this transition, nodes 5541 and 5542 have made transitions to their opposite LOGIC states. Low Leakage NMOS 5527 pulls the output node DOWN to Vsssp.

As obvious from above explanation, the RLCL NAND2 function gate
- Performs the Boolean Binary LOGIC function as required by definition of a NAND2 functional gate
- Input and output ports behave in the same way as a normal CMOS NAND2 gate
- Achieves fast transition by use of High Speed CMOS transistors. This is a desired requirement of modern ICs in the industry
- Achieves significantly smaller leakage current than the normal CMOS Logic circuits by use of negative gate-source voltage to High Speed CMOS transistors in steady state (but not hindering their operation during transition)

The circuits shown in FIG. 16 and FIG. 18 are two basic examples of RLCL logic function gates. They represent construction and functioning of all basic cells that can constitute the library of RLCL logic function gates. By replacing the High Speed PMOS and NMOS devices in "Pull up logic computation Circuit" and "Pull Down logic computation Circuit" in both FIG. 16 and FIG. 18, any Boolean Function equivalent to a normal CMOS Logic gate, can be constructed. More complex Logic function cells with more than one output in RLCL library are constructed by combining multiple basic logic gates, which is same as in normal CMOS logic Cell library. All cells in RLCL logic library operate with High Speed at transition time and with substantially reduced leakage current in steady state. In another words, RLCL circuit cells have significantly reduced leakage current without significant loss in speed. These two features together make this technology a compelling offering for implementation in modern ICs.

All RLCL logic function gates constructed with general structure shown in FIG. 14A and more specific (one type of) embodiment FIG. 17 behave in the same way as RLCL inverter of FIG. 16 and RLCL NAND2 gate of FIG. 18.

Figure 19A:
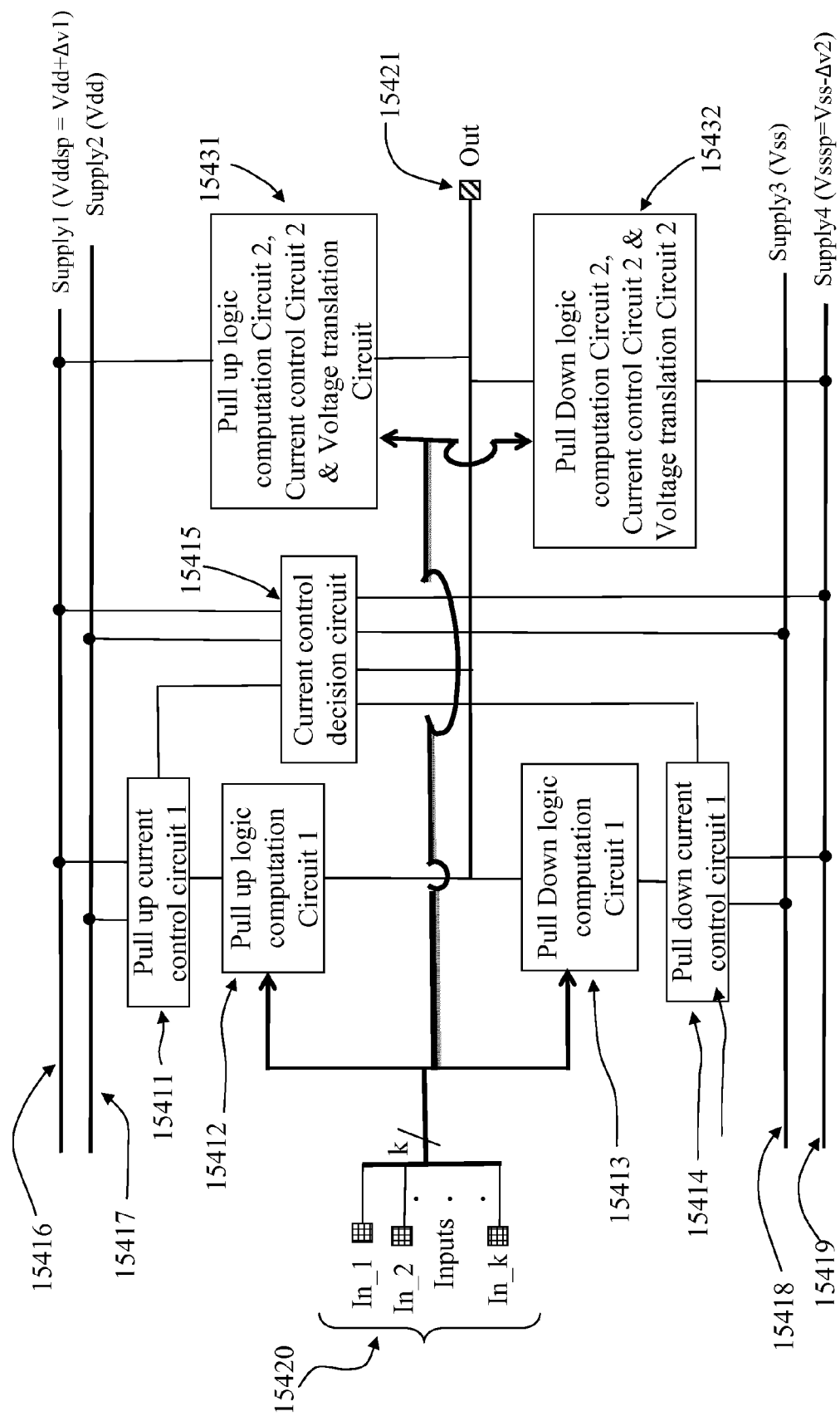
FIG. 19A illustrates another variation in block diagram level implementation of reduced leakage current.

FIG. 19A shows another embodiment of implementation of the general circuit scheme of FIG. 14A. FIG. 19A is a variation in circuit level implementation from one shown in FIG. 17.

As stated earlier various sub-blocks of circuit functionalities represented in FIG. 14A can be merged together or divided into two or multiple subsections. FIG. 19A shows a variant embodiment where the functional sub blocks of FIG. 14A are divided into multiple sub-sections.

As shown in FIG. 19A, various blocks of FIG. 14A (general construction of RLCL functional gate) has been sub-divided and merged. There are two Pull up current control Circuits 15411 and 15431. Similarly there are two Pull up logic computation circuits 15412 and 15431, two Pull down Logic Computation Circuits 15413 and 15432, two Pull down current control circuit 15414 and 15432. The voltage translation circuits have been merged with other functions in block 15431 and 15432. Current control decision circuit 15415 is connected to Pull up current control circuit 1, 15411 and Pull down current control circuit 1, 15414 in this embodiment. Four supply rails 15416, 15417, 15418 and 15419 are used in this embodiment as in other embodiments of RLC circuits. Again one or two supply rails can be omitted depending on requirements of an application. For example, while using in address decoder of SRAM, Supply1 or Supply 2 may be omitted. Other connections of various sub-blocks of this embodiment are as shown in FIG. 19A.

Figure 19B:
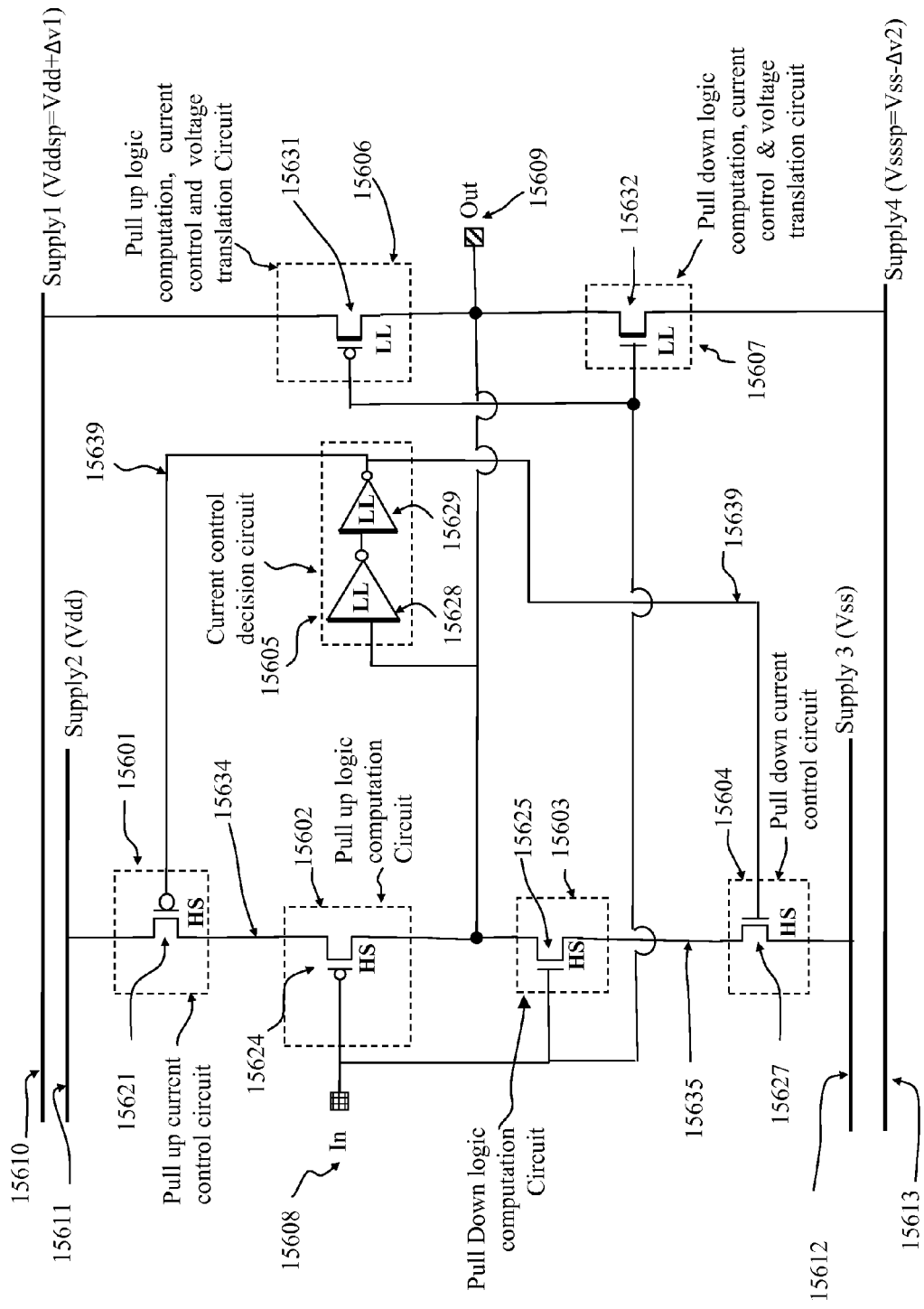
FIG. 19B illustrate a transistor level implementation of an INVERTER circuit with reduced leakage current devices according to scheme in FIG. 19A.
Figure 19C:
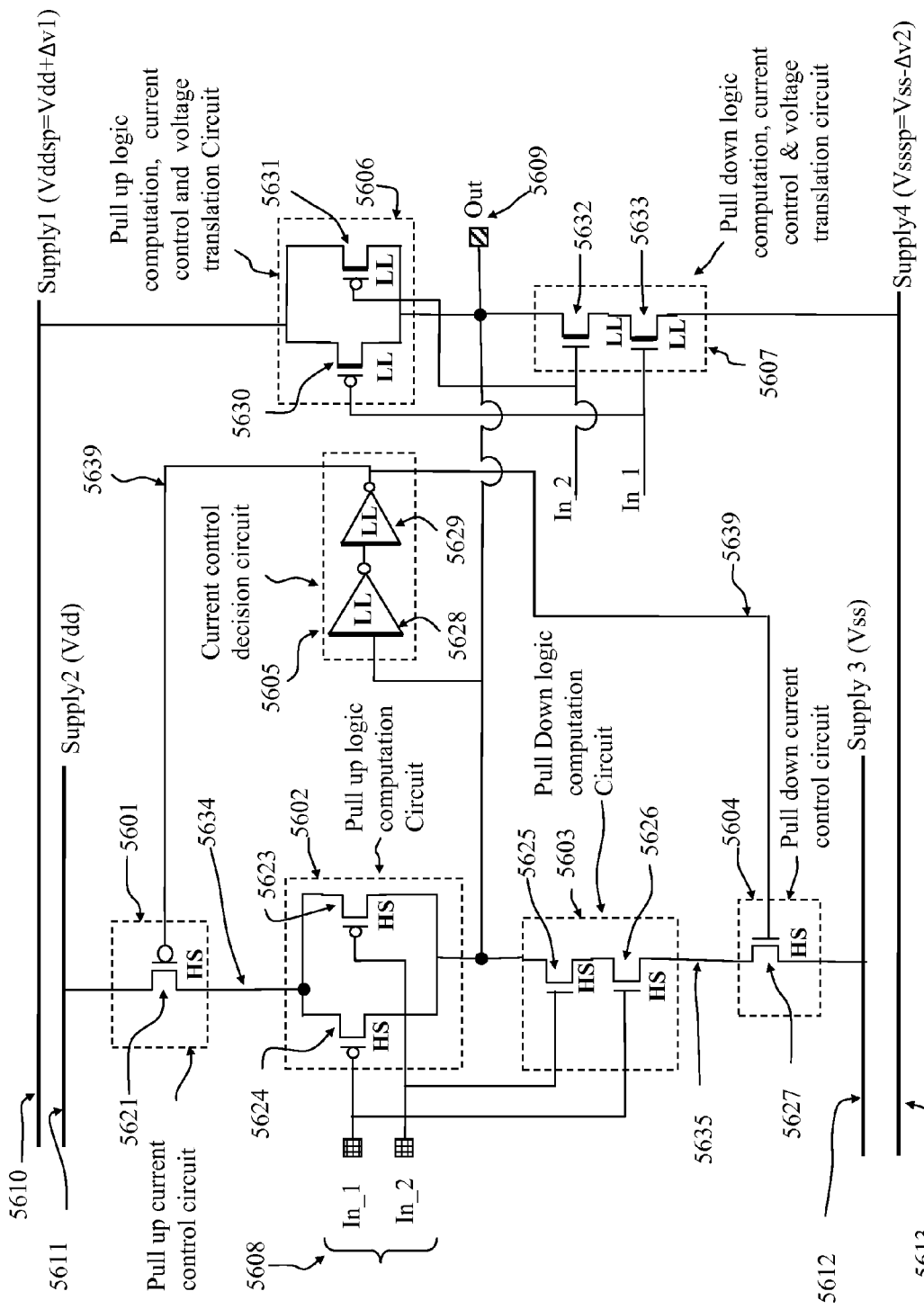
FIG. 19C illustrates a transistor level implementation of a NAND2 circuit with reduced leakage current devices according to FIG. 19A.

FIGS. 19B and 19C illustrate transistor level implementations of an RLCL INVERTER and an RLCL NAND2 functional gate respectively, accordingly to the circuit scheme presented in block diagram in FIG. 19A.

Figure 19D:
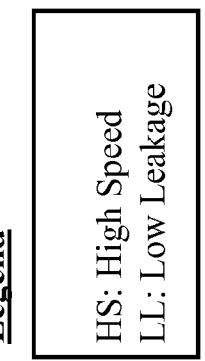
FIG. 19D illustrates schematic of a LOW Leakage INVERTER used in FIGS. 19B-C.
Figure 19D:
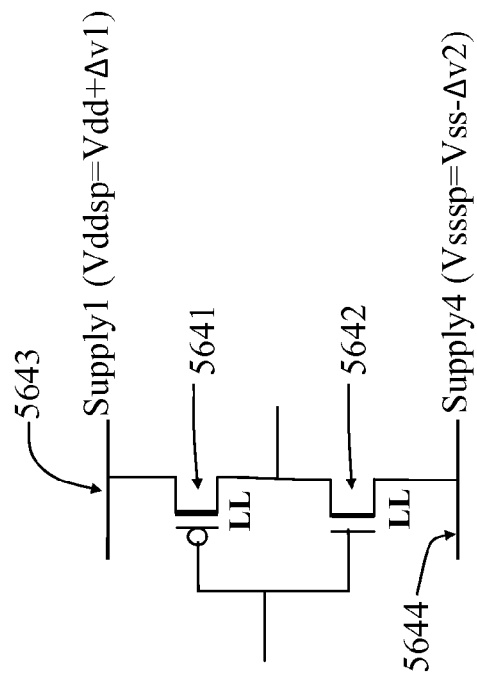
Figure 19D:
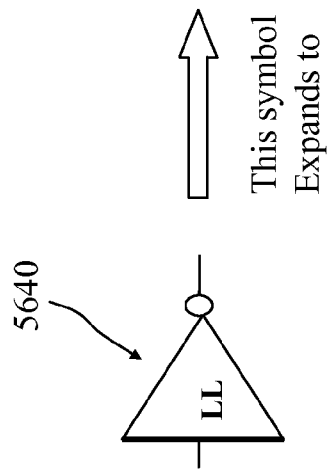

FIG. 19B shows transistor level implementation of RLCL inverter as per this embodiment (as shown in FIG. 19A). Pull up current control circuit is divided in two parts. The first part 15601 is the high speed Pull up Current Control Circuit that consists of a single High Speed PMOS transistor 15621. Its gate is connected to the output of "Current control Decision Circuit" 15605, its source is connected to Supply2 (Vdd) and its drain is connected to the source of High Speed PMOS 15624. The second part of "Pull up current control circuit" is "Low Leakage" Pull up current control Circuit 15606. This functionality is merged with other functionalities in block 15606 that consists of a single Low Leakage PMOS transistor 15631. The source node of Low Leakage PMOS transistor 15631 is connected to Supply1 (Vddsp), its gate node is connected to the input port "In" 15608 and its drain node is connected to the output port "out" 15609 and to the drain of Low Leakage NMOS 15607. "Pull up logic computation circuit" is also split in two parts. The first part 15602 is the High Speed Logic computation circuit that consists of a single High Speed PMOS transistor 15624 whose gate is connected to the input port "In" 15608, source node is connected to the drain of High Speed PMOS 15621 and the drain node is connected to the output port "Out" 15609. The second part of Pull up logic computation circuit is merged with other functionalities in block 15606 that is implemented with a single Low Leakage PMOS transistor 15631 as already described in this paragraph. "Pull Down Logic Computation Circuit" is also split in two parts, the first part 15603 is High Speed Pull Down Logic computation circuit implemented by a single High Speed NMOS transistor 15625 whose drain node is connected to the output port "Out" 15609, gate node is connected to the Input port "in" 15608 and the source node is connected to the drain node of High Speed NMOS transistor 15627. Second part of the "Pull down Logic Computation Circuit" is the Low Leakage Pull Down Logic Computation Circuit that is merged with other functionalities in block 15607 that consists of a single Low Leakage NMOS transistor 15632. The drain node of this NMOS transistor 15632 is connected to the output port "out" 15609, source node is connected to Supply4 (Vsssp) and gate node is connected to the input port "In" 15608. "Pull Down Current Control Circuit" is also split in two parts—a high speed Pull Down Current control Circuit 15604 and a Low leakage Pull down Current Control Circuit 15607 that is also merged with other functionalities. The High Speed Pull Down current control circuit 15604 consists of a single High Speed NMOS transistor 15627 whose gate is connected to output of 'Current control decision circuit" 15605, node 15639. The second part of "Pull down Current Control Circuit" is the Low Leakage Pull down Current control Circuit" 15607 whose functionality is merged with other functionalities of the gate. Its connectivity has already been described earlier in this same paragraph. Current Control decision circuit 15605 consists of two Low Leakage CMOS inverters 15628 and 15629. Both of these INVERTERS are simple CMOS inverters consisting of Low Leakage PMOS and Low Leakage NMOS transistors as shown in FIG. 19D. Input of this block 15605 is the input to first Low Leakage INVERTER 15628 connected to the output Port "out" 15609. Output 15639 of this block is connected to the gates of High Speed PMOS and NMOS transistors 15621 and 15627.

Functioning of the RLCL INVERTER of FIG. 19B as per this embodiment is described below:—

As in case of other RLCL embodiments, the input port "In" 15608 is driven by another RLCL functional gate or a compatible circuit and transitions from Vddsp to Vsssp and from Vsssp to Vddsp. When the Input "In" is LOGIC HIGH at Vddsp, Low Leakage NMOS transistor 15632 is ON and the output port of the inverter 15609 is discharged to Vsssp (LOGIC LOW) through this Low Leakage NMOS transistor 15632. In this steady state the output node 15639 of "Current control decision circuit" 15605 is LOGIC LOW at Vsssp which means High Speed NMOS 15627 is OFF and High Speed PMOS 15621 is ON. This means node 15634 is charged to Vdd (not Vddsp) through ON PMOS 15621 and node 15635 is discharged to Vsssp through Low Leakage NMOS 15632 and ON NMOS 15625. Low Leakage PMOS 15631 is OFF because its gate is at Vddsp.

Furthermore, in this steady state High Speed Pull UP path from output port 15609 to Supply2 (Vdd) though High Speed PMOS 15621 and 15624 is OFF because the High Speed PMOS 15624 is OFF with a negative gate-source voltage. High Speed PULL DOWN path from output port 15609 to Supply3 (Vss) through High Speed NMOS transistors 15625 and 15627 is also OFF because of OFF NMOS 15627 with ZERO gate-source voltage and $\Delta v2$ as its source-drain voltage. Low Leakage PMOS 15631 is OFF with ZERO gate-source voltage and Low Leakage NMOS 15632 is ON discharging and holding the output port "out" 15609 to LOGIC LOW at Vsssp. Leakage in Low Leakage PMOS transistor is significantly small by definition. Leakage in high Speed PMOS 15624 is significantly small because of negative gate-source voltage which, as explained earlier, reduces the leakage of a High Speed MOS transistor significantly. The leakage in High Speed NMOS transistor 15627 is significantly smaller because of very small source drain voltage ($\Delta v2$), as in case of other embodiments of FIG. 16 and FIG. 18.

Similarly when the Input Port "In" 15608 is in steady state at LOGIC LOW at voltage Vsssp, the output port "Out" 15609 is pulled high to Vddsp to LOGIC HIGH by Low Leakage PMOS 15631 which is ON because its gate node is connected to input port "In" 15608.
In this steady state the output node 15639 of "Current control decision circuit" 15605 is LOGIC HIGH at Vddsp because the output port "Out" 15609 is at LOGIC HIGH. This means High Speed NMOS 15627 is ON and High Speed PMOS 15621 is OFF. This further means node 15635 is discharged to Vss (not Vsssp) through ON High Speed NMOS 15627 and node 15634 is charged to Vddsp through Low Leakage PMOS 15631 and ON High Speed PMOS 15624. Low Leakage NMOS 15632 is OFF because its gate is driven by input port "In" which is LOGIC LOW at Vsssp.

Furthermore in this steady state, High Speed Pull DOWN path from output port 15609 to Supply3 (Vss) though High Speed NMOS 15625 and 15627 is OFF because the High Speed NMOS 15625 is OFF with a negative gate-source voltage. High Speed PULL UP path from output port 15609 to Supply2 (Vdd) through High Speed PMOS transistors 15624 and 15621 is also OFF because of OFF PMOS 15621 with ZERO gate-source voltage and $\Delta v1$ as its source-drain voltage. Low Leakage NMOS 15632 is OFF with ZERO gate-source voltage and Low Leakage PMOS 15631 is ON charging and holding the output port "out" 15609 to LOGIC HIGH at Vddsp. Leakage current in Low Leakage NMOS transistor 15632 is significantly small by definition. Leakage in high Speed NMOS 15625 is significantly small because of negative gate-source voltage. Negative gate source voltage, as explained earlier, reduces the leakage of a High Speed MOS transistor significantly. The leakage in High Speed PMOS transistor 15621 is significantly small because of very small source drain voltage ($\Delta v1$), as in case of other embodiments of FIG. 16 and FIG. 18.

The RLCL inverter designed with the scheme as presented in FIG. 19A has significantly small leakage current in steady state.

During transition, the High Speed MOS transistors participate in the operation making the RLCL function gate fast and usable in modern ICs as explained in following sections:—

As explained in preceding paragraphs, when the input port "In" 15608 is at LOGIC HIGH the High Speed PMOS 15621 is ON but High Speed PMOS 15624 is OFF. The ON High Speed PMOS 15621 makes the High Speed PULL up path consisting of PMOS 15621 and 15624 ready to transition at high speed. When input port "In" transitions from LOGIC HIGH (Vddsp) to LOGIC LOW (Vsssp), the High Speed PMOS 15624 turns ON thereby completing the PULL up path from output port "Out" 15609 to Supply2 (Vdd) immediately. Large PULL up transition current flows from Supply2 (Vdd) to the output port as result of this transition in the input port thus providing High Speed PULL UP transition to output port "Out" 15609. This transition is also augmented by the Low Leakage PULL UP transition path consisting of Low Leakage PMOS 15631. Once the output port "Out" 15609 crosses the logic transition threshold of Low Leakage inverter 15628 (which is when the output port has already crossed approximately HalfVdd voltage), the output of Low Leakage Inverter 15628 transitions LOW which causes the output of Low Leakage INVERTER 15629 (node 15639) to transition to LOGIC HIGH to Vddsp, thereby switching OFF the High Speed PMOS 15621. Low Leakage PMOS 15631 still remains ON and pulls the output port "Out" 15609 all the way up to Vddsp. After the transition, this RLCL gate is in steady state with the input port "In" held at LOGIC LOW at Vsssp consuming substantially smaller leakage current.

In opposite direction High Speed PULL DOWN transition of the output port "Out" 15609 is caused by the High Speed PULL DOWN path consisting of High Speed NMOS transistors 15625 and 15627. When input port "In" transitions from LOGIC LOW (Vsssp) to LOGIC HIGH (Vddsp), the High Speed NMOS 15625 turns ON thereby completing the PULL DOWN path from output port "Out" 15609 to Supply3 (Vss) immediately. Large PULL DOWN transition current flows from output port "Out" 15609 to Supply3 (Vss) thus providing High Speed PULL DOWN transition to output port "Out" 15609. This transition is also augmented by the Low Leakage PULL DOWN transition path consisting of Low Leakage NMOS 15632. Once the output port "Out" 15609 crosses the logic transition threshold of Low Leakage inverter 15628 (which is when the output port has already crossed approximately HalfVdd voltage), the output of Low Leakage Inverter 15628 transitions HIGH which causes the output of Low Leakage INVERTER 15629 (node 15639) to transition to LOGIC LOW to Vsssp, thereby switching OFF the High Speed NMOS 15627. Low Leakage NMOS 15632 still remains ON and pulls the output port "Out" 15609 all the way down to Vsssp. After the transition, this RLCL gate is in steady state with the input port "In" held at LOGIC HIGH at Vddsp consuming substantially smaller leakage current as explained earlier.

This way the RLCL inverter designed with the scheme shown in FIG. 19A provides High Speed functionality of a normal CMOS inverter with substantially reduced leakage.

FIG. 19C shows transistor level implementation of another (more complex) RLCL functional gate, NAND2, according to the scheme presented in FIG. 19A. Steady state and transition behavior of NAND2 gate are similar to the INVERTER of FIG. 19B, but NAND2 function gate provides the functionality of a Boolean 2 input NAND gate. As defined earlier NAND2 Boolean function is defined such that it has 2 inputs and one output. The output is at LOGIC LOW only when both inputs of this Boolean logic gate are at LOGIC HIGH. In all other combinations of INPUTS, the output is LOGIC HIGH. All can be seen by comparison of FIGS. 19B and 19C, all parts of RLCL NAND2 design are same as RLCL INVERTER of FIG. 19B except the Pull UP Computation and Pull DOWN computation sections (5602, 5603, 5606 and 5607) in FIG. 19C. These sections in FIG. 19C differ from INVERTER of FIG. 19B only in computing the LOGIC functions as required by the NAND2 Boolean Logic function definition. Substantial leakage reduction in steady state and High speed transition behaviors remain same.

A more detailed functionality of RLCL NAND2 gate as shown in FIG. 19C is as follows:

As in case of INVERTER of FIG. 19B, the "Pull up logic computation circuit" is divided in two circuit blocks 5602 and 5606 each consisting of High Speed and Low Leakage PMOS transistors respectively. Circuit block 5606 in this implementation performs double function of "pull up logic computation" and "voltage translation circuit". Similarly, the "Pull down logic computation circuit" 5 is divided into two sub-blocks 5603 and 5607 in this implementation each consisting of High Speed and Low Leakage NMOS transistors respectively. Block 5607 again performs double functions of "pull down logic computation" and "voltage translation circuit". Blocks 5607 and 5607 also perform additional task of holding output port to LOGIC LOW at Vsssp and LOGIC HIGH at Vddsp after the output has made the transition appropriately (according to Boolean function rule for NAND2 as defined earlier). The "current control decision circuit" 5605 in this implementation, works in exactly same way as in the INVERTER of FIG. 19B. In this implementation, the Low Leakage MOS circuit and High Speed MOS circuits compute exactly same logic for the functional gate separately but in exactly same way. However, the "pull up logic compute circuit" block 5606 and "Pull down logic compute circuit" block 5607 are connected to Supply1 (Vddsp) and Supply4 (Vsssp) respectively while the Pull UP logic computation circuit 5602 and Pull Down Logic computation Circuit 5603 are connected to Vdd and Vss supplies, respectively through other MOS transistors.

As explained earlier, since the input ports In_1 and In_2 are driven by output of another RLCL or compatible circuit, the input ports transition between voltages Vddsp and Vsssp. NAND2 Boolean functionality is performed by High Speed PMOS transistors 5623 and 5624, High speed NMOS transistors 5625 and 5626 and Low Leakage PMOS transistors 5630, 5631 and LOW Leakage NMOS transistors 5632 and 5633.

In one steady state, when both inputs In_1 and In_2 are LOGIC HIGH at voltage Vddsp, output port 5609 (Out) is discharged to LOGIC LOW to voltage Vsssp by Low Leakage NMOS transistors 5632 and 5633. The output of "current control decision circuit" 5639 is LOGIC LOW and discharged to voltage Vsssp, which causes High Speed NMOS 5627 to be switched OFF and High Speed PMOS transistor 5621 to be switched ON charging node 5634 to Supply2 (Vdd). In this steady state condition, the High Speed NMOS transistor 5627 is OFF and has ZERO gate-source voltage but the drain-source voltage is only Δv2 which is an order of magnitude smaller than the supply voltage in practice. Hence the leakage in High Speed NMOS 5627 is substantially lower than standard CMOS circuits. High Speed PMOS transistors 5623 and 5624 have negative gate-source voltages and hence have substantially reduced leakage current from Vdd to output port or Vss or Vsssp. Leakage current through LOW Leakage and small MOS transistors 5630, 5631, 5632 and 5633 is substantially small by definition as explained earlier.

Similarly, in another steady state, when any or both of the input ports In_1 and In_2 is LOGIC LOW at voltage Vsssp, the output port 5609 is pulled to LOGIC HIGH at Vddsp by one or both of the Low Leakage PMOS transistors 5630 and 5631. One or both of Low Leakage NMOS transistors 5632 and 5633 are OFF and one or both of High Speed NMOS transistors 5625 and 5626 are OFF. Thus, current pull-down paths from output port 5609 to Vss or to Vsssp are cut OFF. In this steady state condition the output node 5639 of "current control decision circuit" 5605 is LOGIC HIGH at voltage Vddsp which means High Speed PMOS 5621 is OFF and High Speed NMOS transistor 5604 is ON which pulls down node 5635 to Vss. In this steady state condition one or both of the High Speed NMOS transistors 5625 and 5626 have negative gate-source voltage thus reducing the leakage currents through them substantially. One or both of the High Speed PMOS transistors 5623 and 5624 are ON. Since output port 5609 is pulled to LOGIC HIGH to voltage Vddsp, node 5634 also gets charged to Vddsp through one or both ON High Speed PMOS transistors 5623 and 5624. This node then becomes source node for High Speed PMOS transistor 5621 whose gate is also at Voltage Vddsp. But since the source-drain voltage of this PMOS transistor is only Δv1, the leakage of this PMOS will be substantially LOW because of small drain-source voltage. As explained earlier Low Leakage PMOS and NMOS transistors 5630, 5631, 5632 and 5633 are small in size and of low leakage by definition. Hence the leakage of entire circuit function is substantially smaller than a normal CMOS circuit when the in this steady state.

As in case of other RLCL functional gates already described, the behavior of this gate is different during transition. Charging and discharging of output port 5609 during transition happens through High Speed MOS transistors to provide high speed so that the technology can be used commercially in modern ICs.

When both input ports In_1 and In_2 are at LOGIC HIGH (at voltage Vddsp), the output port 5609 is at LOGIC LOW (at voltage Vsssp). If any of the inputs transitions from LOGIC HIGH to LOGIC LOW (Vddsp to Vsssp), the output port (Out) transitions to LOGIC HIGH (to Vddsp) from LOGIC LOW. Let's assume that Input Port In_1 transitions from LOGIC HIGH to LOGIC LOW. Before this transition, the output port is at LOGIC LOW (Vsssp), output of "Current control decision Circuit" 5605 is LOGIC LOW at voltage Vsssp, the High Speed PMOS 5621 is ON and High Speed NMOS 5627 is OFF. When the Input In_1 transitions to LOGIC LOW (Vsssp), High Speed NMOS 5626 turns OFF and High Speed PMOS 5624 turns ON. Since High Speed PMOS 5621 is also ON, current from Vdd starts charging the output node 5609 through ON High Speed PMOS transistors 5621 and 5624. At the same time Low Leakage NMOS 5633 turns OFF and Low Leakage PMOS 5630 turns ON. This ON Low Leakage PMOS transistor starts charging the output port 5609 to Vddsp. However, the charging of output port to Vddsp through Low Leakage PMOS 5630 is too slow in comparison to charging of the output port to Vdd through High Speed PMOS transistors 5621 and 5624. Once the output 5609 makes transition from LOGIC LOW to LOGIC HIGH, the output of "Current control decision circuit" transitions to LOGIC HIGH to voltage Vddsp thereby causing the High Speed PMOS 5621 to be tuned OFF. Output port 5609 is gradually pulled up to voltage Vddsp by Low Leakage PMOS transistor 5630. This way the output of this function gate makes fast transition from LOGIC LOW to LOGIC HIGH and then settles into a substantially reduced leakage state automatically. Logic transition at output port is completed before the High Speed PMOS transistor 5621 is turned OFF because the process of turning OFF of this PMOS 5621 is triggered only by the transition at the output port.

The output port makes transition from LOGIC LOW to LOGIC HIGH in exactly the same way when both the Inputs In_1 and In_2 transition from LOGIC HIGH to LOGIC LOW, except in this case, both High Speed PMOS transistors 5624 and 5623 participate in charging of the output. Similarly both Low Leakage PMOS transistors 5630 and 5631 participate in charging of the output to Vddsp and holding the output to the voltage Vddsp in steady state after transition at output port is completed.

Output transition from LOGIC HIGH to LOGIC LOW (from Vddsp to Vsssp) happens in similar way except in this case the output port is discharged by pull down currents through High Speed and Low Leakage NMOS transistors 5625, 5626, 5632 and 5633. When both Input ports In_1 and In_2 transition from LOGIC LOW to LOGIC HIGH or any of the them transitions from LOGIC LOW to LOGIC HIGH while the other remained at LOGIC HIGH beforehand, both High Speed NMOS transistors 5625 and 5626 turn ON. As explained earlier High Speed NMOS 5627 was already ON before this transition in steady state, the conduction path for pull down current from output to Vss is completed. Output port 5609 hence starts discharging quickly through the high speed Pull down path consisting of High Speed NMOS transistors 5625, 5626 and 5627. Simultaneously, Low Leakage NMOS transistors 5632 and 5633 are also turned ON and conduction path for pull down current from output port 5609 to Vsssp is completed thus discharging the output port to Vsssp. However, as expected, output discharge through High Speed NMOS transistors 5625, 5626 and 5627 that are appropriately sized for speed, is much faster. Once the output port 5609 makes LOGIC transition from LOGIC HIGH to LOGIC LOW, the output node 5639 of "Current control decision circuit" 5605 also transitions to LOGIC LOW after slight delay (the natural delay of two inverters 5628 and 5629), thus turning OFF High Speed NMOS transistor 5627. LOGIC transition at output port 5609 is already completed before High speed NMOS 5627 turns OFF because the process of turning OFF of High Speed NMOS 5627 starts only after output port 5609 has already made the LOGIC transition. Low leakage NMOS transistors 5632 and 5633 gradually pull the output port 5609 to voltage Vsssp thus bringing the functional gate to its steady state of output being LOGIC LOW and holding the output in this state till the transition occurs again because of appropriate changes in input signals.

As shown in this FIG. 19D, Low Leakage PMOS transistor 5641 and Low Leakage NMOS transistor 5642 are represented symbolically by a Low Leakage inverter 5640. Two of these inverters make up "current control decision circuit" 5605 in FIG. 19C and 15605 in FIG. 19B. In actual implementation, this schematic representation is exactly same as the schematic representation of "current control decision circuit" in FIG. 19B. It can be easily understood that sizing of transistors in "current control decision circuit" will be chosen appropriately by design engineers in actual implementation according to speed, noise and other performance and implementation parameter requirements.

FIG. 19D shows transistor level implementation and connectivity of Low Leakage INVERTERS 15628 and 15629 of FIG. 19B and 5628 and 5629 of FIG. 19C. The low Leakage INVERTER of FIG. 19D, 5640 consists of the Low Leakage PMOS 5641 whose source is connected to Vddsp, drain is connected to the output port and the drain of Low Leakage NMOS 6542 and Gate is connected to the Input port and also to the gate of Low Leakage NMOS 5642, and Low Leakage NMOS 5642 whose source is connected to Vsssp.

More complex and sophisticated comparator circuits can be used to construct the "current control decision circuit" in variations of this design. Additionally, timing delay through "current control decision circuit" can be changed by many various methods including sizing, more stages, use of slower or faster MOS transistors, explicit or implicit loading of nets or MOS ports etc. This delay tuning will help in controlling the ratio of current to Vdd/Vss and Vddsp/Vsssp, duration of participation of high speed transistors in transitioning the output. The sizing and ratio of sizes of High Speed and Low Leakage MOS transistors is determined in actual implementation by design engineer based n various IC implementation requirements of performance, noise, reliability, leakage, speed etc.

As can be understood by people adept in this ART that all LOGIC functions can be implemented (thus making a LOGIC function family) using the design scheme variation presented in FIGS. 19A, 19B and 19C which themselves are just one of the implementation of general scheme presented in FIG. 14A.

Figure 20A:
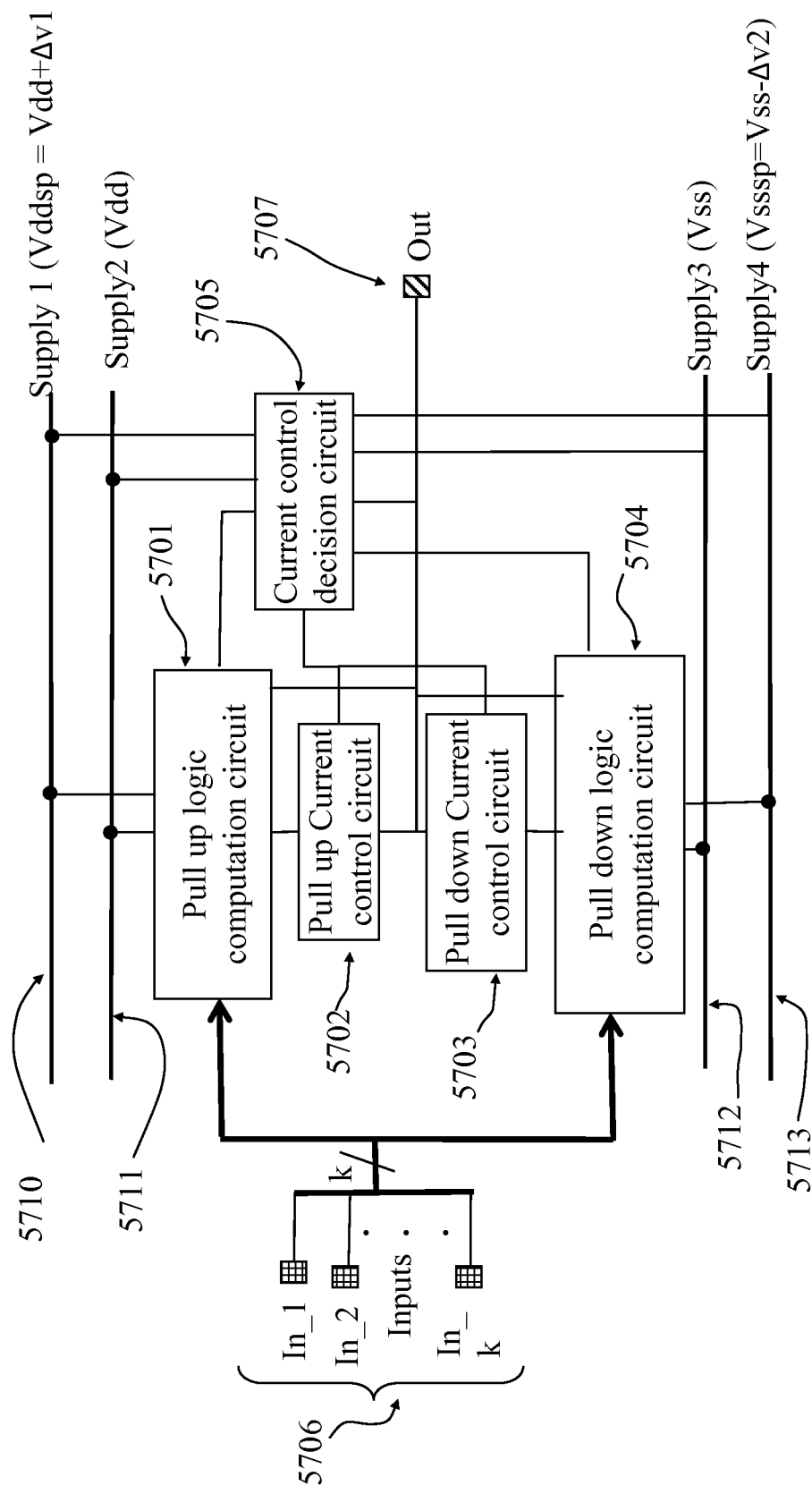
FIG. 20A illustrates a block diagram level implementation of another circuit scheme of the reduced leakage current device.

FIG. 20A illustrates yet another variation of general implementation of the general RLCL scheme presented in FIG. 14A. FIG. 20A represents design of RLCL function gates exactly like the ones in FIG. 17 except connectivity of some of the sub-blocks have been reshuffled.

As compared to FIG. 17, the "Pull UP current control Circuit" and "Pull up logic computation circuit" have swapped places with each other in FIG. 20A. Similarly, as compared to FIG. 17, the "Pull down current control Circuit" and "Pull down logic computation circuit" sub-blocks have swapped places with each other in FIG. 20A. Accordingly, the supply nodes 5710 (Vddsp) and 5711 (Vdd) are now connected to "Pull up computation circuit" 5701 in FIG. 20A. Similarly, Supply nodes 5712 (Vss) and 5713 (Vsssp) are now connected to "Pull down logic computation circuit" in FIG. 20. All other connections remain same as the connections in FIG. 17.

The "current control decision circuit" is connected to output port of the cell (Out) 5707 in same way as in FIG. 17. Additionally it may be connected to "Pull up logic computation and current control circuit" 5701 "Pull up current control circuit" 5702, "Pull down current control circuit" 5703, "Pull down logic computation & current control circuit" 5704. In transistor level implementation each of these blocks can be sub-divided into multiple blocks or merged together with other blocks of form any combination of merge and divide to provide the fundamental functionality as described in FIG. 14A. As compared to FIG. 17, connectivity of various sub-blocks to each other and supply rails has small changes, but the number of supply rails is same as in FIG. 17 with exactly same voltage relationship.

The reshuffling of various blocks of FIG. 17 as shown in FIG. 20A provides various advantages in speed and performance at expense of noise performance and active power consumptions. For example this implementation may provide better speed because of re-distribution of current but will have slightly lower noise performance than the implementation according to FIG. 17 or may have slightly higher active current as compared to FIG. 17.

People adept in the art of VLSI circuit design make these tradeoffs as part of their daily work based on various functional, speed, noise, active power, leakage power etc. parameters.

Figure 20B:
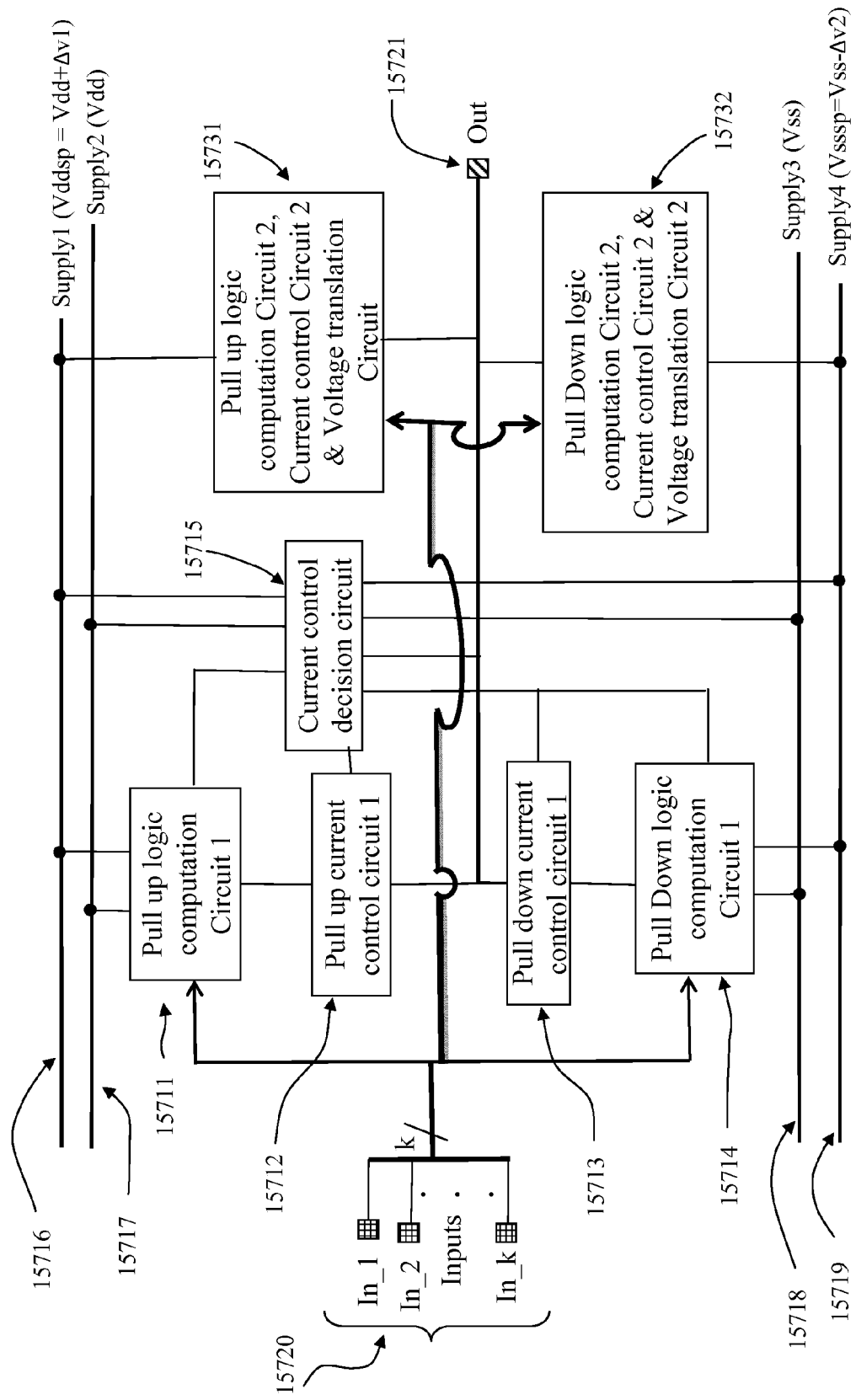
FIG. 20B illustrates block diagram level implementation of still another circuit scheme of the reduced leakage current device (a variation of FIG. 20A)

FIG. 20B shows yet another variation in connectivity and design of sub-blocks as compared to FIG. 20A. FIG. 20B is similar to FIG. 20A except some of the sub-blocks have been split in two parts. This functionality sub-division is similar to the functionality sub-division illustrated in FIG. 19B. Again, this variation of FIGS. 20A and 19B is just another implementation of the general RLCL circuit scheme presented in FIG. 14A.

Figure 21:
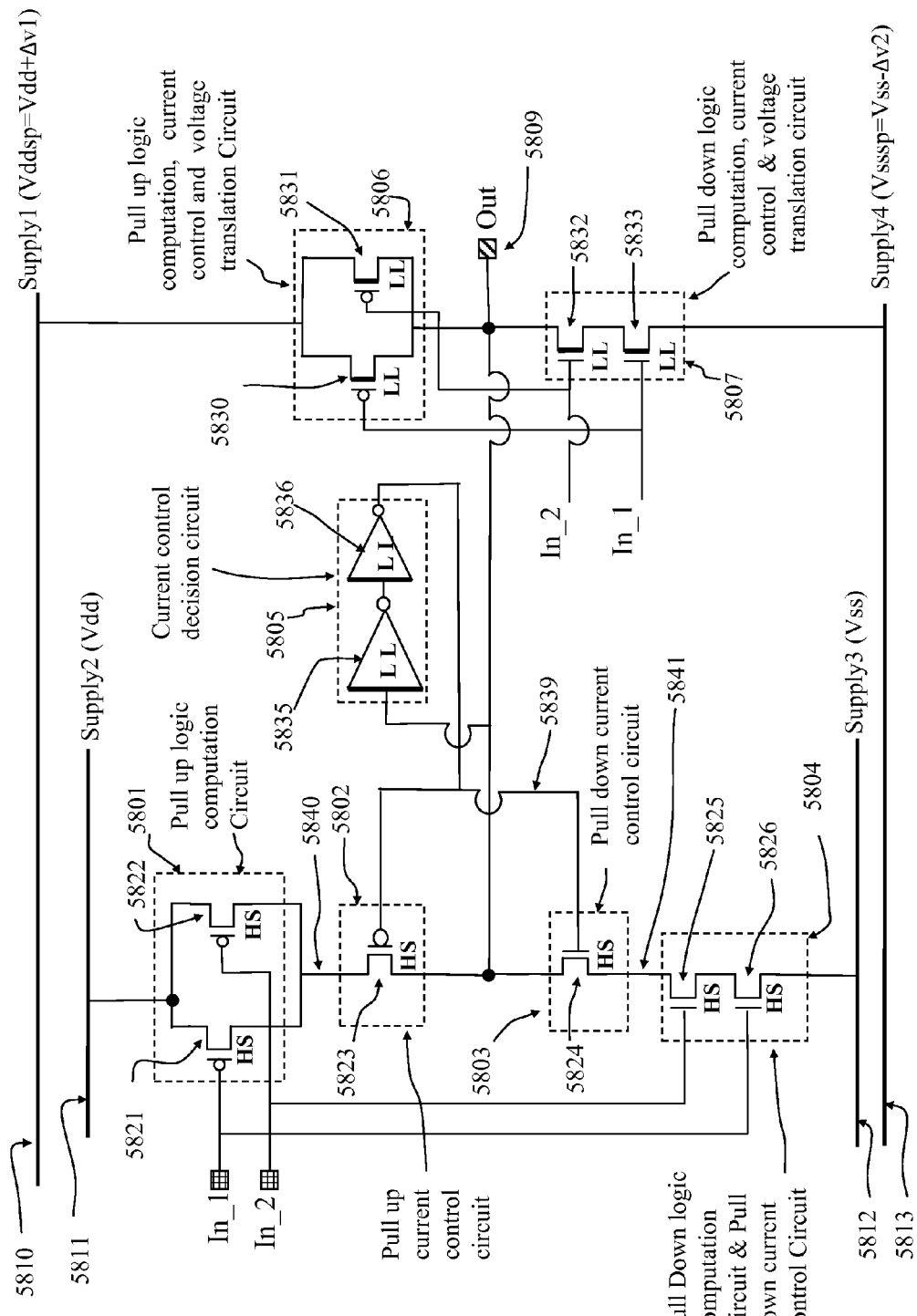
FIG. 21 illustrates a MOS transistor level implementation of a NAND2 functionality using the circuit in FIG. 20.

FIG. 21 shows MOS transistor level implementation of RLCL NAND2 functional gate according to embodiments presented in FIG. 20B. MOS implementation according to circuit scheme shown in FIG. 20A is similar.

MOS transistor level implementation of FIG. 20B is very similar to one shown and described in FIG. 19C with exception of swapping of some of the sub-blocks connectivity in the circuit. All parts consisting of Low Leakage transistors are exactly same as in FIG. 19C and also function in exactly same way as in FIG. 19C. All other parts of circuits consisting of High speed transistors also function in mostly same way as in FIG. 19C with small difference. This difference is in the way how, "pull up current control circuit" 5802 and "pull down current control circuit" 5803 and nodes connected to these sub-blocks behave during transitions.

Steady state behavior of this implementation is same as the RLCL NAND2 gate described in FIG. 19C. In steady state, all High Speed transistors are OFF. Leakage currents in all high Speed transistors are substantially smaller than a CMOS implementation because of negative gate-source voltage or because of very small source-drain voltage on High Speed MOS transistors that are OFF. Output of the functional gate is held at Vddsp or Vsssp by LOW Leakage PMOS or NMOS transistors in blocks 5806 and 5807 depending on the LOGIC at Input ports In_1 and In_2.

During transitions High Speed MOS transistors are active and provide High switching current to achieve high speed transitions and after the output has transitioned the High Speed MOS path (PULL up or PULL DOWN as appropriate) turns OFF as controlled by the 'Current control decision Circuit" 5805. This operation is exactly same as in other variations of RLCL circuit implementation described before.

For example, when input ports In_1 and In_2 both transition to LOGIC HIGH at Vddsp or one of them transitions to LOGIC HIGH when the other was already at LOGIC HIGH at Vddsp, the output 5809 transition from LOGIC HIGH to LOGIC LOW at high speed by Pull DOWN current through High Speed NMOS transistors 5824, 5825 and 5826 as appropriate for a NAND2 functionality. Once output port (Out) 5809 has made transition from LOGIC HIGH to LOGIC LOW, output node 5839 of "Current Control Decision Circuit" 5809 transitions to LOGIC LOW at Vsssp as previously described in reference to other embodiments of RLCL functional gates. This causes the High Speed NMOS transistor 5824 to turn OFF and High Speed PMOS transistor 5823 to turn ON. The output 5809 is then pulled down to Vsssp by PULL DOWN path consisting of Low Leakage NMOS transistors 5832 and 5833. Similarly when one or both of the Input ports In_1 and In_2 transition to LOGIC LOW at Voltage Vsssp, output port 5809 quickly transitions to LOGIC HIGH to Vdd through High Speed PULL UP path consisting of High Speed PMOS transistors 5821 and/or 5822 and 5823. Once output port (Out) 5809 has made transition from LOGIC LOW to LOGIC HIGH, output node 5839 of "Current Control Decision Circuit" 5809 transitions to LOGIC HIGH at Vddsp as previously described in reference to other embodiments of RLCL functional gates. This causes the High Speed PMOS transistor 5823 to turn OFF and High Speed NMOS transistor 5824 to turn ON. The output 5809 is then pulled UP to Vddsp by PULL UP path consisting of Low Leakage PMOS transistors 5830 and/or 5831. These events are exactly same as in the embodiment of RLCL NAND2 functional gate described in FIG. 19C.

There is a small difference though. Due to the special connectivity of High Speed PMOS 5823, when output port 5809 is pulled DOWN to LOGIC LOW and node 5839 is also PULLED DOWN to LOGIC LOW, High speed PMOS 5823 turns ON. This makes node 5840 discharge to a voltage that is a PMOS threshold voltage above the voltage at output port 5809 at this exact moment (and eventually to a voltage equal to Vsssp due to leakage if the output port 5809 doesn't switch again for long time). This is due to natural electrical behavior of a PMOS transistor. This results in charge sharing between output node 5809 and node 5840. This charge sharing creates small kink in the output node thereby slowing down the discharge of output node 5809 slightly or causing small bump in the output node that jumps up slightly before discharging to Vsssp completely. Output port 5809 is pulled down to Vsssp by current in Low Leakage Pull down path through NMOS transistors 5832 and 5833. It should be noted that this doesn't cause any LOGIC glitch in the output port 5809 since the output has transitioned to LOGIC LOW successfully before this charge sharing action. Similarly, when output port 5809 is pulled UP to LOGIC HIGH and node 5839 is also PULLED high to LOGIC HIGH, High speed NMOS 5824 turns ON (while High Speed PMOS 5823 turns OFF). This makes node 5841 charge to a voltage that is a NMOS threshold voltage below the voltage at output port 5809 at this exact moment (This node 5841 eventually charges to a voltage equal to Vddsp due to leakage if the output port 5809 doesn't switch again for long time). This is due to natural electrical behavior of a MOS transistor. This results in charge sharing between output node 5809 and node 5841. This charge sharing creates small kink in the output node thereby slowing down the charging of output node 5809 slightly or causing small dip in the instantaneous voltage of the output node that dips slightly before charging to Vddsp completely. Output port 5809 is pulled up to Vddsp by current in Low Leakage Pull up path through PMOS transistors 5830 and/or 5831. It should be noted that this doesn't cause any LOGIC glitch in the output port 5809 since the output has transitioned to LOGIC HIGH successfully before this charge sharing action takes place.

In driving long wires using this embodiment of RLCL implementation, we would need to analyze this voltage bump to guarantee reliability. Proper sizing of transistors in various blocks (in particular the ratio of Low Leakage and High Speed transistors) will mitigate or eliminate any noise concerns.

The connectivity described in this implementation reduces effect of ground bounce in source nodes of High Speed PMOS transistors when the output switches from LOGIC LOW to LOGIC HIGH (Vsssp to Vddsp) thereby increasing the speed of transition. Therefore this implementation can be advantageous for Speed.

Figure 22:
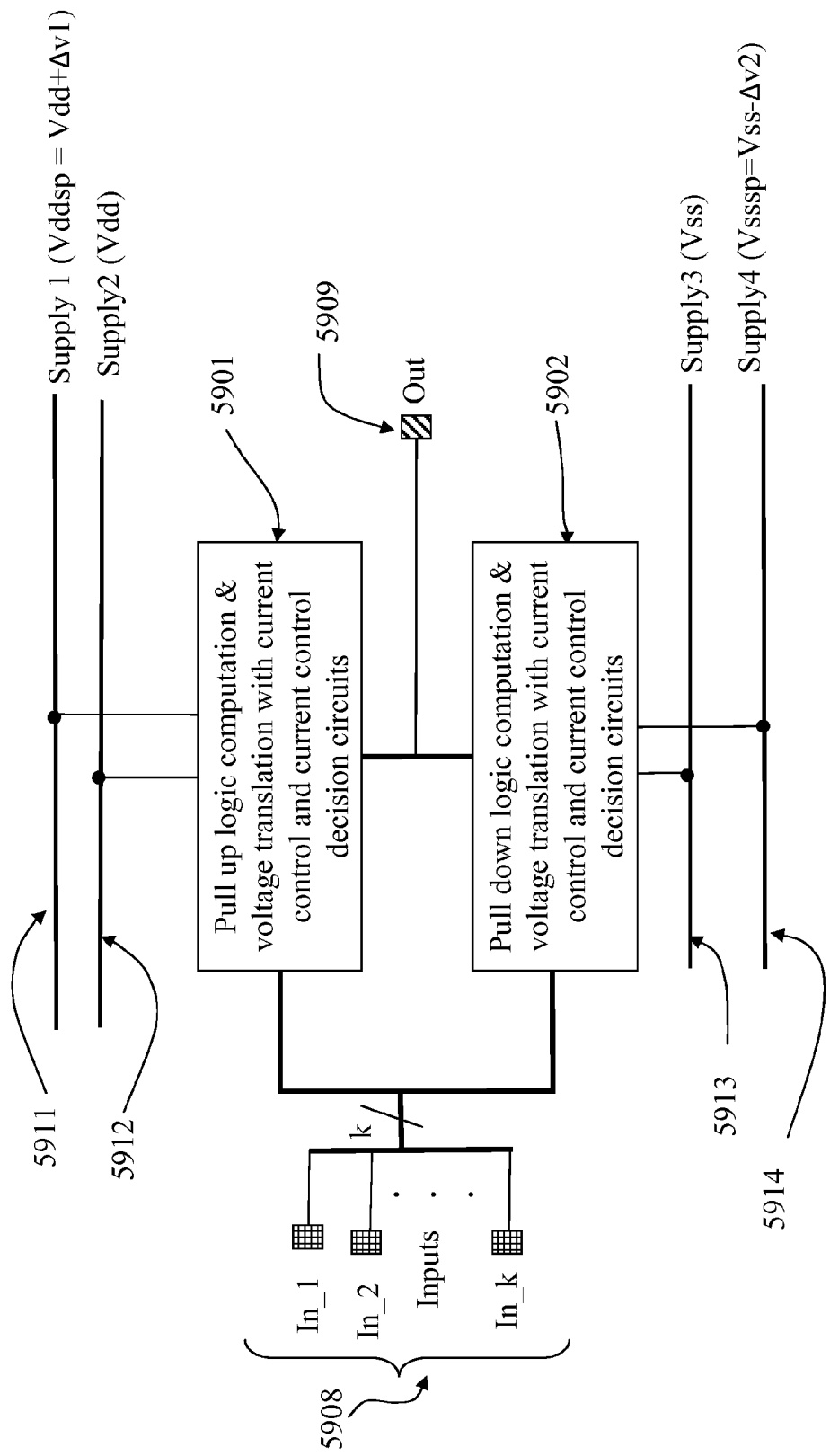
FIG. 22 illustrates another block diagram level implementation of the reduced leakage current device.

Symbol of Low Leakage INVERTERS 5835 and 5836 are used again in this FIG. 21 as in FIG. 19B and FIG. 19C, in "Current control decision Circuit" 5805. MOS transistor level implementations of these Low Leakage inverters are exactly same as in FIG. 19D FIG. 22 illustrates yet another implementation of the RLCL circuit technology presented in FIG. 14A. This is a simpler schematic implementation of RLCL circuits of FIG. 14A where all functionalities of sub-blocks of FIG. 14A are merged into a "Pull up logic computation and voltage translation with current control and current control decision circuits" 5901 and "Pull down logic computation and voltage translation with current control and current control decision circuit" 5902. The four supply rails Supply1, Supply2, Supply3 and Supply4 are exactly same as described with reference to FIG. 14A and in other embodiments of RLCL circuit implementations. All basic logic functions are formed with one or multiple input ports and one output port as in other implementations. Similarly, more complex functional circuits or cells are formed by combining multiple basic functional gates (cells).

Figure 23:
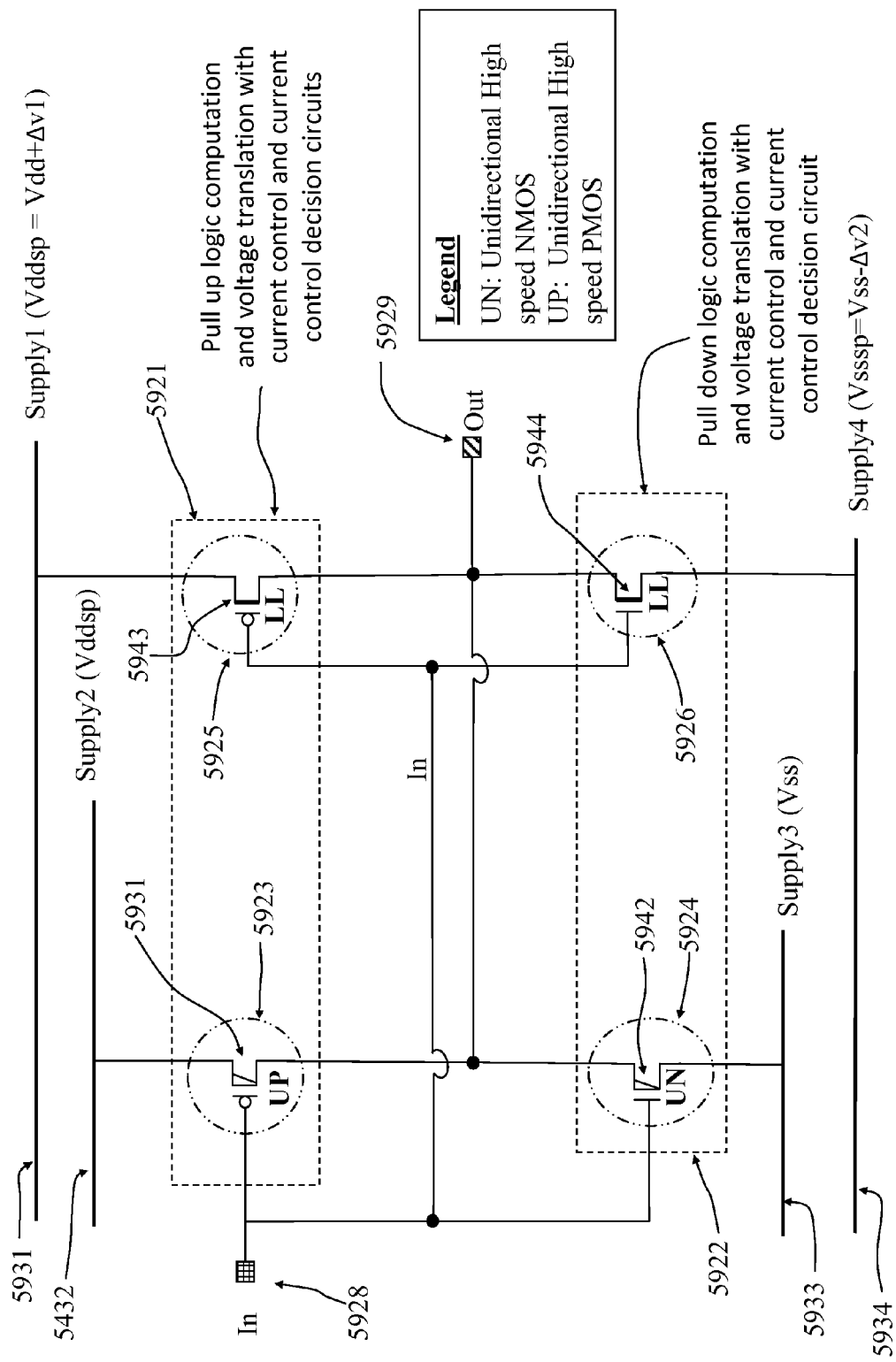
FIG. 23 illustrates a MOS transistor level implementation of an inverter function according to the circuit diagram shown in FIG. 22.

FIG. 23 illustrates a MOS transistor level implementation of an RLCL INVERTER function according to the scheme shown in FIG. 22. This transistor level implementation is same as the implementation in FIG. 15 with some small modification, but the functioning of this structure is exactly same as explained earlier in detail for FIG. 15. When input port "In" transitions from LOGIC LOW at Vsssp to LOGIC HIGH at Vddsp the High Speed NMOS UN device 5942 and Low Leakage NMOS transistor 5944 are ON. The High Speed UN NMOS device 5942 pulls the output port 5929 down to Vss with High Speed and Low Leakage NMOS device 5944 pulls the output port 5929 down to Vsssp and keeps it there till the next transition Similarly, when input port "In" transitions from LOGIC HIGH at Vddsp to LOGIC LOW at Vsssp the High Speed PMOS UP device 5923 and Low Leakage PMOS transistor 5943 are ON. The High Speed UP PMOS device 5923 pulls the output port 5929 UP to Vdd with High Speed and Low Leakage PMOS device 5943 pulls the output port 5929 UP to Vddsp and keeps it there till the next transition. In this implementation, two new devices have been used. An UP device and a UN device—in which the UP device is a Uni-directional High Speed PMOS transistor that conducts current only in one direction—source to drain when it is ON and conducts no current when it is OFF. It also doesn't allow current from drain to source even when it is ON. This UP device is turned on in the same way as a standard PMOS transistor (when gate is at lower voltage than source by more than the PMOS threshold voltage. There is never a current flow from drain to source in this device. Similarly, the UN device is a Uni-directional High Speed NMOS transistor that conducts current only in one direction—drain to source when it is ON and conducts no current when it is OFF. This UN device is turned on in the same way as a standard NMOS transistor (when its gate node is more than an NMOS threshold above the source node). There is never a current flow from source to drain in this special High Speed NMOS device.

The inverter in FIG. 23 functions exactly the same way as the INVERTER shown in FIG. 15 whose functionality to fulfill high speed and low leakage characteristics of RLCL technology is explained earlier. However, as explained earlier with reference to FIG. 15 there is a shortcoming in the implementation of INVERTER of FIG. 15 that there is a short circuit current between Vdd and Vddsp when the input port "In" is at LOGIC LOW. Similarly the INVERTER of FIG. 15 has a short circuit current between Vss and Vsssp when the input port "In" is at LOGIC HIGH. The shortcoming of the short circuit currents in INVERTER of FIG. 15 is eliminated in the INVERTER of FIG. 23 by use of these special MOS devices UP and UN. When the input port "In" is LOGIC LOW at Vsssp, the output port 5929 is pulled to Vddsp by the Low Leakage PMOS 5921. In this condition, even through the gate of UP PMOS 5931 is tied to Vsssp, the transistor doesn't conduct current from Vddsp to Vdd because of its uni-directional current conduction property. However, the UP PMOS 5931 helps in transitioning the output to LOGIC HIGH by allowing high current from Vdd to output port 5929 during transition of output port from LOGIC LOW to LOGIC HIGH. Once the output has reached Vdd quickly it gets pulled further UP by Low Leakage PMOS 5943. The drain node of UP PMOS 5931 being pulled above Vdd makes the current ZERO in UP PMOS 5931.

Similarly, when the input port "In" is LOGIC HIGH at Vddsp, the output port 5929 is pulled down to Vsssp by the Low Leakage NMOS 5944. In this condition, even through the gate of UN NMOS 5942 is tied to Vddsp this NMOS transistor doesn't conduct current from Vss to Vsssp because of its uni-directional current conduction property. However, the UN NMOS 5924 helps in transitioning the output to LOGIC LOW by allowing high current from output port 5929 to Vss during transition of output port from LOGIC HIGH to LOGIC LOW. Once the output has reached Vss quickly it gets pulled further DOWN by Low Leakage PMOS 5943 to Vsssp. The drain node of UN NMOS 5941 being pulled below Vss makes the current ZERO in UN NMOS 5941.

Figure 24:
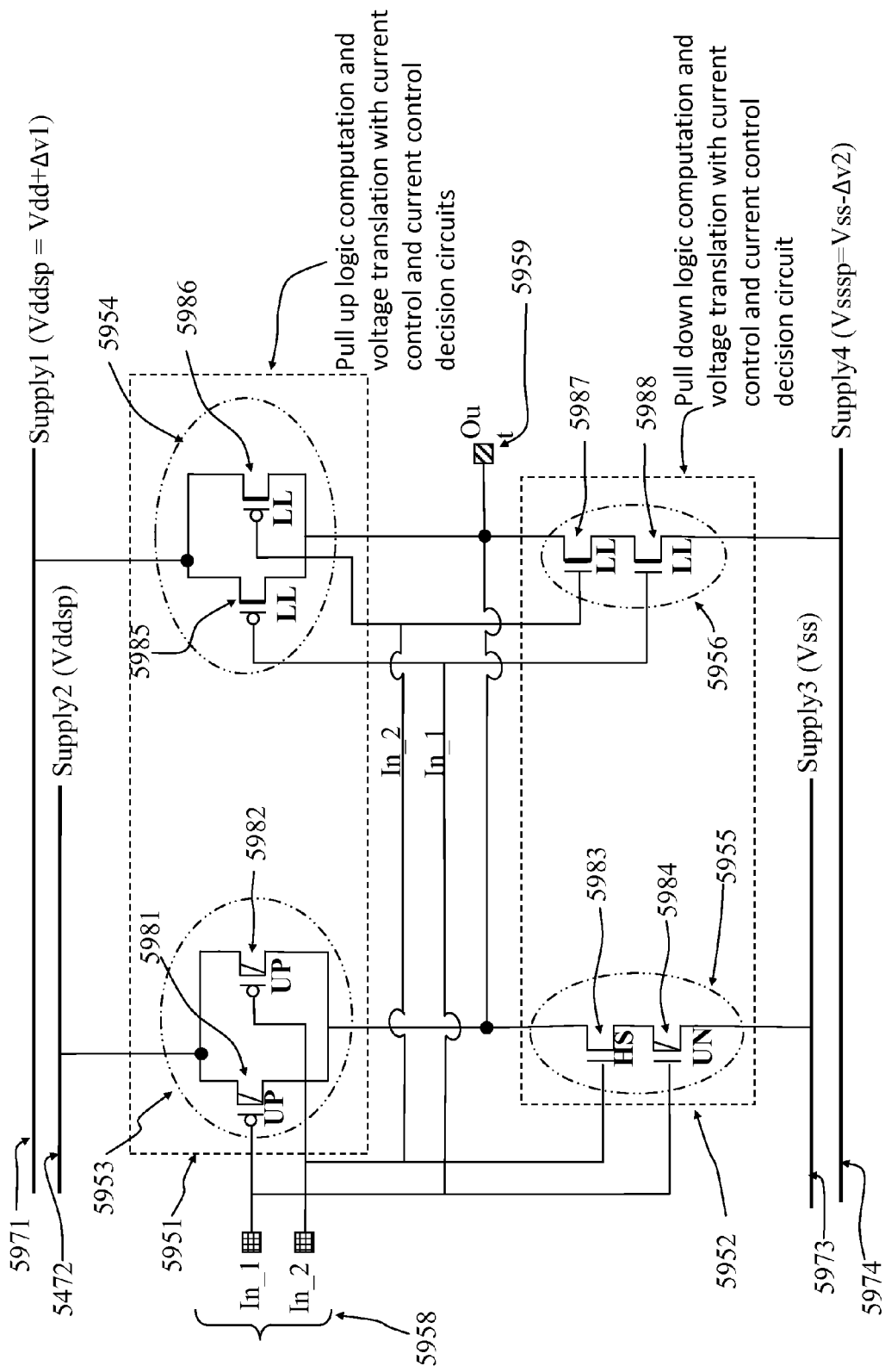
FIG. 24 illustrates an implementation of a NAND2 functionality using UN and UP devices.

In the steady state conditions (when input port is held at LOGIC HIGH or LOGIC LOW), the high Speed UN NMOS and UP PMOS transistors have negative gate-source voltages hence the leakage in these High Speed UP and UN MOS devices is substantially smaller. Leakage currents in Low Leakage MOS transistors are small by definition, thus the leakage current in this INVERTER of FIG. 23 is substantially small. But the transition speed of the INVERTER is still governed by currents in High Speed MOS devices. Thus a high speed Reduced leakage RLCL INVERTER is realized. FIG. 24 illustrates an implementation of a RLCL NAND2 functionality using UN and UP devices as per the circuit scheme of FIG. 22. This implementation functions in the same way as the INVERTER of FIG. 23 except it performs a NAND2 logic function while reducing the leakage of the functional gate by negative gate-source biasing as per the general scheme of the circuit block diagram proposed in FIG. 14A.

FIGS. 25A-B illustrates examples of implementations of the UN and UP devices, respectively, in semiconductor foundries. FIG. 25A shows an implementation of the UN device using a diode junction in series with the drain of the NMOS transistor. This diode is shown schematically by 6001 in FIG. 25A. On silicon, this diode is formed within the drain of the NMOS transistor by formation of a P+ diffusion 6010 in the N+ diffusion of the drain as shown. Rest of the structures and formation of UN NMOS device is exactly same as standard NMOS devices formed by the foundry currently.

An alternative implementation of special NMOS transistor UN is shown in FIG. 25B. Instead of a diode, an NPN BJT transistor 6021 is in series with the drain terminal of the NMOS transistor. The implementation on silicon of this NPN transistor is as shown by 6030. An N+ diffusion is formed within P+ diffusion 6031 which in turn is formed within N+ drain 6032 of NMOS transistor.

UP PMOS transistors will be formed in the similar way as shown in FIG. 25C and FIG. 25D. Like in UN NMOS, a diode 16001 is attached to the drain terminal of PMOS device. On silicon such a device can be formed by forming N+ diffusion inside the P+ drain diffusion of the MOS transistor as shown in the FIG. 25C. An alternate method is to form a PNP transistor 16021 in the drain terminal of the PMOS device instead of a diode as show in FIG. 25D by forming a P+ diffusion within a N+ diffusion which is further formed by N+ diffusion in the P+ diffusion of the drain of PMOS device.

In operation, the diode or NPN/PNP transistors so connected to the drain of NMOS or PMOS transistors prevent current from flowing from the source to the drain for UN NMOS and prevent current flowing from drain to the source for a PMOS device.

It is important to note that the source node for UP PMOS device is defined as the diffusion terminal connected to the Vdd (or Vddsp or another equivalent HIGH voltage supply node). Similarly the source node for UN NMOS device is defined as the diffusion terminal connected to the Vss node (or Vsssp or another equivalent LOW voltage supply node). For these devices, a change in terminal voltage on source/drain doesn't change the designation of source/drain.

RLCL circuit technology can be used for reduction of leakage current and active current and for improving performance in memory structures such as SRAM (Static random access memory), DRAM (Dynamic Random Access Memory), Flash memory etc. Use of RLCL circuit technology and its application methods have been explained in following sections:

In CMOS, memory can be of many types such as "Static Random Access Memory" (SRAM) or a "Dynamic Random Access Memory" (DRAM) or Flash Memory.

Figure 26:
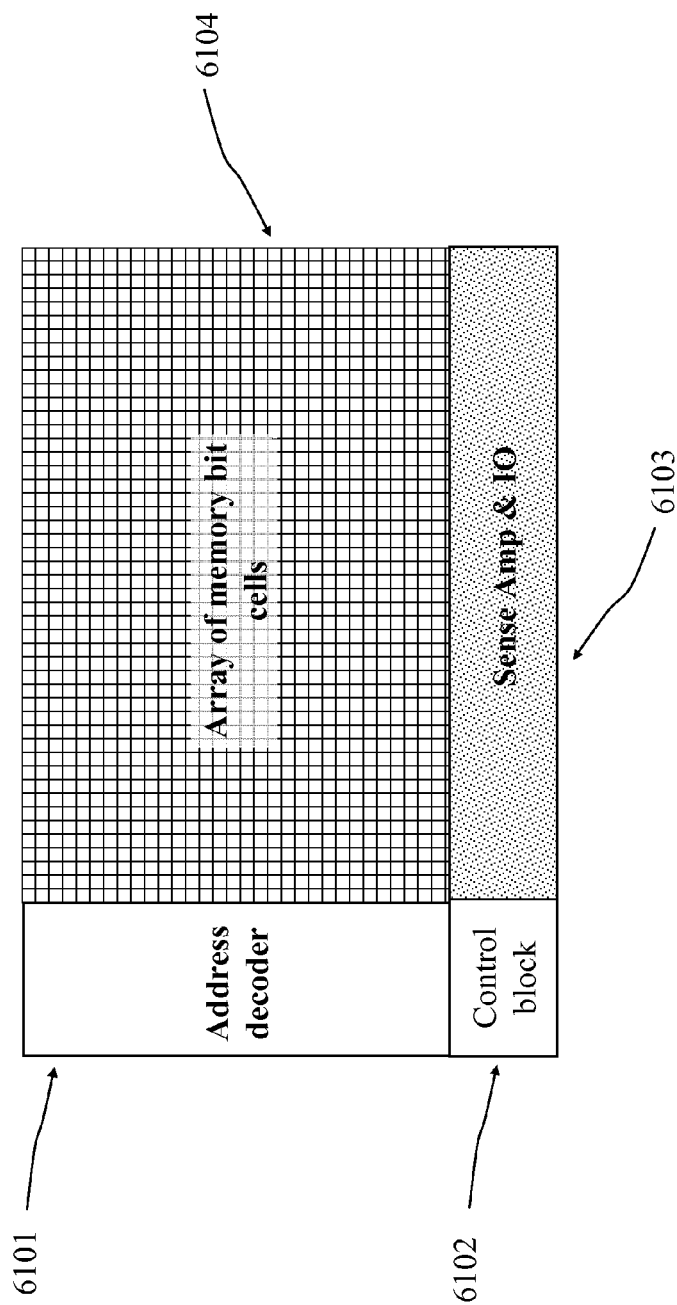
FIG. 26 illustrates the general structure of a standard CMOS memory.

FIG. 26 shows the block level functional and structural block diagram of a memory block. It consists of four sub-blocks including an "Address decoder" 6101, a "Control block" 6102, a "Sense Amp and IO" block 6103 and an "Array of memory bit cells" 6104. Small variations may exist in implementations that divide these blocks further in sub-blocks but at a high level FIG. 26 represents structural and functional partitioning followed by most memory implementations.

Memory bit Array (6104) occupies most of the area in a memory implementation and is also the most important part of the memory implementation. This array is made up of many mostly identical memory bit cells, with slight variations for edge cells. Edge cells are memory bit cells that form peripheral part of "memory bit array" 6104. The number of memory bit cells in an IC is typically very large (can be in millions). An array of thousands of memory bit cells in same memory structure is common. Memory bit cells are commonly designed and provided by a manufacturing house (semiconductor foundry) because they are very small in size and special processing steps are performed by the manufacturers to keep their sizes small. Need for low cost and high performance presents conflicting requirements on design of a memory bit cell which tend to reduce the memory bit cell size and demand more performance simultaneously. In CMOS ICs, in general, speed and size of a circuit component are inversely proportional to each other. Significant resources, time and efforts are spent on design and manufacturing of memory bit cell throughout the semiconductor industry, every year. Small and high performance memory bit cell provides significant business advantage to any semiconductor manufacturing house over their competitors. Hence, having a smaller, faster or both memory bit cell can be of high commercial value. Because of this reason, in modern times the Research and Development efforts for design and manufacturing of memory bit cells is mostly lead and conducted by semiconductor manufacturing companies.

A memory bit and memory array store data for computation within system or ASIC or any IC which is essential part of semiconductor IC and system functionality. All other blocks shown in FIG. 26 exist to facilitate writing into and reading from this array 6104. Most IC designers take and use the memory bit cells provided by the manufacturer (Semiconductor foundry) and assemble them in appropriate array size as per their requirements. All other blocks "Address decoder" 6101, "control block" 6102, "Sense Amp & IO" 6103 are designed by IC design engineers based on the memory bit cell size and characteristics provided by the manufacturing house (Semiconductor foundry).

There are some fundamental differences between memory bit cell for a Dynamic Random Access Memory (DRAM) and a "static Random Access Memory" (SRAM) and Flash memory in CMOS process technologies. A DRAM memory bit cell is a capacitor with a MOS switch for access to the charge on this capacitor. Charge is stored on a capacitor and read through the MOS switch. Each read destroys the charge of the memory bit cell and the charge needs to be restored by active circuit tricks for the memory bit before it can be read again. DRAM memory bit cell also looses charge due to leakage and the whole memory array needs to be refreshed periodically to compensate for the loss of charge due to leakage. In a refresh cycle, every memory bit cell is read. Read LOGIC value is written back to the same memory bit cell immediately thus restoring the charge on memory bit cell to its healthy state. This is done for every memory bit cell in the array. An SRAM bit cells consists of multiple MOS devices and retains charge forever as long as the memory block is connected to a power supply so that it does not require any refreshing. However, the DRAM bit cell is typically much smaller in size as compared to SRAM bit cell. Hence, DRAM memory ICs or DRAM memory blocks are much cheaper for a given cost (in dollars or area) as compared to SRAM ICs or SRAM blocks.

Flash memory bits are special memory structures that retain charge stored within special PolySilicon structures even after the power supply is disconnected. Thus Flash memory is a non-volatile memory.

SRAM is the fastest memory in CMOS, followed by DRAM and Flash memories. This is also the sequence for cost of memory per bit or memory ICs/blocks of same number of bits.

SRAM blocks and other memory circuits function in mostly same way in all commonly implemented memories in Semiconductor industry. For convenience SRAM functioning is explained in following sections with understanding that all other memory blocks operate in similar way:—

With reference to FIG. 26, for efficiently utilizing resources in "address decoder" 6101, "control block" 6102 and "sense amp and TO block" 6103, a group of memory cells are read and written simultaneously in the memory array 6104. The memory array 6104 is, therefore organized in number of rows and columns. A whole row of memory bit cells is written and read simultaneously. A "word line" connects all memory bit cells in a row together and controls the accesses to them for read and write operations. A "bit line" connects all memory cells in a column together so as to provide a conduction path from bit cells to external circuitry through "Sense amp and TO" block 6103 for read and write operations. Because of this connection of all memory bit cells in a column to a single bitline, only one row can be written or read at one time and only one of the read or write operation can take place at one time using this bitline. Any subsequent reads or writes to the array can happen only when the first operation has finished. To access two rows simultaneously, two bitlines are required in which case the memory is called and designed to be a dual ported memory. In this way, if n number rows are required to be read or written simultaneously, n bitlines are required in which case such a memory is called n-port memory. A bitline may consist of one wire (single ended bitline) or two wires (differential bitline). Differential bitlines (two wires for every bitline) is a common practice.

Timing and electrical behavior for reading and writing the memory bit array is managed by the address decoder, control block and sense amp and TO block. These blocks are designed in such a way that an array of given memory bit cells is accessed for read and write, reliably, deterministically and with speed that memory is supposed to work at.

Figure 27:
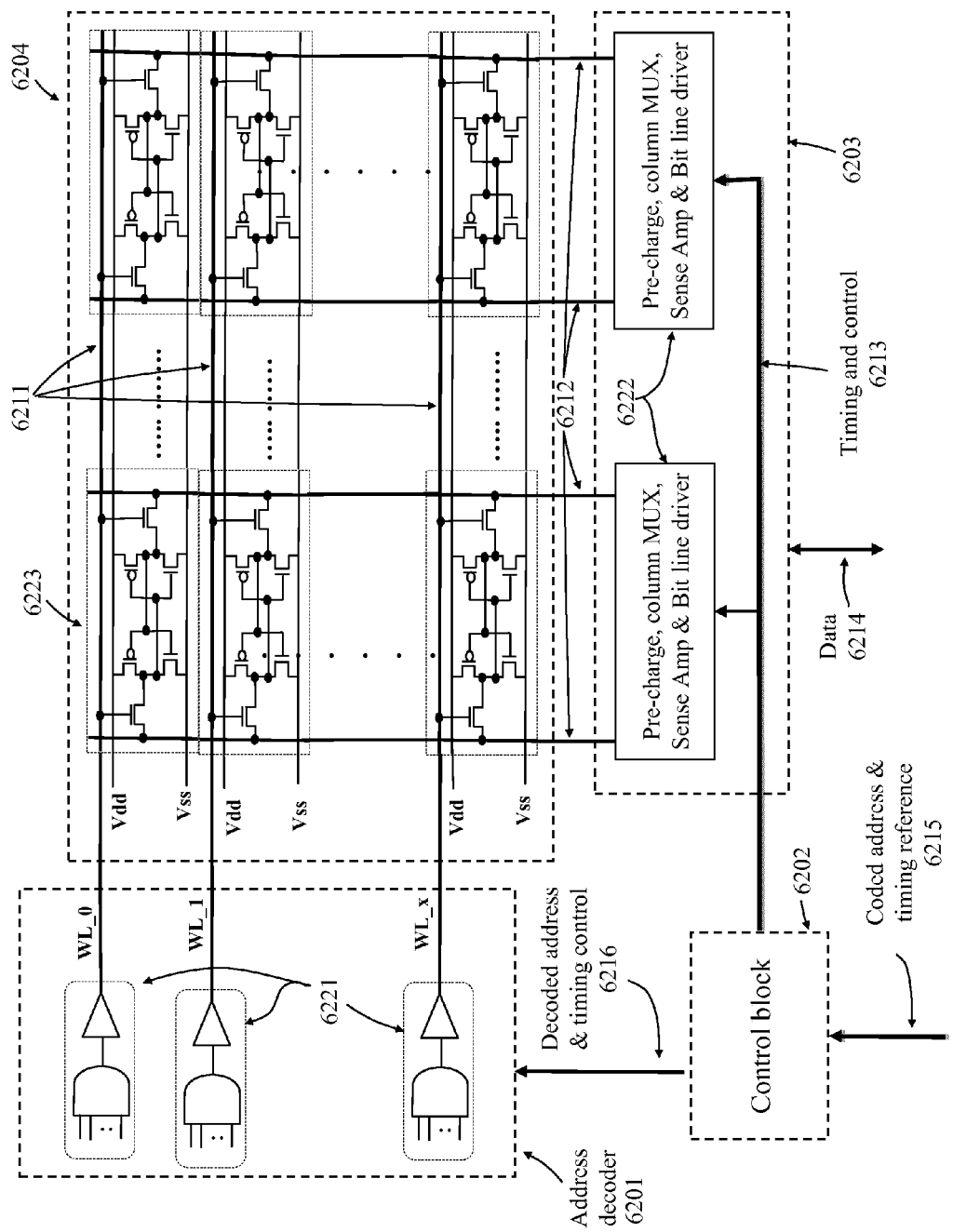
FIG. 27 illustrates more detailed connectivity and functional structure of standard CMOS SRAM memory implementation.

FIG. 27 illustrates more detailed connectivity and functional structure of SRAM memory implementation. As stated earlier this structure is applicable to all other types of memories also.

As shown in FIG. 27 SRAM has four major blocks "address decoder" 6201, "control block" 6202, "Sense Amp and IO block" 6203 and "Memory bit cell array" 6204. A simple and most commonly used design of a memory bit cell called 6T-bit cell (with 6 MOS transistors in one memory bit cell) 6223 is also shown in FIG. 27. A set of wordlines 6211 each connect all cells of one row. Differential bitlines 6212 are also shown in this example. One differential bit-line wires connect all cells of a column of memory bit cells together. The wordlines are driven by address decoder block 6201 that further consists of address decoder and address driver gates 6221. Both bitlines 6212 and Wordlines 6211 are used for read and write operations. During write operation, bitlines are driven by bitline driver which is part of a larger functional sub-block "Pre-charge, column MUX, Sense Amp & bit line driver 6222. During read operation bitlines are driven by the memory bit cell of the row being read. Complex timing and electrical behaviors are exhibited during memory read and write operations. A sophisticated timing and electrical behavior control mechanism is built by IC designers in address decoder, control block and Sense Amp & IO blocks to accomplish reliable read and write operations.

Figure 28:
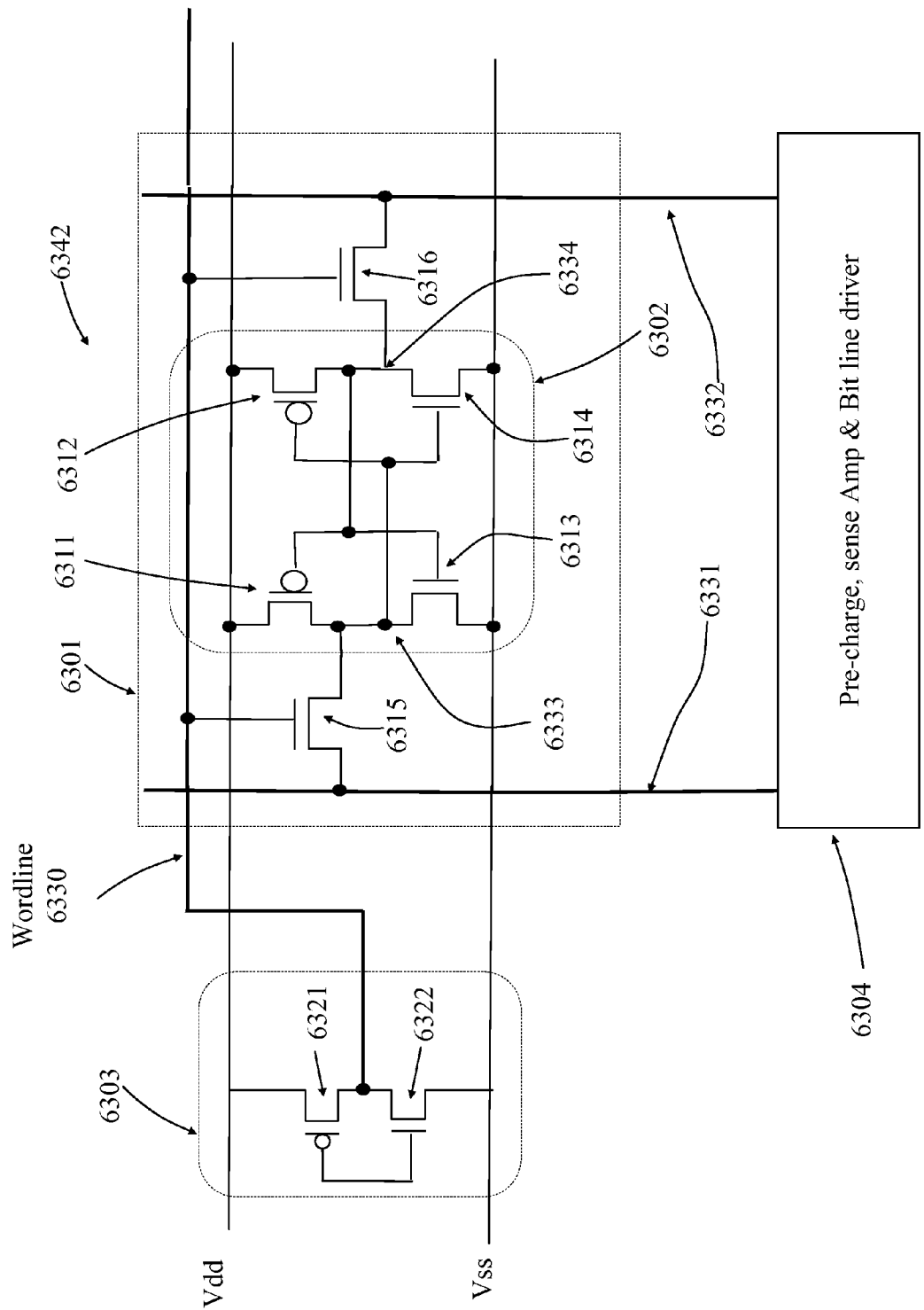
FIG. 28 illustrates details of a single bit cell of the RAM with the details of Word Line driver in a standard SRAM implementation.

FIG. 28 illustrates a single bit cell of the RAM using reduced leakage current technology. A detailed structure of a 6T SRAM memory bit cell 6301 is shown. It consists of a pair of back-to-back connected inverters connected to each other to form a bi-stable storage unit 6302. A bi-stable structure is one that can hold both logic ZERO and LOGIC ONE states indefinitely unless a changing agent forces the state to change These two inverters are formed by PMOS transistors 6311, 6312 and NMOS transistors 6313, 6314 as shown in FIG. 28. A pair of pass transistors consist of NMOS transistors 6315, 6316 that connect the storage unit 6302 to differential bit lines 6331 and 6332 respectively and also to wordline 6330. An additional inverter 6303 made of PMOS transistor 6321 and NMOS transistor 6322 is part of the address decode and wordline driver functionality shown in FIG. 27. This inverter is sized to drive the long and resistive word line wire of the memory array. Bit lines 6331 and 6332 are differential and form one logical bitline for read and write of the column in which this particular memory bit cell is placed.

In a common CMOS SRAM memory block, memory bit (storage unit) 6302 is a bi-stable storage unit for this memory bit cell. Nodes 6333 and 6334 work as nodes where LOGIC value are preserved indefinitely until changed by an external agent/event as long as power supply Vdd and Vss are alive or ON. If node 6333 is driven to LOGIC HIGH, the inverter consisting of PMOS 6312 and NMOS 6314 drives a LOGIC LOW at node 6334, that in-turn drives a LOGIC HIGH at node 6333 through inverter made of PMOS 6311 and NMOS 6313. To read the LOGIC value stores in this memory bit cell, first both the bitlines 6331 and 6332 are pre-charged (pulled UP) to Vdd by the "Pre-charge, sense Amp & Bit line driver" unit 6304. Then the wordline 6330 is driven to LOGIC HIGH at voltage Vdd by the wordline driver 6303. Pre-charge action is terminated before switching ON the wordline. Bitlines 6331 and 6332 get connected to nodes 6331 and 6334 respectively through pass transistors 6315 and 6316 that are now ON because of Word Line being pulled UP to Vdd. Let's assume that node 6333 was at LOGIC HIGH (means at voltage Vdd) and node 6334 was at LOGIC LOW (means Vss). Then the bitline 6331 will remain pre-charged to Vdd while bitline 6332 starts discharging to Vss through Pull down path inside the memory bit cell formed by NMOS transistors 6316 and 6314, after Word Line is Pulled UP to Vdd. A difference in voltage develops between the two bitlines which is correctly interpreted by the special circuit block called SENSE AMP in "Pre-charge, sense Amp & Bit line driver" 6304 block. For a LOGIC LOW at node 6333 and LOGIC HIGH at node 6334, bitline 6331 is discharged by the pull down path inside the memory bit cell formed by NMOS transistors 6315 and 6313 while bitline 6332 remains pre-charged to Vdd. Again this voltage differential between the two wires of differential bit lines is senses correctly by the Sense Amp structure within block 6304. During write operation, differential "bitline driver" of block 6304 drives bitline 6331 and 6332 to appropriate differential LOGIC values and voltages when wordline 6330 is ON. Since the memory bit cell transistors are small and weak their LOGIC VALUES are forcefully overwritten by strong bitline drivers of block 6304.

Since many memory bit cells are connected to a bitline (single ended or differential), they have very high capacitive load. Also there are many rows in a memory array, so the bitlines are long and skinny therefore also very resistive. For high speed, NMOS transistors 6313, 6314 and pass transistors (also NMOS transistors) 6315 and 6316 need to provide high current during read operation. Unfortunately, high current requires large sizes of these NMOS transistors, which makes a memory bit cell large. Large pass transistors 6315 and 6316 also increase load on the bitlines, which is connected to many bit cells in a column, thereby reducing the gain from increasing sizes of these transistors. Large bit size increase the size of memory array in X or Y or both directions thereby increasing resistances in bitlines, wordline or both thereby further mitigating the gain from increasing NMOS sizes in a memory bit cell. A larger pass transistors pair 6115 and 6116 also means larger capacitance on the word line 6330 which is connected to many cells within a row, which makes the word line also slower.

In addition to capacitive load of bit cells on them and resistances of bitlines and wordline wires, the speed of memory read and write is also negatively impacted by leakage currents in the pass transistors 6315 and 6316 of the memory bit cells. Assuming that the memory bit cell to be read has LOGIC LOW to be read on left hand side bitline 6331 (means the right hand side bitline 6332 would stay pre-charged to LOGIC HIGH) while the LOGIC VALUE stored on left hand side storage nodes (that is connected to the left side bitline 6331 with NMOS pass transistors that are OFF) of ALL memory bit cells in that column is LOGIC HIGH. Pass transistors of those memory cells that connect the memory bit cells to the bitlines are OFF because their respective Word Lines are LOGIC LOW at Vss. But these pass NMOS transistors will be leaking to make the bit line stay at LOGIC HIGH. This means the left hand side bit line discharge current provided by the memory bit being read, id fighting the leakage current of other memory bit cells that are not being read. The memory bit cell being read needs to compensate the leakage current of all other cells in that column that tends to charge the left hand side bit line because the leakage current are pulling the left hand side bit line UP to Vdd. Thus the left hand side bitline will discharge much slower than it would have if there was no leakage current. Similarly, because of this same assumption, the storage node in all memory bit cells on the right hand side are LOGIC LOW while the storage node of the memory bit cell being read is at LOGIC HIGH (to keep the right hand side bitline 6332 charged to Vdd). This means the pass transistors of all remaining memory bit cells (that are not being read) are OFF but have leakage currents that is discharging the right hand side bit lines to Vss. In effect, leakage currents in pass transistors of memory bit cells that are not being read can reduce speed at which the memory array can be read by reducing the differential voltage in the bit lines. For example if the memory bit cell to be read had LOGIC LOW to be placed at bitline 6331 and LOGIC HIGH at bitline 6332 and if all other cells in the column were such that the leakage through their pass transistors would charge bitline 6331 and discharge bitline 6332, then this will mean that to develop a required differential between the two bitlines 6331 and 6332 will take more time as compared to the situation if the pass transistors were not leaking. A larger differential voltage between bitlines means a more reliable read of the data. Sense Amp circuits that detect the differential voltage between bitlines need certain minimum voltage to function reliably. In modern process technologies, this differential can be in range of 20 mv-to-70 mv or higher. Larger differential voltage in bit lines provides faster speed of SENSE AMPLIFIERS.

Leakage currents in pass transistors cause delay during write operation as well because of the same reason of leakage current through pass transistors that are supposed to be OFF. However, the problem is not as severe during WRITE as it is during read.

Many methods are currently available in industry though manufacturing steps or gate length adjustments to reduce the leakage in the pass transistors. One such solution involves special manufacturing steps to increase the Threshold voltage (Vt) of pass transistor 6315 and 6316 of the bit cell. This method, while reduces the leakage in the pass transistors, also make them slower thus making the read and write operation of the memory array slower thereby causing the same effect it attempts to mitigate. Another method involves using larger gate length devices as NMOS pass transistors 6315 and 6316 in the memory bit cells. This method also makes the NMOS pass transistors 6315 and 6216 weak thereby causing the memory read and write operation to be slower.

In summary currently available methods of reducing leakage in the pass transistors of the memory bit cells are not as effective as desired.

Above explanation of memory read and write operation speed degradation due to leakage in the access MOS transistors (in this case NMOS) applies to all other type of memories (DRAM, FLASH memory etc) whether the access MOS transistor is PMOS or NMOS.

As it will be shown in later paragraphs, RLCL circuit technology helps improve speeds of read and write operations by reducing leakage through the pass transistors 6315 and 6316 that are OFF and/or also by enhancing current in the pass transistors that are ON.

In addition to causing performance impact, static power consumptions due to the leakage in memory bit cells is a big problem. Pass transistors contribute to a significant percentage of total leakage current in the memory bit cells.

Leakage current in the memory is becoming worse in cost and speed parameters through generations as manufacturing technology progresses to newer generations. This leakage power (or static power) is a big concern in modern ICs.

RLCL circuit technology reduces the leakage (static) power of the memory. In addition it also improves performance of the memory. This is achieved without needing changes in memory bit cell. This feature (of reducing leakage power and improving performance of the memory without need to modify the memory bit cell) of RLCL circuit technology is of significant commercial advantage for IC implementation since the costly process of designing/modifying memory bit cell is completely bypassed.

Following sections describe applicability of RLCL circuit technology in memories in reducing leakage current and improving performance:—

With reference to FIG. 26, leakage is present in all blocks Address decode 6101, Control Block 6102, Sense Amp & IO 6103 and Memory bit array 6104. However, the leakage current in memory array 6104 is the most significant portion of overall leakage current in the memory. In a normal CMOS memory of (any memory structure) represented by FIG. 26, all blocks except the memory array 6104 and Sense Amplifier circuits inside block 6103 are normal CMOS logic gates. To implement memory array with RLCL technology all blocks that contain CMOS logic gates in a normal CMOS memory will get replaced by RLCL logic gates in memory with RLCL technology. Thus address decoder block 6101 will contain logic function and timing circuits with RLCL technology. These logic gates are constructed using one of the embodiments of RLCL logic gates following the general circuit scheme according to FIG. 14A. Sense Amplifier in the "Sense Amp & IO" block 6103 is replaced by RLCL sense Amplifier using RLCL technology and circuit techniques. Thus using RLCL circuit technology leakage current in "Address decoder" 6101, Control block 6102 and "Sense Amp and IO" block 6103 is significantly reduced.

Figure 29:
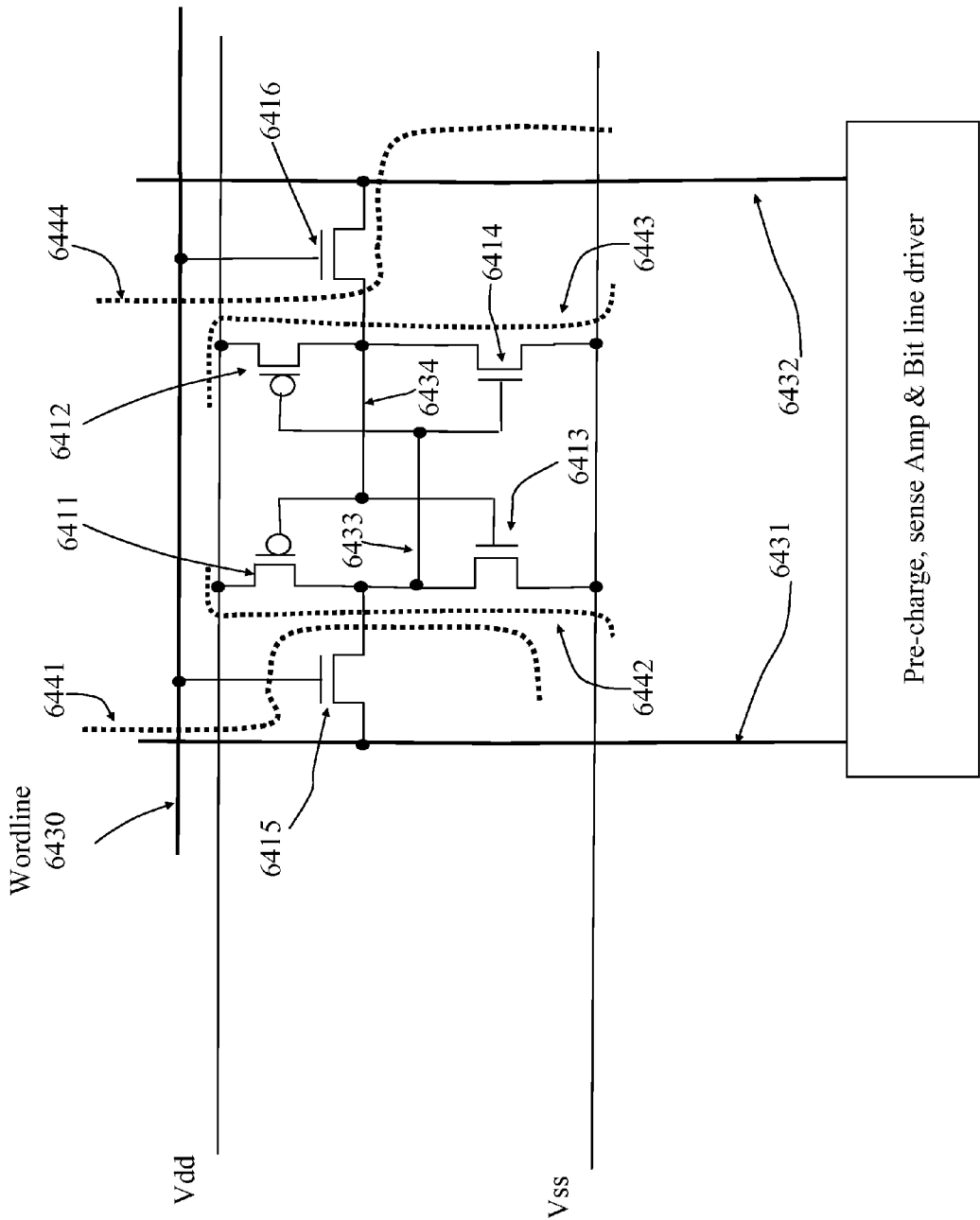
FIG. 29 illustrates the leakage current paths related to memory bit cell in typical SRAM designs.

As described earlier, the memory bit used in the memory array can be same as the one provided by the manufacturing house (semiconductor foundry), because developing new memory bit cell may be a very expensive process. Even without changing the memory bit cell in the memory bit array, the leakage of "memory bit cell array" 6104 is reduced significantly using RLCL circuit technology FIG. 29 illustrates the leakage paths in a normal bit cell of a SRAM memory. The schematic of FIG. 28 is reproduced in FIG. 29 with an emphasis of showing leakage currents in the memory bit cell. Four current leakage paths are shown that originate or terminate leakage current in a memory bit cell. In a normal CMOS memory, when word line 6430 is driven to Vss by the address decoder and word line driver (not shown in FIG. 29), this row is not selected for reading or writing operation and all the bit cells in this ROW are supposed to be inaccessible. The Pass transistors 6415 and 6516 are OFF but are leaking. The amount of leakage current depends on the type and design of the Pass transistor NMOS and exact voltages on various nodes. Assume that storage node 6433 is at LOGIC LOW (Vss) and storage node 6434 is at LOGIC HIGH (Vdd). Further assume that Bitline 6431 is NOT being discharged and is in pre-charge state (Vdd) which also means bitline 6432 is being discharged by the bitcell that is being read (The bit cell being read is not shown in this Figure). As shown in FIG. 29, one current leakage path 6441 exists from Vdd through pre-charged bitline (and the MOS transistor(s) pre-charging the bitline 6431 to Vdd), OFF NMOS 6415 and ON NMOS 6413. Since node 6433 is at voltage Vss, the NMOS pass transistor 6415 has maximum drain-source voltage and ZERO gate-source voltage and hence high leakage current through it. Another leakage current path 6442 exists from Vdd to Vss within the memory bit cell itself through OFF PMOS 6411 and ON NMOS 6413. In general the PMOS of memory bit cell is very small in width and of larger gate length than normal gate length. Hence, this leakage current in OFF PMOS 6411 is relatively smaller than any of the OFF NMOS in the memory bit cell. Since node 6433 is at Vss and node 6434 is at Vdd, NMOS transistor 6414 is OFF. As shown in FIG. 29, yet another leakage current path 6443 exists within the memory bit cell from Vdd to Vss through ON PMOS 6412 and OFF NMOS 6414. This NMOS 6414 has high drain-source voltage. This NMOS is also much larger in comparison to both PMOS 6411 and 6412 Hence, leakage current through this NMOS transistor is much larger than the leakage current through any of the OFF PMOS transistors in the memory bit cell. Yet another leakage current path 6444 exists from Vdd of the memory bit through on PMOS 6412 and OFF NMOS transistor 6416 to the discharging bitline 6432 (and hence to the NMOS of the bit cell that is being read and is discharging this bitline 6432). These are the four prominent leakage current paths related to the memory bit cells. It is important to note that all bit cells in a memory bit array will be leaking current regardless of their status in the array unless the leakage is suppressed by doing something special in structure, functionality or working conditions. If the assumption about the state of discharge and pre-charge between bit lines is reversed, the leakage paths change their direction. Also the amount of leakage is different in different paths depending on the voltages at nodes within bit cells and bitlines and wordline.

Leakage current through pass transistors of the memory cell 6415 and 6416 are significant part of total leakage current in the memory array. Since, there is large number of memory in most modern CMOS ICS, the leakage current in memory is large percentage of the total leakage current of the IC even through the leakage in one memory cell is substantially lower than most of the CMOS logic gates.

Figure 30A:
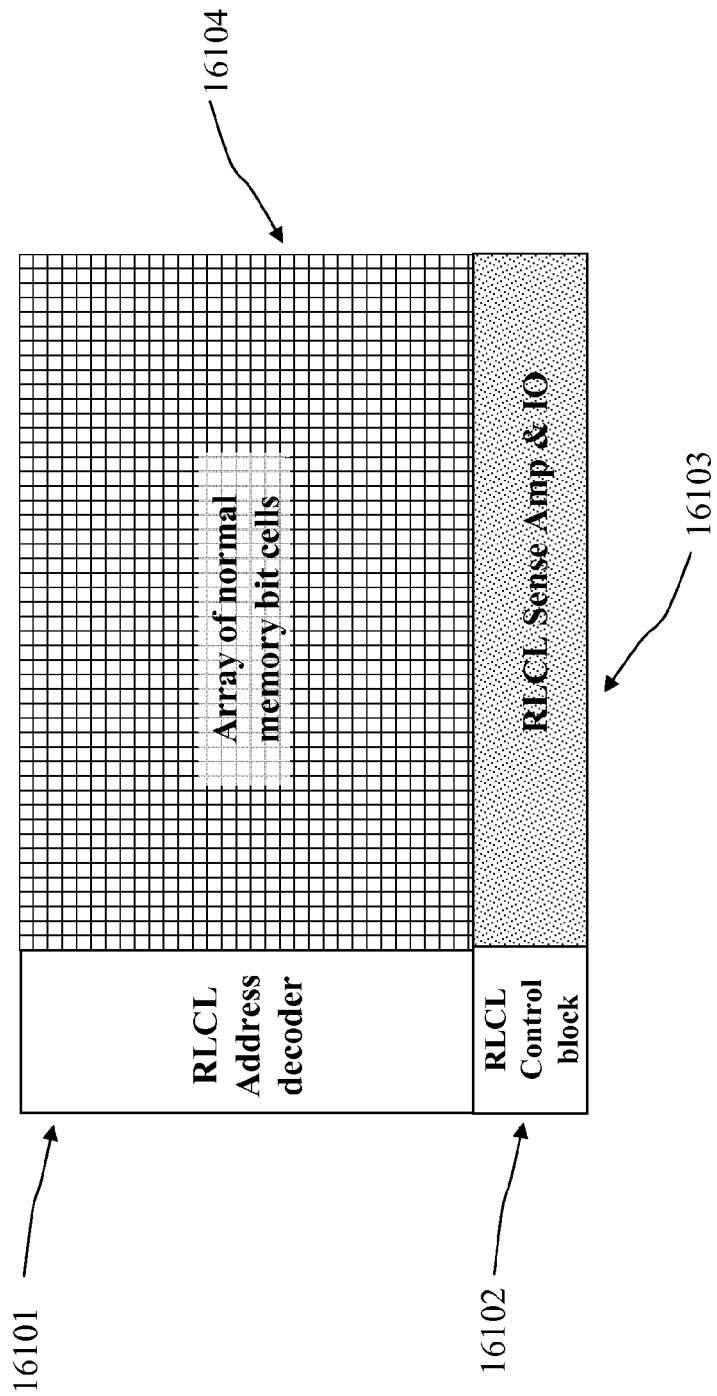
FIG. 30A illustrates the general structure of a memory with reduced leakage current devices.

FIG. 30A illustrates a SRAM block implementation with RLCL technology. FIG. 30A is exactly same structure as in FIG. 26 except that "Address decoder" has been replaced by "RLCL Address decoder", sub-block "Sense Amp and IO" has been replaced by "RLCL Sense Amp and IO" and "Control block" has been replaced by 'RLCL Control Block". In functionality these blocks are exactly same as a normal CMOS SRAM memory of FIG. 26 but the normal CMOS logic gates and circuits have been replaced by the RLCL logic gates and RLCL circuit. RLCL logic gates and circuits are designed with one of the embodiments and circuit topologies described in FIG. 14A and explained in more detailed from FIG. 14A to FIG. 25D. As mentioned earlier, the SRAM bit cell remains same as in FIG. 26.

RLCL logic gates and RLCL circuit topologies used within sub-blocks "RLCL Address decoder" 16101, "RLCL Control block" 16102 and "RLCL Sense Amp & IO" 16103 result in substantially reduced leakage currents in these circuit structures. Additionally, RLCL circuit technology results in substantially reduced leakage current in "memory array" 16104 also.

Figure 30B:
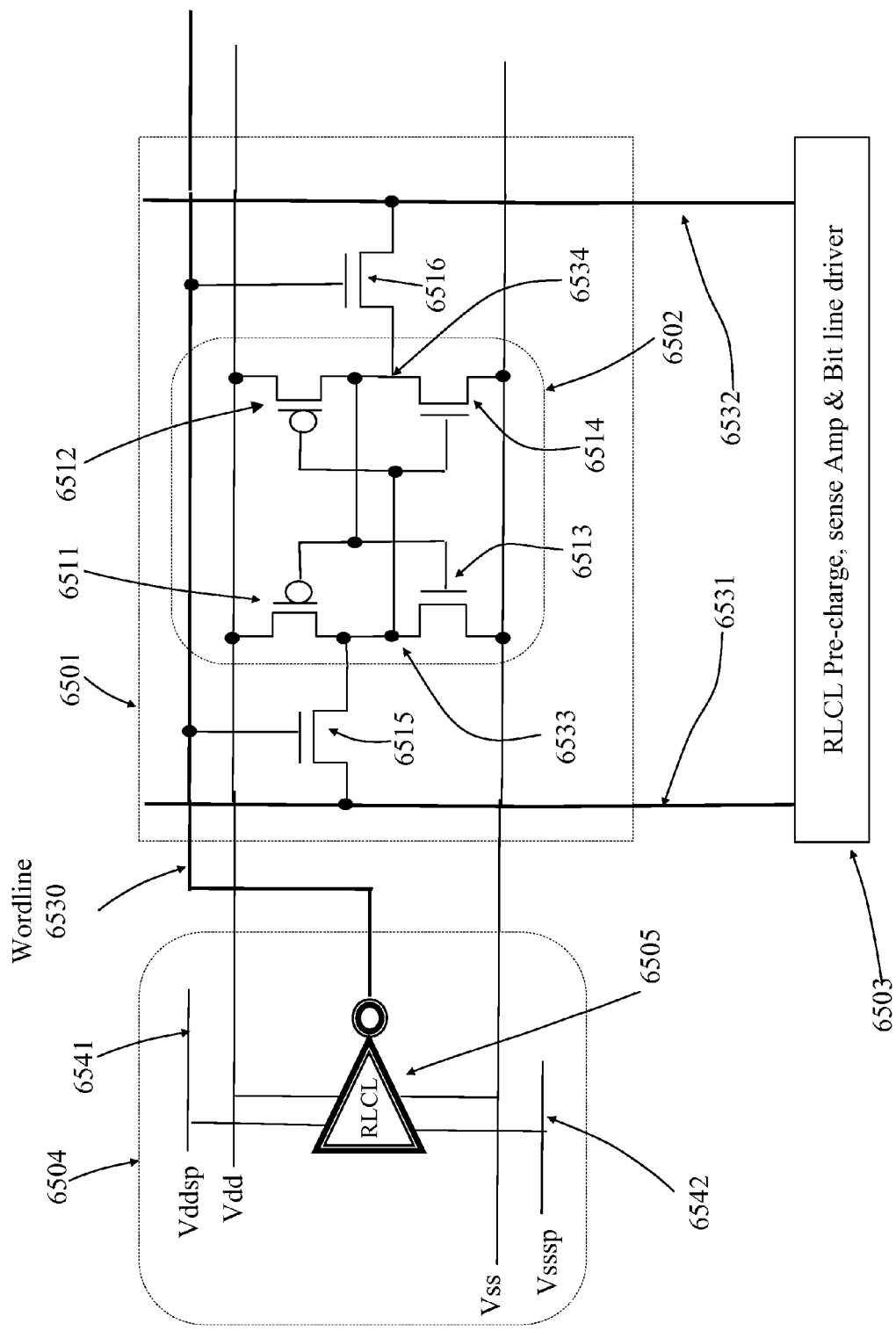
FIG. 30B illustrates an implementation of an SRAM in which the reduced leakage current inverter is used for the wordline driver. Details of a standard SRAM bit cell are also shown.

FIG. 30B shows circuit topology and design to achieve leakage current reduction in memory array. For simplicity, only one memory bit has been shown along with the last part of address decoder, called word line driver. Instead of a normal CMOS inverter, an RLCL INVERTER has been used as word line driver. One of the embodiments of RLCL INVERTER as explained earlier can be used for the purpose. Choice of type of RLCL inverter will depend on speed, noise margin and active power consumption requirements. For simplicity of drawing a new symbol 6505 has been used to represent the RLCL INVERTER. Rest of the address decoder sub-block will be constructed using RLCL circuits. 6504 is part of the wordline driver which is part of the address decoder section presented in FIGS. 26 and 27 and FIG. 30A. Four power supply rails are used as in other RLCL circuit topologies described earlier. Output of this RLCL inverter is the wordline 6530 that transitions from Vddsp to Vsssp (that are at "Vdd+$\Delta$v1" and "Vss-$\Delta$v2" respectively) as discussed earlier in the functionality of RLCL INVERTERs.

With RLCL technology the memory bit cell read and write works in the same way as in a normal CMOS memory. When the wordline 6530 transitions to Vddsp, NMOS pass transistors are ON and discharge one of the two bit lines 6531 and 6532 depending on whether node 6533 is at LOGIC LOW or node 6534 is at LOGIC LOW. For memory application $\Delta$v1 can be ZERO or positive (in range of 30 mv-200 mv). If $\Delta$v1 is ZERO the read and write current through NMOS pass transistors 6515 and 6515 is same as in normal CMOS memory design. However, if $\Delta$v1 is positive, NMOS pass transistors 6515 and 6516 get higher gate-source voltage than the normal CMOS memory implementation of FIG. 28. This increases the drive strength of pass transistors 6515 and 6516 thereby increasing the read current of Pull down path of bitline that needs to discharge. Hence the bitline that needs to discharge does so faster than a normal CMOS memory, thereby improving performance. If $\Delta$v1=ZERO then Vdd and Vddsp are at the same voltage. In that case Vddsp or Vdd power supply rail can be eliminated for the word line driver inverter 6505. In the case where $\Delta$v1=ZERO, this mechanism of speed improvement is not present by use of RLCL technology.

However, a more subtle and more important performance improvement happens by use of RLCL circuit technology.

When this ROW is not supposed to be read, the wordline is driven to LOGIC LOW to Vsssp (Vss-$\Delta$v2). Pass transistors 6515 and 6516 now have negative gate-source voltage and hence they are OFF with significantly reduced leakage currents through the OFF NMOS pass transistors 6515 and 6516. With respect to FIG. 29, first and fourth leakage currents 6441 and 6444 respectively are significantly reduced. Because of this reduction in leakage currents, the discharge speed of bitline that is being discharged by one of the bit cells that is being read, doesn't get degraded by leakage of bit cells in rows that are not being accessed. Because of this reduction in leakage current through pass transistors 6515 and 6516, the bit line that is supposed to remain pre-charged, doesn't get erroneously discharged. These two effects result in developing faster bit line differential which results in ability for the Sense AMPLIFIER in block 6503 to sense the bit line differential earlier or/and faster, which in turn improves performance. The reduction in leakage current through NMOS pass transistors also means that more bit cells can be attached to bit lines. This results in construction of memory with larger number of rows that can be read reliably which allows construction of larger memory blocks which results in lower cost of the memory blocks. It is important to note that the leakage on bit lines from memory bit cells that are not being read, prohibits construction of memory blocks with large number of rows because the leakage of ROWS not being accessed will prohibit development of bitline voltage differential reliably which will cause the memory block to become non-accessible for read in another words useless.

As explained earlier leakage through pass NMOS transistors in the bit cells of ROWs in the memory that are supposed to be inactive (not accessed), is a major cause of degradation in memory read speed and degradation of reliability of read operation. This leakage current also forces the memory structures to have less number of ROWs in the memory structure than the case if the leakage current in these pass transistors is significantly lower or ZERO. This means the leakage current in the pass transistors of the memory bits forces smaller memory blocks than what is possible if this leakage current was ZERO (or small). Each memory block that is constructed needs to have its accompanying "Address Decoder", 'Control Block" and "Sense Amp and IO" sub-blocks. Fundamentally, these sub-blocks are only overheads (for speed, area and functionality that are unnecessary extra cost and power consumption). This means when a large memory block of the chip needs to be divided into smaller sub-block the total overheads are higher than if one large memory block was constructed instead.

RLCL circuit topology allows larger SRAM memory blocks to be designed, implemented and manufactured thereby reducing the overhead of "address decoder", "control block" and 'Sense Amp and IO" blocks.

Thus by reducing leakage in NMOS pass transistors of the normal memory bit cell, RLCL technology allows design and implementation of larger memory blocks that are better in area, speed and power consumption. This is in addition to reduction in leakage power by reduction of leakage in all components and circuits in the memory block.

It is important to note that no changes in "memory bit cell" are required for these improvements to take place, which makes RLCL technology easily adoptable in implementing memories in ICs.

Use, advantages and importance of RLCL technology explained in preceding sections are not limited to SRAM memory. DRAM, Flash memory and other CMOS based memory technology would realize similar speed, cost and power improvements by use of RLCL technology.

Similar modifications are required for realizing improvements in performance and leakage in DRAM. DRAM bit cell will not require any modifications. In case of DRAM memory also, the address decoder, control block, sense amp and IO sections are modified using RLCL circuit technology to eliminate leakage in these sections as well as in memory array. In addition improved performance, improved area (that is lower area which means lower cost) and lower power consumption are realized using RLCL circuit technology. Similarly Flash memory can use RLCL technology in the same way as in SRAM blocks and be better in area, performance, cost and power consumption.

RLCL Circuit technology is also usable in CMOS dynamic circuits.

Dynamic circuit blocks are special CMOS circuit topologies used for design and implementation of very high performance circuits in ICs. Dynamic CMOS circuits provide very high speed in calculating Boolean logic functions by speculatively computing one of the LOGIC states in advance and by reducing capacitance in propagation paths. This circuit technology in classical CMOS implementation is becoming extinct as semiconductor progress to modern smaller geometry CMOS because of Leakage current in MOS transistors.

Using RLCL circuit technology, the limitation of dynamic circuits can eliminated thereby making dynamic circuits viable in modern technologies to give performance advantage over normal CMOS static logic and RLCL static logic implementations.

Figures 31A, 31B:
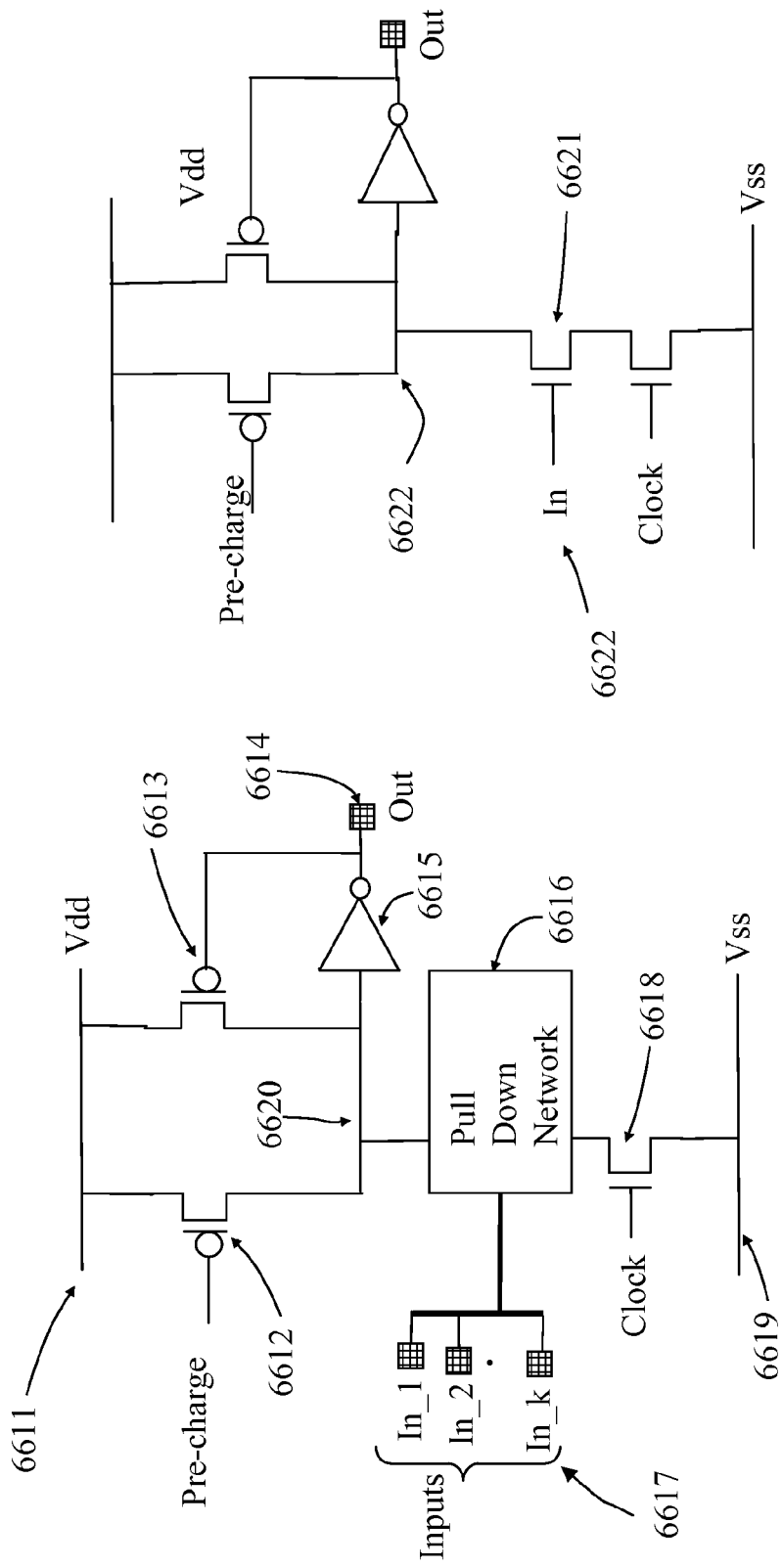
FIGS. 31A and 31B illustrate two example of a dynamic functional logic block in standard CMOS technology.

FIG. 31A shows commonly used circuit structure of a CMOS dynamic Boolean logic block. As shown in FIG. 31A, a dynamic Boolean logic block consists of small number of PMOS transistors (typically two) to PULL UP node 6620 to Vdd and a clock gated pull down network to PULL DOWN node 6620 to Vss. An inverter 6615 is connected between node 6620 and output node "Out" (6614). The output node 6614 is connected to gate node of holding PMOS 6613. "Pre-charge" is a signal generated through special timing circuits (Design and use of such timing circuits is common in IC design Industry) from global "Clock" signal. The precharge signal switches ON PMOS 6612 at time when the PULL down current path through NMOS 6618 and "Pull Down Network" 6616 is OFF. The dynamic circuit evaluates its input and computes output accordingly in "evaluate" phase when Both "Pre-charge" and "Clock" nodes are driven to logic HIGH (Vdd). "Pre-charge" and "Clock" are input signals to this block. Their timing behavior needs to be designed and implemented in such a way that Pre-charge signal goes from Vdd to Vss little later than Clock and goes from Vss to Vdd little earlier than the 'Clock" signal. Such behavior is easy to derive and is a common practice by engineers designing dynamic circuits. It is not uncommon to use "Clock" input signal also as "Pre-charge" signal. Alternatively, "Precharge" signal can be generated separately from clock or from another source such that it provides functionality to PULL UP node 6620 by switching ON PMOS 6612 when the PULL DOWN current path through NMOS 6618 and "Pull down Network" 6616 is OFF. In this pre-charge state (when node 6620 is PULLED UP) the output port "out" 6614 is LOGIC LOW at Vss. This switches ON PMOS transistor 6613 which keeps node 6620 pre-charged to Vdd even if 'Pre-charge" signal is removed. "Pull down Network" 6616 consists of NMOS transistors. PMOS and NMOS transistors used in this circuit block can be low leakage or high performance transistors or a mixture of them depending on design requirements.

FIG. 31B shows the simplest logic function designed as a dynamic circuit where the "Pull Down Network" 6616 consists of a single NMOS transistor 6621 connected to only one input signal "In" (6622). Mostly, though, dynamic circuit blocks use more complex pull down network to implement complex Boolean logic function.

The dynamic CMOS circuits shown in FIGS. 31A and 31B have significant speed advantage over static CMOS circuits because logic computation involves only NMOS that present much smaller capacitive loads on signal propagation paths and have much larger drive currents. Dynamic circuits generally consume more active power due to high activity on nodes.

With reference to FIG. 31A, when "clock" is driven to Vss (Logic LOW), "Pre-charge" signal is also driven to LOGIC LOW. This turns ON PMOS 6612 while NMOS 6618 is OFF. PMOS 6612 charges the node 6620 to Vdd (LOGIC HIGH). This drives logic "LOW" at output 6614 which in turn cause PMOS 6613 to turn ON. Thus once charged, node 6620 is held at Vdd by PMOS 6613 even if "Pre-charge" signal is driven to Vss. This is called 'Pre-charge" phase in dynamic circuit functioning. When "clock" is driven high and also "Pre-charge" signal is already Vdd or driven to Vdd before "Clock" signal, node 6620 will be discharged to Vss if the "Pull Down Network" 6616 is conducting. If not-node 6620 is held at Vdd by PMOS transistor 6613. This is called "evaluation" phase for dynamic circuits. The "Pull Down Network" 6616 conducts depending on the logic function computation designed in this network and the state of input signals. It must be noted that the PMOS transistor 6613 and the "Pull Down Network" 6616 must be appropriately sized such that when the Pull Down path is conducting, node 6620 is driven to Vss by overpowering the conduction of PMOS 6613. Once node 6620 is pulled down to Vss, the output node 6614 is driven to Vdd and PMOS 6613 is turned OFF. The fight between PMOS 6613 and "Pull Down Network" 6616 happens only during transition of node 6620 from Vdd to Vss.

The output of dynamic logic function of FIG. 31A is driven to LOGIC LOW in every clock cycle by pre-charging node 6620 to Vdd thus applying a LOGIC ZERO or LOGIC LOW at the output port 6614 of the gate speculatively. The dynamic logic gate as shown in FIG. 31A, only computes a LOGIC HIGH or LOGIC ONE at output port 6614 as function of its input ports 6617. Logic ZERO or LOGIC LOW at output is driven by default through the pre-charge functionality.

As mentioned earlier, the viability and use of dynamic circuits has been reducing almost to the extent of extinction in recent technology because of CMOS leakage current. The Severe negative effect of leakage current is explained below:

Let's assume that the node 6620 has been pre-charged to Vdd means output port 6614 is at LOGIC LOW (Vss). If the "Pull Down Network" 6616 consists of High Speed NMOS transistors that have high leakage, during "evaluation" phase when "Clock" is LOGIC HIGH (at Vdd), leakage in PULL DOWN PATH consisting of "Pull Down Network" and NMOS 6618 may provide sufficient current to discharge node 6620 enough to cause a LOGIC change or a noise pulse in output node "Out" 6614, even if all the inputs are at LOGIC LOW. A high going pulse at output port "Out" 6614 or a transition to LOGIC HIGH only because of erroneous discharge of node 6620 are bad. Both of these will result in malfunction of the next dynamic logic function(s) whose input(s) is (are) driven by this output "Out" 6614. It must be noted that once discharges, node 6620 cannot be pulled UP again till the next "Pre-charge" state. This means that the LOGIC malfunction created by such temporary discharge of node 6620 may create a permanent and irrecoverable error in functionality and thus make the IC malfunction. To eliminate this problem, the PMOS 6613 can be made stronger such that even in worst adverse process, voltage, temperature or noise conditions (Noise on input signals or noise on power supply rails) the output node 6620 is not discharged enough due to leakage or noise to cause LOGIC change or Noise pulse in output node 6614. But this means that when node 6620 actually needs to get discharged due to valid inputs and correct LOGIC function, the pull down path consisting of "Pull Down Network" 6616 and NMOS 6618 will have to fight a stronger PMOS 6613 which degrades the speed of the dynamic gate. This degradation defeats the very purpose of adopting dynamic circuit gate in the first place. As stated earlier, dynamic circuits consume more power because of high activity at various nodes. If they don't provide substantial speed improvement, they become impractical for commercial ICs.

In summary leakage current is one of the biggest problems for dynamic circuits as explained in previous paragraph—big enough to make them extinct in modern technologies.

RLCL technology reduces leakage drastically thereby eliminating the problem of functional failure preserving the speed advantage of dynamic circuits, thus making them useful and practical even in modern technologies.

FIG. 32 shows general scheme of connectivity for dynamic circuits using RLCL circuit technology or RLCL dynamic circuits. FIG. 33 shows implementation of the simplest RLCL dynamic functional gate.

Figure 32A:
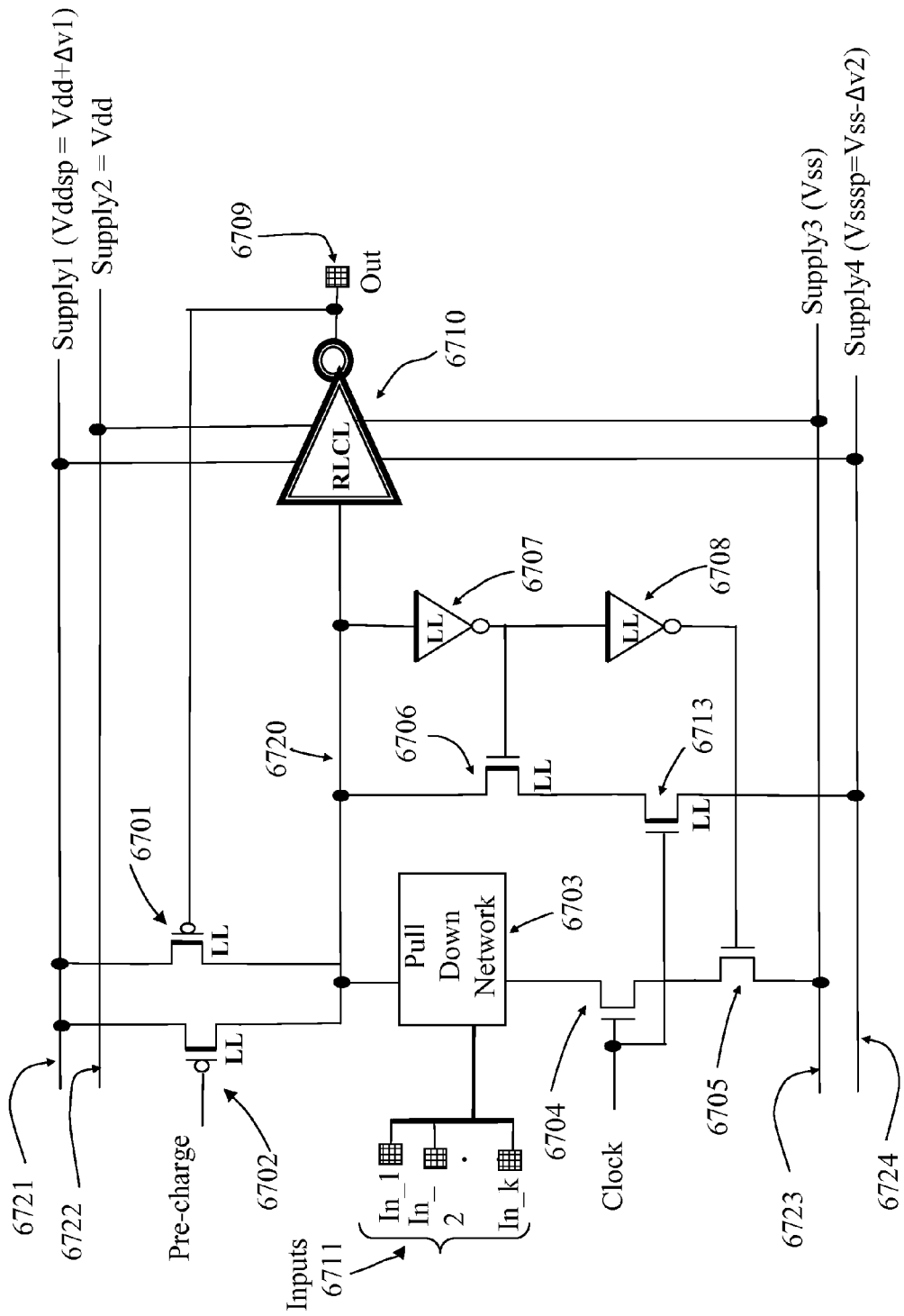
FIGS. 32A and 32B illustrate the circuit design of dynamic circuits using reduced leakage current circuits and RLCL technology.
Figure 32B:
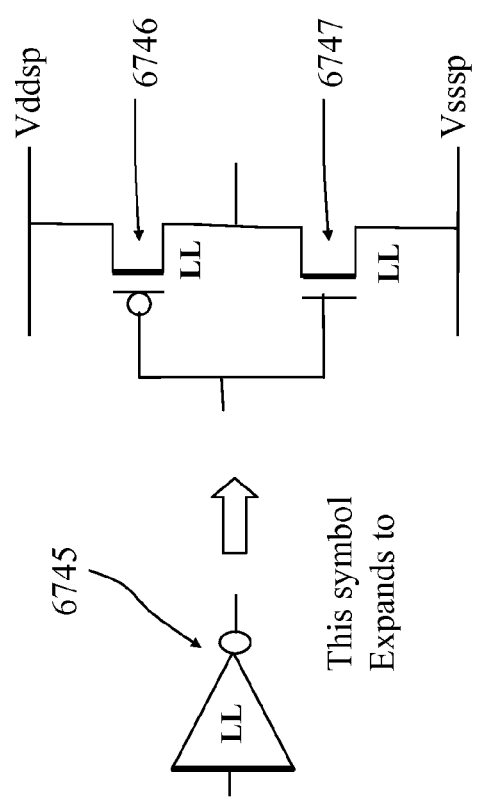
Figure 33:
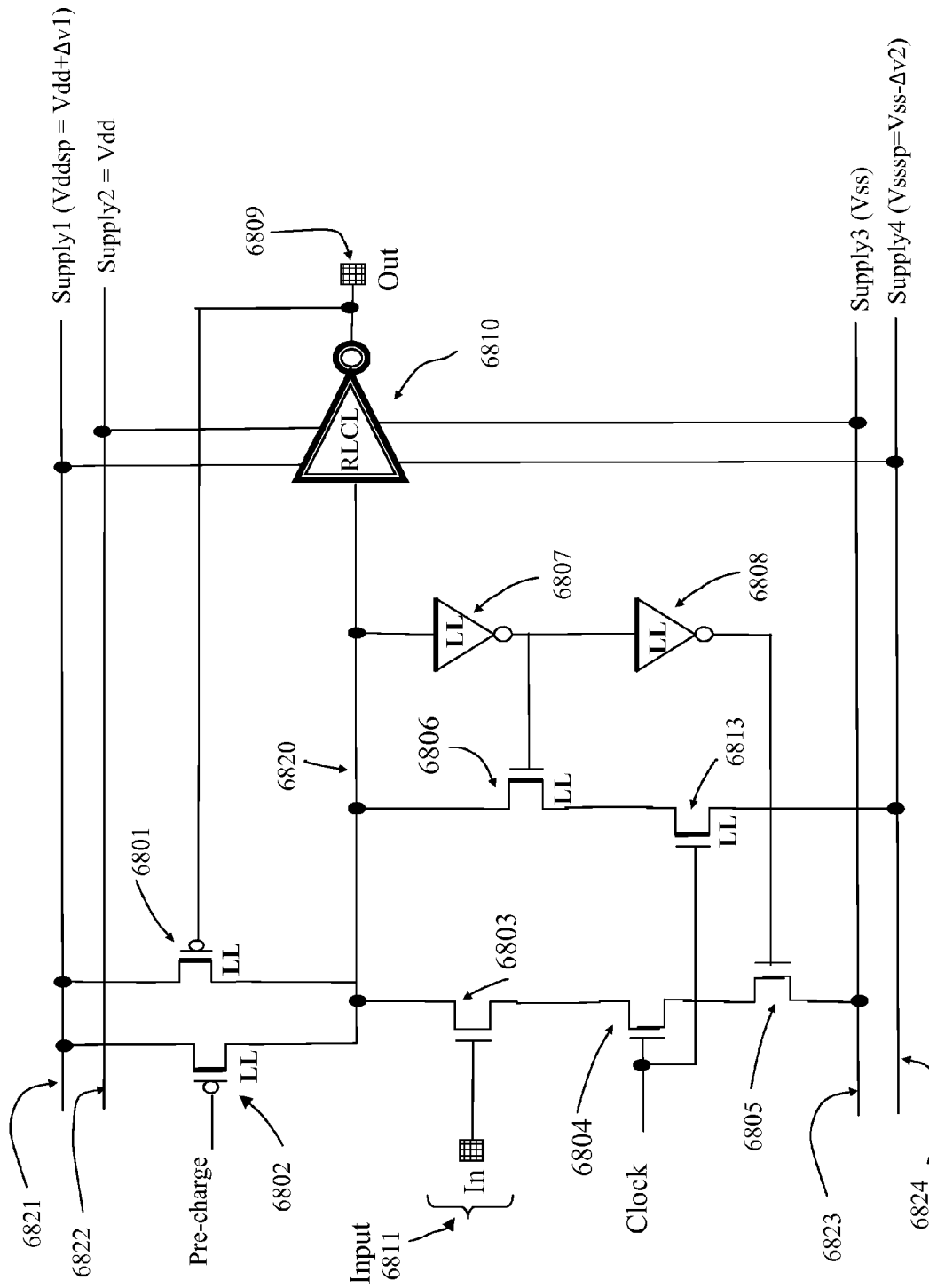
FIG. 33 illustrates implementation of a reduced leakage current dynamic functional gate.

General circuit scheme of CMOS dynamic circuits of FIG. 31(*a*) is modified to make RLCL dynamic circuit as shown in FIG. 32A. Four power supply rails are used instead of two as in all RLCL circuit schemes. Inverter 6615 of FIG. 31(*a*) is replaced by RLCL inverter 6710 in FIG. 32A. RLCL inverter 6710 is the Reduced Leakage INVERTER using RLCL circuit technology as per FIG. 14A for static CMOS gates as explained in this invention and is implemented using one of the RLCL embodiments as illustrated in many figures from FIG. 14A to FIG. 25. PMOS transistors 6702 and 6701 are connected to power supply rail Vddsp. "Pull Down Network" 6703 consists of preferably "High Speed" NMOS transistors though it can consist of any type of NMOS transistors. Input ports 6711 of the dynamic gate are also inputs to the "Pull Down Network" 6703 and are driven by similar dynamic circuits or compatible circuits such that these nodes transition between supply rails Vddsp and Vsssp. Five new circuit components are added—Low Leakage NMOS transistors 6706 and 6713 and Low Leakage INVERTERS 6707 and 6708 and preferably High Speed NMOS 6705 (preferably high speed, but it can be any other type MOS transistor). "Low Leakage" inverters 6707 and 6708 which, as shown in FIG. 32B, are normal CMOS Boolean INVERTER using "LOW LEAKAGE" PMOS and NMOS transistors connected to supply rails Vddsp and Vsssp. Gate of Low Leakage NMOS transistor 6713 is driven by "clock" input. Inverter 6707 is designed such that its input switching threshold is lower than half way between Vddsp and Vsssp. In practice, the extent of this threshold manipulation will be determined on many normal design considerations of dynamic circuits commonly known to CMOS design engineers and commonly prevalent in semiconductor industry. Such threshold manipulations are accomplished by ration of PMOS and NMOS transistors and are also very common in semiconductor design industry. The output of inverter 6707 is connected to gate of NMOS 6706 and input of inverter 6708. Output of inverter 6708 is connected to the gate of NMOS 6705 which is in series of NMOS 6704 and "Pull Down Circuit" 6703, that constitute the Pull Down path from node 6720.

FIG. 32B shows schematic representation of LOW Leakage Inverter used in FIG. 32A and is self explanatory.

FIG. 32A is only a sample configuration of dynamic circuit using RLCL technology.

Other configurations, connectivity and choice of MOS transistors are possible using same general concept explained here and without deviating from these concepts.

FIG. 33 shows implementation of a simple function gate (a buffer) using RLCL dynamic circuit topology of FIG. 32A. Functioning of RLCL technology in dynamic circuit is explained using functioning of this simple dynamic circuit.

The "Pull Down Network" 6703 of FIG. 32A is replaced by a single NMOS transistor 6803 connected to a single input "In" 6811 in FIG. 33. In "Pre-charge" phase input signals "Pre-charge" and "clock" are at LOGIC LOW at Vsssp. PMOS 6802 is ON and pulls UP node 6820 to Vddsp. The PULL DOWN path consisting of "Pull Down Network" 6803 and NMOS transistors 6804 and 6805 is OFF because NMOS transistors 6804 is OFF. Similarly, the PULL DOWN path through NMOS 6806 and NMOS 6813 is OFF because NMOS 6813 is OFF. In "Pre-charge" phase, Node 6820 is charged to Vddsp (LOGIC HIGH), output node "Out" (6809) is driven to "LOGIC LOW" by RLCL INVERTER 6810 to Vsssp and PMOS 6801 is turned ON. Once node 6820 is pre-charged to Vddsp, the output of inverter 6808 is LOGIC HIGH and NMOS 6805 is turned ON ready for "evaluate" phase. As in a normal dynamic circuit, even if "Pre-charge" signal is pulled UP to "LOGIC HIGH" after PMOS 6801 is turned ON, node 6820 remains charged to Vddsp though PMOS 6801.

In this pre-charge phase, the PULL DOWN path consisting of NMOS 6803, 6804 and 6805 has substantially reduced leakage because of negative gate-source voltage of NMOS 6804. Pull down path consisting of Low Leakage NMOS transistors 6806 and 6813 is OFF by definition because of use of Low Leakage transistors.

During evaluate phase, as in a normal dynamic circuit, "clock" input is driven to LOGIC HIGH (to Vddsp or Vdd (Can be either)) causing NMOS 6804 and 6813 to turn ON. If the "Pull Down Network" is conducting, that is if Input signals 6711 is LOGIC HIGH, then node 6820 will be discharged to Vss through NMOS 6704 as in case of a normal dynamic circuit. Since the PULL DOWN path consisting of NMOS 6803, 6804 and 6805 consists of potentially high speed NMOS transistors, the pull down speed of node 6820 is fast. In this case, the output of INVERTER 6807 will be driven to LOGIC HIGH to voltage Vddsp and NMOS 6806 will turn ON. Since Low Leakage NMOS 6813 is ON, the PULL down path from node 6820 to Vsssp is ON and this path discharges node 6820 further down to Vsssp through ON NMOS transistor 6813 and 6806. This will satisfy the input conditions for RLCL INVERTER 6810 to function normally in reduced leakage mode as per RLCL technology and the output node "Out" (6709) is driven to LOGIC HIGH to Vddsp by RLCL inverter 6810. This way—the transition of node 6820 (and hence the transition of output "out" 6809) happens at high speed through High Speed NMOS transistors. After node 6820 switches to LOGIC LOW, the output of Low Leakage inverter 6808 also switches to LOGIC LOW to Vsssp and causes the High Speed NMOS transistor 6805 to switch OFF. Node 6820 is PULLED DOWN to Vsssp and held there through PULL DOWN path consisting of Low Leakage NMOS transistors 6806 and 6813. Now, High Speed NMOS transistors 6803, 6804 and 6805 have ZERO gate-source voltage and Δv2 (very small compared to Vdd) drain-source voltage. Low Leakage PMOS transistors 6801 and 6802 are OFF with ZERO gate-source voltage. The leakage current in this gate after transition is very small because of negative gate-source voltage to OFF High Speed MOS transistors or OFF Low leakage transistors.

Thus the LOGIC transition in this gate happens at high speed by use of High Speed MOS transistors but after the transition, the gate settles into LOW Leakage state.

This operation is exactly same as the functioning of RLCL static gates as explained in earlier sections. But for dynamic circuits, RLCL method not only reduces leakage current significantly but also performs a very important task of making Dynamic CMOS circuits viable for modern CMOS process technologies.

With respect to FIG. 33, in "evaluation phase" if the input 6811 is LOGIC LOW at Vsssp, such that "Pull Down Network" is supposed to be OFF then the NMOS transistors in "Pull Down Network" 6803 has negative "gate source" voltage because its source is at Vss and its gate is driven by another RLCL gate or compatible circuit, hence it is at Vsssp. This means the leakage current in PULL DOWN path from node 6820 to Vss through NMOS 6803 and NMOS 6805 is substantially reduced. PULL DOWN PATH consisting of Low Leakage NMOS 6806 and Low Leakage NMOS 6813 from node 6820 to Vsssp is also OFF because output of INVERTER 6807 is LOGIC LOW (Vsssp) which keeps Low Leakage NMOS 6806 OFF. Leakage current in PULL DOWN path consisting of Low Leakage NMOS 6806 and 6813 is very low by definition because of the path consisting of Low Leakage NMOS transistors. Thus in such a case node 6820 is easily held at Vddsp by PMOS 6701. Now, the holding PMOS transistor 6801 can be weak and is still able to hold node 6820 to Vddsp. Noise and malfunctioning issues are eliminated because of elimination of leakage current in High Speed Pull Down path.

In "pre-charge" phase "clock" is LOGIC LOW, node 6820 is pulled high to Vddsp and the PULL DOWN PATH though NMOS 6806 and 6813 is OFF. Once node 6820 is charged to Vddsp in "pre-charge" phase the output of inverter 6807 is LOGIC LOW which turns OFF NMOS 6806.

Because of reduced leakage in discharge path for node 6820 to Vss or Vsssp by use of RLCL technology, dynamic circuit can be designed using RLCL technology to retain their speed and area advantage in modern process technology over static circuits and can be used to design high speed circuits.

Referring to FIG. 33, it can be noted that PMOS 6802 and 6801 are not required to be "Low Leakage" PMOS transistors but preferably they are so, since the Pull Down path consisting of "Pull Down Network" 6703 and NMOS 6705 has substantially reduced leakage current because of "Negative" gate source voltage on NMOS transistors used in the "Pull Down Network" as explained.

As is obvious from this explanation and as will be recognized by people adept in the art of Semiconductor Circuit design, the scheme of switching OFF NMOS 6705 can also be implemented by changing the logic functions and re-arranging transistors in PULL DOWN PATH for various design parameters such as smaller size or faster or less capacitive "clock" node etc.

Figure 34A:
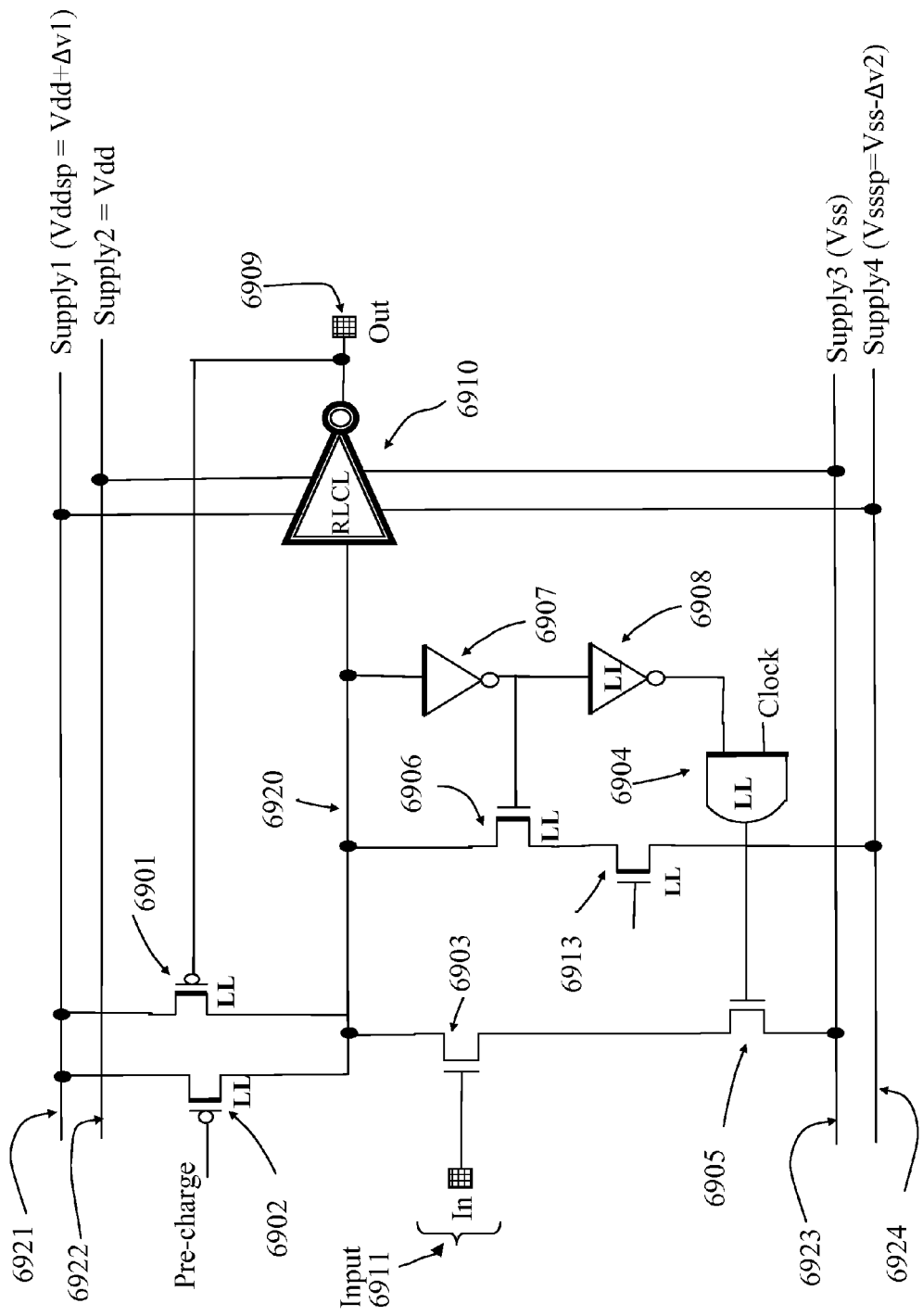
FIGS. 34A and 34B illustrate an alternative implementation of a dynamic buffer that is a reduced leakage current dynamic functional gate.

FIG. 34A illustrates an alternative implementation of a dynamic buffer with RLCL technology. As compared to FIG. 33, the two NMOS transistors 6804 and 6805 of FIG. 33 are replaced by one NMOS transistor 6905 and a 2 INPUT Low Leakage AND gate 6904. Clock input now is connected as input of AND gate 6904, output of which drives the gate node of (preferably) High Speed NMOS 6905. Now the High Sped PULL DOWN path consists of only two (preferably) High Speed NMOS transistors 6903 and 6905 (instead of 3 NMOS transistors in FIG. 33).

People adept in the art of circuit design would recognize that both of these implementations (the one in FIG. 33 and the other in FIG. 34A) represent slight variation in exactly the same circuit concepts. Only transistors are reshuffled a little to make tradeoffs in speed, area, power consumption, complexity and ease of implementation. In this case RLCL dynamic buffer of FIG. 34A is faster than the one in FIG. 33 but consumes more area and presents more capacitive load on clock node which increases dynamic power and complexity of implementation.

Figure 34B:
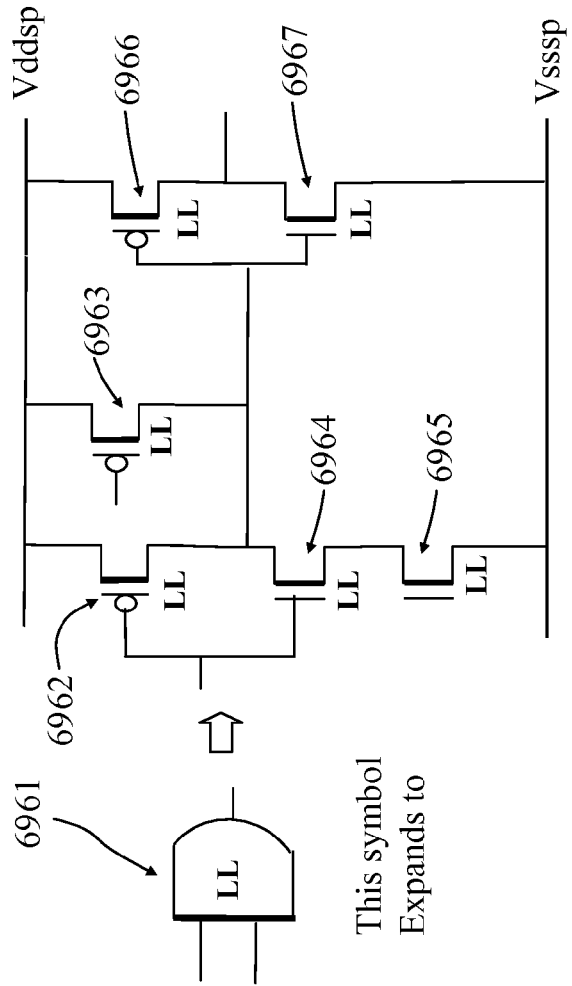
Figure 35:
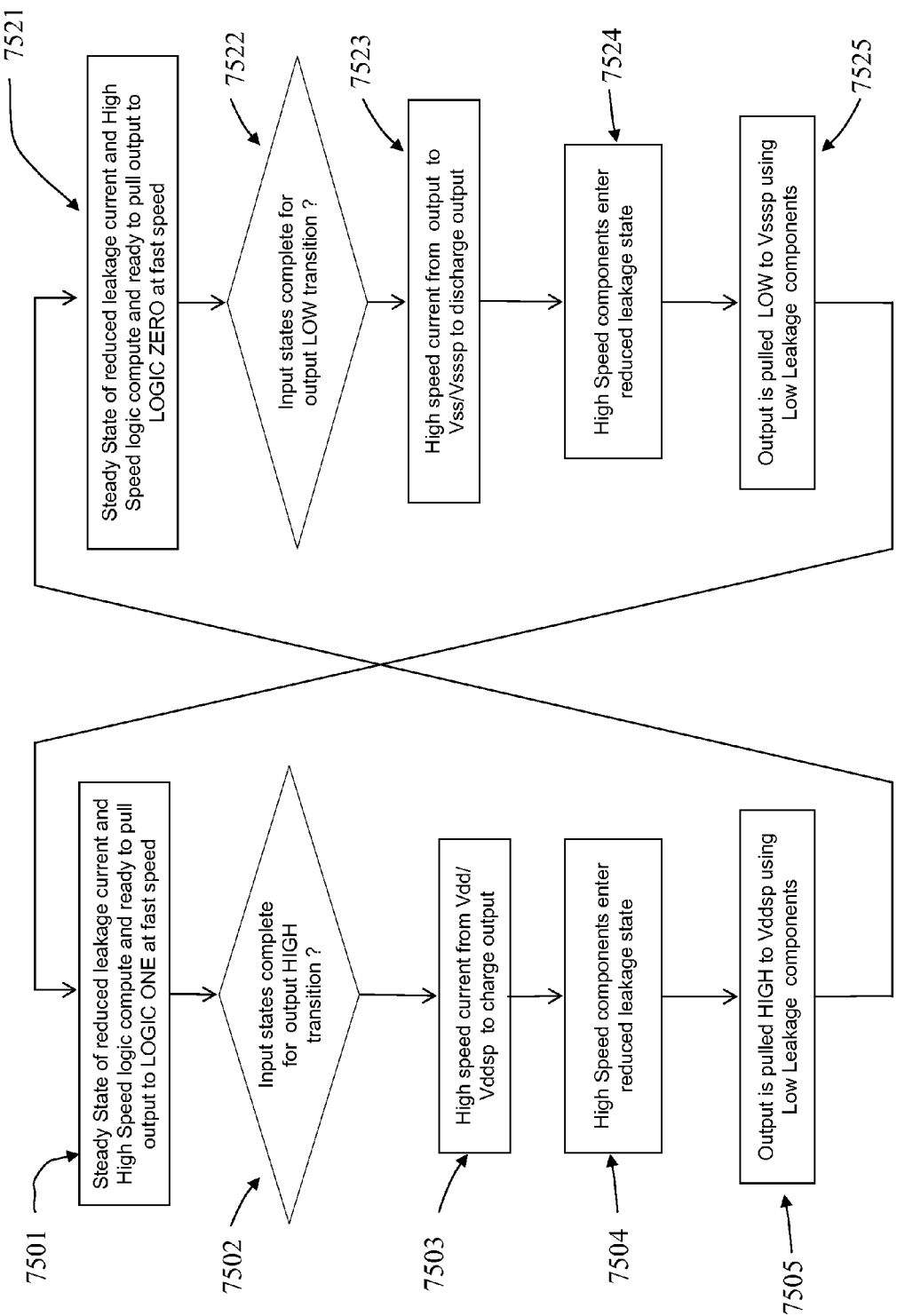
FIG. 35A-B are flow chart level description of method and functioning of reduced leakage current devices
Figure 35:
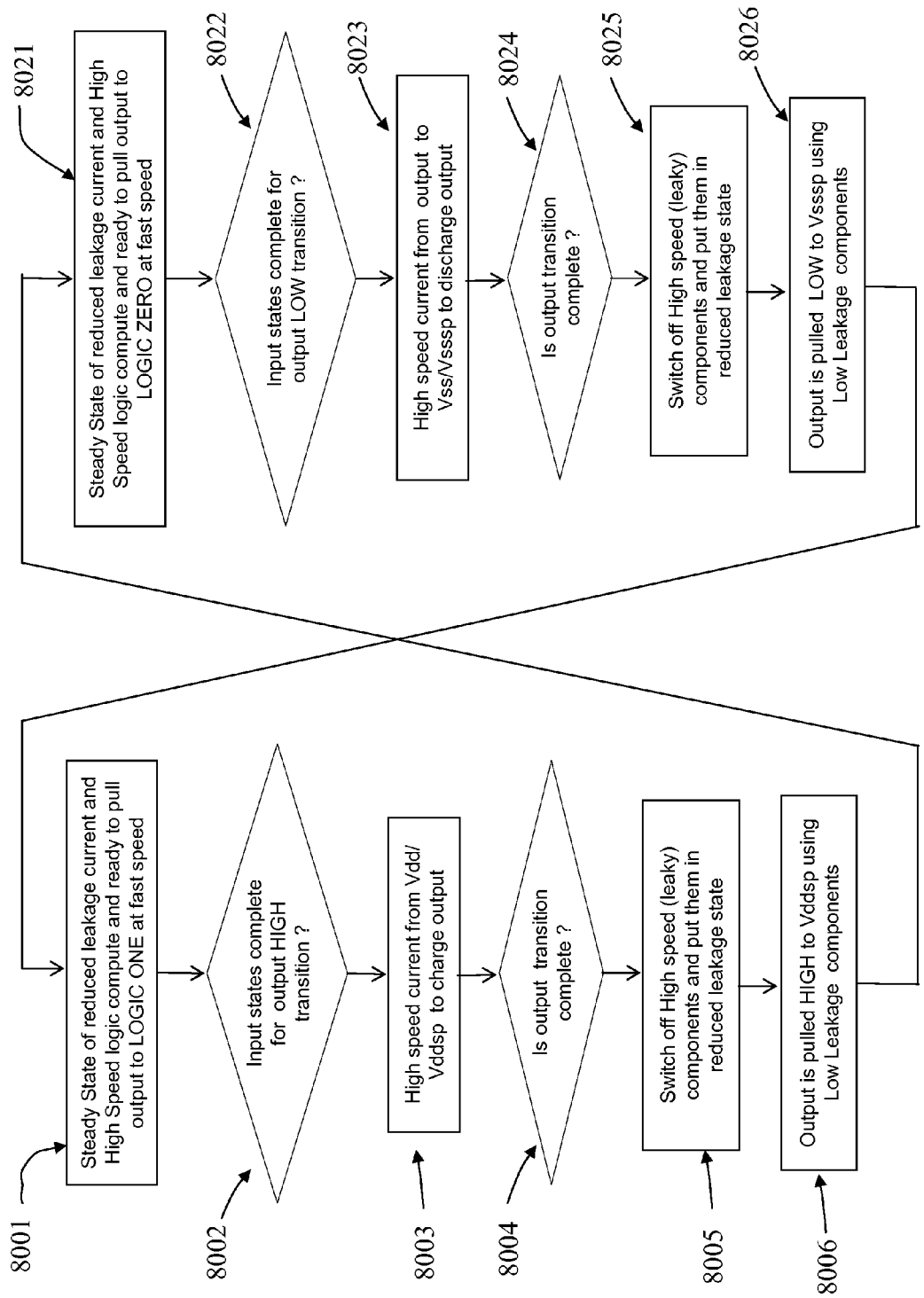

FIG. 34B is schematic of the Low Leakage 2 input AND gate used in FIG. 34A and is self explanatory.

RLCL dynamic buffers illustrate in FIGS. 33 and 34A use the same fundamentals of asserting negative gate-source voltage on High Speed (and hence High leakage) transistors. The fundamental concepts of RLCL technology as represented at high level in FIG. 14A and in more details in FIG. 14A to FIG. 35D, are used in dynamic circuits to reduced leakage current in dynamic circuits and make them viable in modern semiconductor ICs.

FIG. 35A and FIG. 35B illustrate the overall functioning of RLCL devices in form of algorithm and flow charts. As shown in FIG. 35A, RLCL device is in reduced leakage state in steady state condition but ready to transition the output in opposite direction. When input signals change to present the right conditions for logic to switch the output in opposite logic direction, high current flows in transition paths consisting of HIGH SPEED MOS devices. After completion of output transition, High Speed and High Leakage devices change state to low leakage mode using negative gate-source voltage or very small drain source voltage and the circuit enters the reduced leakage steady state condition in opposite direction waiting for output to transition again when input signals change appropriately.

In more details an RLCL circuit is waiting in reduced leakage steady state when output is LOGIC ZERO as indicate by state 7501 and 8001. In this state the circuit can wait indefinitely in reduced leakage current state. When input condition are appropriate to the logic to switch the output of RLCL gate in opposite direction and condition 7502 is met, High speed current flows from Vdd and Vddsp or from one of them to output, charging the output towards LOGIC ONE. Once the output has safely transitioned to LOGIC ONE, High Speed MOS transistors change state to reduced leakage state either because of active circuit is switching off the High speed MOS components or the MOS components are designed with specific property of uni directional current. The output is further pulled to up to Vddsp (still LOGIC ONE) by low leakage CMOS components. In this state again the circuit block enters the steady state with reduced leakage current but ready to switch the output to LOGIC ZERO at high speed if the input changes again. This state is shown by state 7521 and 8021. Again when the input conditions change such that the output of the logic gate needs to transition to LOGIC LOW, high speed MOS components conduct large discharge current from output to Vdd and Vddsp or one of them. Again when the transition is completed, High Speed MOS components change state to reduced leakage state either because of active circuit is switching off the High speed MOS components or the MOS components are designed with specific property of uni directional current. The output is further pulled down to Vsssp (still LOGIC ZERO) by low leakage CMOS components. RLCL logic gate is now back to reduced leakage current state ready for transition in opposite direction of state 7501 and 8001.

FIGS. 35A and 35B are similar except FIG. 34A indicates use of High Speed MOS components that can enter into LOW LEAKAGE state automatically because of operating condition while FIG. 35B indicates use of active circuit to actively enforce such behavior in High Speed MOS components.

While the foregoing has been with reference to particular embodiments of the invention, it will be appreciated by those skilled in the art of Semiconductor IC design and in particular that of Semiconductor Circuit design, that changes in these embodiment may be made without departing from the principles and spirit of the disclosure, the scope of which is defined by the appended claims.

The invention claimed is:

1. A memory with reduced leakage current CMOS, comprising:
   an array of memory bit cells;
   a set of reduced leakage current sense amplifiers using deterministic negative gate-source voltage that sense bits of data on the array of memory bit cells;
   a reduced leakage current address decoder using deterministic negative gate-source voltage that decodes an address used to one of read and write data to and from the array of memory bit cells; and
   a reduced leakage current controller using deterministic negative gate-source voltage that controls the operation of the set of reduced leakage current sense amplifiers and the reduced leakage current address decoder.

2. The memory of claim 1, wherein each of the set of reduced leakage current sense amplifiers and the reduced leakage current address decoder further comprises an input, an output and a logic function circuit that receives an input signal on the input and generates an output signal on the output; a voltage translator that drives a voltage swing differential on the input and output; a current control decision circuit that controls a voltage swing based on a negative gate-source voltage applied to the voltage translator; and a current control circuit that has a deterministic voltage offset to the input voltage swing so that the device has reduced leakage current due to negative gate source voltage.

3. The memory of claim 1, wherein the reduced leakage current address decoder comprises of reduced leakage current word line driver.

4. The memory claim 1 where the word line driver further comprises an input, an output and a logic function circuit that receives an input signal on the input and generates an output signal on the output; a voltage translator that drives a voltage swing differential on the input and output; a current control decision circuit that controls a voltage swing based on a negative gate-source voltage applied to the voltage translator; and a current control circuit that has a deterministic voltage offset to the input voltage swing so that the device has reduced leakage current due to negative gate source voltage.

5. The memory of claim 1, wherein each memory bit cell has a reduced leakage current pass transistor because of negative gate-source voltage applied by the word line driver.

6. The memory of claim 2, wherein the current control circuit further comprises a pull up current control circuit and a pull down current control circuit.

7. The memory of claim 6, wherein the logic function circuit further comprises a pull-up logic circuit coupled to the pull up current control circuit and a pull-down logic circuit coupled to the pull down current control circuit.

8. The memory of claim 2 further comprising a first voltage supply, a second voltage supply, a third voltage supply and a fourth voltage supply wherein the first voltage supply delivers a larger voltage than the second voltage supply and the third voltage supply delivers a larger voltage than the fourth voltage supply and the first voltage supply (supply 1) and the second voltage supply (supply 2) are larger than the third voltage supply (supply 3) and the fourth voltage supply (supply 4).

9. The memory of claim 2 further comprising a first voltage supply, a second voltage supply, a third voltage supply and a fourth voltage supply wherein the first and fourth voltage supplies are connected to the voltage translator and the second and third voltage supplies are connected to the current control circuit.

10. The memory of claim 9, wherein the first voltage supply further comprises a Vdd voltage added to a delta voltage and the fourth voltage supply further comprises a second delta voltage subtracted from a Vss voltage.

\* \* \* \* \*